US012796433B2

(12) United States Patent
Wang et al.

(10) Patent No.: US 12,796,433 B2
(45) Date of Patent: Nov. 10, 2026

(54) METHOD FOR FORMING CONDUCTIVE VIA, CONDUCTIVE VIA AND PASSIVE DEVICE

(71) Applicant: BOE TECHNOLOGY GROUP CO., LTD., Beijing (CN)

(72) Inventors: Xiyuan Wang, Beijing (CN); Feng Qu, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 1200 days.

(21) Appl. No.: 17/781,013

(22) PCT Filed: Jun. 25, 2021

(86) PCT No.: PCT/CN2021/102525
§ 371 (c)(1),
(2) Date: May 30, 2022

(87) PCT Pub. No.: WO2022/267051
PCT Pub. Date: Dec. 29, 2022

(65) Prior Publication Data

US 2024/0162138 A1 May 16, 2024

(51) Int. Cl.
*H10W 20/42* (2026.01)
*H10D 1/20* (2025.01)
(Continued)

(52) U.S. Cl.
CPC .............. *H10W 20/42* (2026.01); *H10D 1/20* (2025.01); *H10D 84/206* (2025.01);
(Continued)

(58) Field of Classification Search
CPC .... H10D 1/20; H10D 84/206; H01L 23/5226; H01L 21/76897; H01L 21/76864;
(Continued)

(56) References Cited

U.S. PATENT DOCUMENTS

| | | | | |
|---|---|---|---|---|
| 5,994,220 A * | 11/1999 | Gonzalez | H01L 23/485 | 257/E23.152 |
| 2005/0208774 A1* | 9/2005 | Fukunaga | C23G 3/027 | 257/E21.174 |

(Continued)

FOREIGN PATENT DOCUMENTS

| | | |
|---|---|---|
| CN | 677711 A | 3/1994 |
| CN | 101770945 A | 7/2010 |

(Continued)

*Primary Examiner* — John M Parker
(74) *Attorney, Agent, or Firm* — HOUTTEMAN LAW LLC

(57) ABSTRACT

The present disclosure provides a method for forming a conductive via, and belongs to the technical field of electronic elements. The present method includes: preparing a dielectric layer, and forming a connection via, which extends through the dielectric layer in a thickness direction of the dielectric layer, in the dielectric layer; wherein the dielectric layer includes a first surface and a second surface oppositely arranged in the thickness direction of the dielectric layer; forming a connection electrode in the connection via, forming a first extraction electrode on the first surface, and forming a second extraction electrode on the second surface; wherein the connection electrode at least covers an inner wall of the connection via, and the first extraction electrode and the second extraction electrode are electrically connected to the connection electrode.

14 Claims, 33 Drawing Sheets

(51) Int. Cl.
*H10D 84/00* (2025.01)
*H10P 70/00* (2026.01)
*H10W 20/00* (2026.01)

(52) U.S. Cl.
CPC ......... *H10P 70/234* (2026.01); *H10W 20/043* (2026.01); *H10W 20/0526* (2026.01); *H10W 20/082* (2026.01)

(58) Field of Classification Search
CPC ....... H01L 21/76862; H01L 21/76873; H10W 20/033; H10W 20/043; H10W 20/054; H10W 20/034; H10W 20/42; H10W 20/0526; H10P 70/234
See application file for complete search history.

(56) References Cited

U.S. PATENT DOCUMENTS

| | | | | |
|---|---|---|---|---|
| 2007/0202655 | A1* | 8/2007 | Min | H01G 4/33 438/381 |
| 2007/0221404 | A1* | 9/2007 | Das | H05K 1/097 29/831 |
| 2009/0134497 | A1* | 5/2009 | Barth | H01L 23/481 257/E21.477 |
| 2010/0230679 | A1* | 9/2010 | Kim | G02F 1/136227 257/E29.291 |
| 2011/0042132 | A1* | 2/2011 | Dittmann | B26F 1/28 174/266 |
| 2015/0042415 | A1* | 2/2015 | Hurwitz | H10D 86/85 333/185 |
| 2016/0276272 | A1* | 9/2016 | Chen | H01L 23/53295 |
| 2018/0068977 | A1* | 3/2018 | Wang | H01L 24/97 |
| 2018/0367114 | A1* | 12/2018 | Hurwitz | H03H 3/00 |
| 2019/0006354 | A1* | 1/2019 | Wu | H01L 24/13 |
| 2020/0105577 | A1* | 4/2020 | Liang | H10D 30/62 |

FOREIGN PATENT DOCUMENTS

| | | | |
|---|---|---|---|
| CN | 102044484 | A | 5/2011 |
| CN | 102668734 | A | 9/2012 |
| CN | 102110585 | B | 1/2014 |
| CN | 103985668 | A | 8/2014 |
| CN | 103985698 | A | 8/2014 |
| CN | 102468144 | B | 11/2015 |
| CN | 105655316 | A | 6/2016 |
| CN | 106683996 | B | 5/2020 |

* cited by examiner

METHOD FOR FORMING CONDUCTIVE VIA, CONDUCTIVE VIA AND PASSIVE DEVICE

TECHNICAL FIELD

The present disclosure belongs to the technical field of electronic elements, and in particular to a method for forming a conductive via, a conductive via and a passive device.

BACKGROUND

With the development of the electronic information industry, various electronic components are developing towards miniaturization and low power consumption, and have a higher and higher integration level. For memory chips, high-brightness LEDs, high-quality-factor (Q-factor) inductor devices in radio frequency circuits and integrated passive devices, etc., the single-sided integration density has been high, and there is no additional area for providing devices. In order to further improve the integration level, a structure is required to be manufactured in three dimensions in which layers are stacked together and electrically connected with each other. Vias and blind vias with electrical communication function are necessary.

SUMMARY

The invention intends to solve at least one of technical problems in the prior art and provides a method for forming a conductive via, a conductive via and a passive device.

In a first aspect, an embodiment of the present disclosure provides a method for forming a conductive via, including steps of:

- preparing a dielectric layer, and forming a connection via, which extends through the dielectric layer in a thickness direction of the dielectric layer, on the dielectric layer; wherein the dielectric layer includes a first surface and a second surface oppositely arranged in the thickness direction of the dielectric layer; and
- forming a connection electrode in the connection via, forming a first extraction electrode on the first surface, and forming a second extraction electrode on the second surface; wherein
- the connection electrode at least covers an inner wall of the connection via, and the first extraction electrode and the second extraction electrode are electrically connected to the connection electrode.

The step of preparing a dielectric layer, and forming a connection via, which extends through the dielectric layer in a thickness direction of the dielectric layer, on the dielectric layer includes:

- preparing the dielectric layer, and forming the connection via, which extends through the dielectric layer in the thickness direction of the dielectric layer, through a mechanical drilling process on the dielectric layer.

A material of a drill bit for the mechanical drilling process includes any one of a tungsten carbide, a tungsten-cobalt alloy, a tungsten-titanium-cobalt alloy, a natural diamond, and an artificial diamond.

The step of preparing a dielectric layer, and forming a connection via, which extends through the dielectric layer in a thickness direction of the dielectric layer, on the dielectric layer includes:

- preparing the dielectric layer, and forming the connection via, which extends through the dielectric layer in the thickness direction of the dielectric layer, through a sand-blasting drilling process on the dielectric layer.

The step of forming the connection via, which extends through the dielectric layer in the thickness direction of the dielectric layer, through a sand-blasting drilling process on the dielectric layer includes:

- forming high-speed injection beams through a sand-blasting process by using compressed air as power in combination with solid abrasive particles or liquid mixed with the solid abrasive particles, injecting the injection beams onto the first surface or the second surface of the dielectric layer at a high speed, thereby forming the connection via, which extends through the dielectric layer in the thickness direction of the dielectric layer.

The solid abrasive particles include at least one of carborundum, corundum, calcium carbonate, and quartz sand.

The step of preparing a dielectric layer, and forming a connection via, which extends through the dielectric layer in a thickness direction of the dielectric layer, on the dielectric layer includes:

- preparing the dielectric layer, and forming the connection via, which extends through the dielectric layer in the thickness direction of the dielectric layer, through a laser drilling process on the dielectric layer.

The step of forming the connection via, which extends through the dielectric layer in the thickness direction of the dielectric layer, through a laser drilling process on the dielectric layer includes:

- vertically irradiating a laser onto a first surface or a second surface of the dielectric layer by means of a laser device, thereby forming the connection via, which extends through the dielectric layer in the thickness direction of the dielectric layer.

The laser device is a continuous laser device or a pulse laser device.

The step of preparing a dielectric layer, and forming a connection via, which extends through the dielectric layer in a thickness direction of the dielectric layer, on the dielectric layer includes:

- preparing the dielectric layer, and forming the connection via, which extends through the dielectric layer in the thickness direction of the dielectric layer, through a patterning process.

The step of forming the connection via, which extends through the dielectric layer in the thickness direction of the dielectric layer, through a patterning process includes:

- forming a mask pattern on the dielectric layer, and forming the connection via, which extends through the dielectric layer in the thickness direction of the dielectric layer through a dry etching process or a wet etching process.

The step of forming a connection electrode in the connection via, forming a first extraction electrode on the first surface, and forming a second extraction electrode on the second surface includes steps of:

- forming metal films on the first surface and the second surface of the dielectric layer as seed layers;
- electroplating the seed layers to form the connection electrode in the connection via; and
- forming a first extraction electrode on the first surface and a second extraction electrode on the second surface through a patterning process.

The step of forming metal films on the first surface and the second surface of the dielectric layer as seed layers includes:

forming metal films on the first surface and the second surface of the dielectric layer through a magnetron sputtering process.

The step of forming a connection electrode in the connection via, forming a first extraction electrode on the first surface, and forming a second extraction electrode on the second surface includes:

forming a chemical plating medium on the first surface, the second surface of the dielectric layer and in the connection via of the dielectric layer; performing a chemical plating process on the dielectric layer with the chemical plating medium to form the connection electrode in the connection via, the first extraction electrode on the first surface and the second extraction electrode on the second surface.

The step of forming a connection electrode in the connection via, forming a first extraction electrode on the first surface, and forming a second extraction electrode on the second surface includes:

coating a conductive paste on the connection via, the first surface and the second surface of the dielectric layer, and performing solvent drying and thermocuring processes to form the connection electrode in the connection via, the first extraction electrode on the first surface and the second extraction electrode on the second surface.

The conductive paste includes a low-temperature curing type polymer conductive paste.

The step of coating the conductive paste includes coating the conductive paste by means of any one of screen printing, ink-jet printing, and slit coating.

Before the step of forming a connection electrode in the connection via, forming a first extraction electrode on the first surface, and forming a second extraction electrode on the second surface, the method further includes:

cleaning the dielectric layer with the connection via.

The step of cleaning the dielectric layer with the connection via includes:

placing the dielectric layer with the connection via into a water tank, for cleaning the dielectric layer by means of ultrasonic waves.

The step of cleaning the dielectric layer with the connection via includes:

placing the dielectric layer with the connection via into a water tank, for cleaning the dielectric layer by means of ultrasonic waves, and then, placing the dielectric layer into a solution containing hydrofluoric acid for chemical corrosion.

The connection via has a shape including a cylinder or an inverted truncated cone.

In a second aspect, an embodiment of the present disclosure provides a conductive via, including:

a dielectric layer having a connection via extending through the dielectric layer in a thickness direction of the dielectric layer; wherein the dielectric layer includes a first surface and a second surface oppositely arranged in the thickness direction of the dielectric layer;

a connection electrode in the connection via, a first extraction electrode on the first surface, and a second extraction electrode on the second surface;

wherein the connection electrode at least covers an inner wall of the connection via, and the first extraction electrode and the second extraction electrode are electrically connected to the connection electrode.

The connection via has a shape including a cylinder or an inverted truncated cone.

In a third aspect, an embodiment of the present disclosure provides a passive device, including the above conductive via.

The passive device includes at least an inductor; and the inductor includes a plurality of first sub-structures on the first surface, a plurality of second sub-structures on the second surface, and a plurality of conductive vias through which the plurality of first sub-structures are successively connected to the plurality of second sub-structures in series.

The passive device further includes a capacitor and a resistor both on the second surface.

The dielectric layer includes at least one of glass, polyimide, polyethylene terephthalate, and cyclic olefin polymer.

DETAIL DESCRIPTION OF EMBODIMENTS

Figure 1:
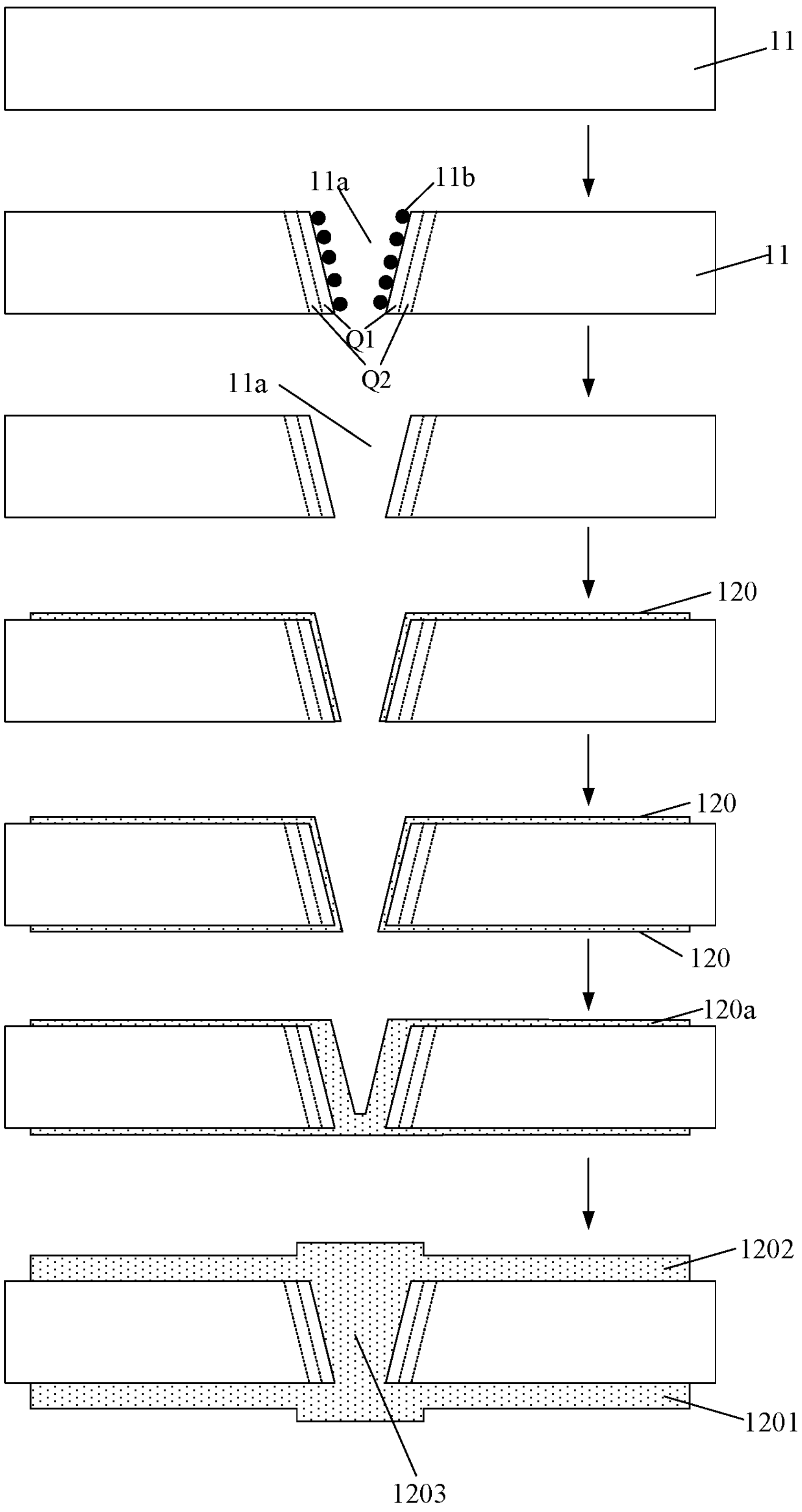
FIG. 1 is a flow chart of example 1 of a method for forming a conductive via according to an embodiment of the present disclosure.

In order to enable one of ordinary skill in the art to better understand the technical solutions of the present disclosure, the present invention will be described in further detail with reference to the accompanying drawings and the detailed description.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. Further, the term "a", "an", "the", or the like used herein does not denote a limitation of quantity, but rather denotes the presence of at least one element. The term of "comprising", "including", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

In a first aspect, an embodiment of the present disclosure provides a method for forming a conductive via. A dielectric layer selected in the method includes, but is not limited to, a glass-based substrate, a silicon-based (Si-based) substrate, an SOI, a gallium arsenide (GaAs) substrate, SiC, InP, a PCB, $Al_2O_3$, or the like. The method may include steps S01 and S02.

In step S01, a dielectric layer is prepared and a connection via extending through the dielectric layer in a thickness direction of the dielectric layer is formed. The dielectric layer includes a first surface and a second surface oppositely disposed in the thickness direction thereof.

In some examples, a manner in which the connection via is formed in the dielectric layer may vary depending on a material selected for the dielectric layer. For example, the connection via extending through the dielectric layer is formed by adopting any one of mechanical drilling, sand-blasting drilling, laser drilling, patterning process and the like.

In some examples, after the step S01, the method further includes a step of cleaning the dielectric layer, such that a surface of an inner wall of the formed connection via is flat and smooth.

For example, the dielectric layer is placed into a water tank containing pure deionized water or a combination of the deionized water with a proper amount of cleaning agent (such as an oil-based cleaning agent or a water-based cleaning agent); the water is subjected to cavitation, acceleration and direct flow actions by means of ultrasonic waves, so that a pollutant layer is dispersed, emulsified and stripped to achieve the purpose of cleaning; and finally, the dielectric layer is washed by the pure deionized water and is taken out of the water tank and is dried by an air knife.

Alternatively, the dielectric layer is placed in the water tank, is firstly subjected to ultrasonic cleaning to remove floating dust on a surface of the dielectric layer; the dielectric layer is then immersed in a solution containing hydrofluoric acid for chemical corrosion, so that defects, such as microcrack areas, stress concentration areas and the like, which are near the connection via and in the inner wall of the connection via in the dielectric layer, may be thoroughly removed through the chemical corrosion; finally, the dielectric layer is washed by the pure deionized water and is taken out of the water tank and is dried by an air knife.

In S02, a connection electrode is formed in the connection via, and a first extraction electrode and a second extraction electrode are formed on the first surface and the second surface of the dielectric layer, respectively. The connection electrode at least covers the inner wall of the connection via, and the first extraction electrode and the second extraction electrode are electrically connected to the connection electrode.

In some examples, the step of forming the connection electrode, the first extraction electrode, and the second extraction electrode on the dielectric layer may include:

depositing metal films on the first surface and the second surface of the dielectric layer provided with the connection via as seed layers; then, thickening the metal films through an electroplating process, so that the metal films cover the inner wall of the connection via, and even fill the connection via; patterning the metal films formed on the first surface and the second surface of the dielectric layer, for forming the first extraction electrode and the second extraction electrode.

In some examples, the step of forming the connection electrode, the first extraction electrode, and the second extraction electrode on the dielectric layer may further include: forming a chemical plating medium on the first surface and the second surface of the dielectric layer provided with the connection via, and performing a chemical plating process to form metal films, so that the metal films cover the inner wall of the connection via; patterning the metal films formed on the first surface and the second surface of the dielectric layer, for forming the first extraction electrode and the second extraction electrode.

In some examples, the step of forming the connection electrode, the first extraction electrode, and the second extraction electrode on the dielectric layer may further include: applying (extruding) a metal paste into the connection via of the dielectric layer, and forming the metal paste on the first surface and the second surface of the dielectric layer; and then, curing the metal paste on the first surface and the second surface, respectively, to form the connection electrode filled in the connection via, the first extraction electrode on the first surface and the second extraction electrode on the second surface.

In order to clarify the method for forming the conductive via according to the embodiment of the present disclosure, the formation method is specifically described below according to materials of the dielectric layer. The following examples should not be construed as limiting the scope of the embodiments of the present disclosure.

Example 1

FIG. 1 is a flow chart of example 1 of a method for forming a conductive via according to an embodiment of the present disclosure. As shown in FIG. 1, the formation method specifically includes steps of:

S11, preparing a dielectric layer 11, wherein a material of the dielectric layer 11 includes, but is not limited to, any one of glass, Si, SOI, GaAs, SiC, InP, PCB, $Al_2O_3$; forming a connection via 11*a* through a mechanical drilling process on the dielectric layer 11.

In some examples, a material of a drill bit used for the mechanical drilling process is a material with a high rigidity, such as a tungsten carbide, a tungsten-cobalt alloy, a tungsten-titanium-cobalt alloy, or any other alloy with a high rigidity (an HRC value greater than 90 degrees), or a natural diamond, an artificial diamond, or the like. A thickness of the dielectric layer 11 is in a range of 0.1 mm to 2 mm, and a diameter of the connection via 11*a* is in a range of 0.5 mm to 1.5 mm. According to shapes of different drill bits and drilling conditions (rotating speed, drilling speed and the like), the inner wall of the connection via 11*a* may be kept straight or tapered from top to bottom, and an inclination angle of the connection via 11*a* is approximately in a range of 0° to 15°. For example, the inclination angle of the connection via 11*a* is 15°.

It should be noted that in the embodiment of the present disclosure, the top and the bottom of the inner wall of the connection via 11*a* are described as relative to each other. In FIG. 1, a side relatively close to the second surface is the top, and a side relatively close to the first surface is the bottom. Alternatively, in the embodiment of the present disclosure, as an example, the side relatively close to the second surface is the top, and the side relatively close to the first surface is the bottom. The inclination angle of the connection via 11*a* in the embodiment of the present disclosure refers to an included angle between an extending direction of the inner wall of the connection via 11*a* and a plane where the first surface is located.

S12, cleaning the dielectric layer 11 after step S11, so that residues, debris (11*b* shown in FIG. 1), and the like near the inner wall and an outer edge of the connection via 11*a* are washed away.

In some examples, step S12 may specifically include: placing the dielectric layer 11 into a water tank containing pure deionized water or a combination of the deionized water with a proper amount of cleaning agent (such as an oil-based cleaning agent or a water-based cleaning agent) at a temperature approximately in a range of 35° C. to 70° C., wherein the water is subjected to cavitation, acceleration and direct flow actions by means of ultrasonic waves (with a frequency approximately in a range of 10 kHz to 10 MHz), so that a pollutant layer is dispersed, emulsified and stripped to achieve the purpose of cleaning, wherein the cleaning time is approximately in a range of 2 to 20 minutes; and finally, washing the dielectric layer 11 by using the pure deionized water, and taking the dielectric layer 11 out of the water tank, and drying the dielectric layer 11 by using an air knife.

S13, forming metal films 120, as seed layers, within the connection via 11*a* in the dielectric layer 11, and on the first surface and the second surface of the dielectric layer 11, after the step S12.

In some examples, step S13 may specifically include: depositing metal films 120 with good conductivity, as seed layers, on the whole first surface and the whole second surface of the dielectric layer 11 through a process including, but being not limited to, a magnetron sputtering process. In addition to the magnetron sputtering process, the metal films 120 may be formed through an electron beam evaporation process, a thermal evaporation process, or a pulsed laser sputtering process.

In some examples, a metal stack is generally used as the metal film to increase the adhesion between the metal film and the dielectric layer 11. That is, the metal film may include a first metal sub-layer and a second metal sub-layer sequentially arranged in a direction away from the dielectric layer 11. A material of the first metal sub-layer includes, but is not limited to, any one of titanium (Ti), molybdenum (Mo), and nickel (Ni), and a material of the second metal sub-layer includes, but is not limited to, any one of copper (Cu), silver (Ag), or gold (Au). For example, the metal film may include: any one of Ti/Cu, Mo/Cu, Ni/Cu, Ti/Ag, Mo/Ag and Ni/Ag. In the embodiment of the present disclosure, a thickness of the first metal sub-layer is in a range of about 1 nm to about 100 nm; a thickness of the second metal sub-layer is in a range of about 50 nm to about 1000 nm. In addition, a thickness of the metal film on the inner wall of the connection via 11*a* is in a range of about 1 nm to about 200 nm.

S14, filling the connection via 11*a* through an electroplating process and thickening the metal films 120 formed on the first surface and the second surface, after the step S13, to form a first extraction electrode 1201 on the first surface and a second extraction electrode 1202 on the second surface, respectively, and a connection electrode 1203 within the connection via 11*a*.

In some examples, step S14 may specifically include: firstly, a via-filling electroplating process is performed in an electroplating bath through a reasonable combination of different types of electroplating solutions (such as a formula for filling the metal film into the connection via 11*a* and a formula for thickening the metal films on the whole surfaces), so that the metal film 120 (such as a first metal sub-layer in the metal film 120) is deposited on the inner wall of the connection via 11*a*, wherein an electroplating rate is in a range of 0.5 um/min to 5 um/min, and depending to an electroplating duration, the metal material may fully fill the connection via 11*a* (a thickness of the metal film is equal to 0.5 times of a diameter of the connection via 11*a*) or not fully fill the connection via 11*a*, only the inner wall of the connection via 11*a* is metallized (the thickness of the metal film is in a range of 500 nm to 10 um). That is, the connection electrode 1203 is formed. Then, the dielectric layer 11 is moved into the electroplating bath for the formula for thickening the metal films on the whole surfaces, to thicken the metal films 120 on the first surface and the second surface through an electroplating process, respectively, wherein the electroplating metal is Cu, Ag or Au, the electroplating rate is in a range of 0.5 um/min to 5 um/min, and depending to the electroplating duration, a thickness of each of the thickened metal films 120*a* is approximately in a range of 500 nm to 500 um. After the electroplating process, the surfaces of the dielectric layer 11 are generally undulated and uneven, which adversely affects subsequent processes. Thus, finally, a chemical mechanical polishing process is performed, such that the surfaces of the dielectric layer 11 become flat and smooth, thereby forming the first extraction electrode 1201 and the second extraction electrode 1202.

Alternatively, after the electroplating process, the thickened metal films 120*a* on the first surface and the second surface may be patterned, to form the first extraction electrode 1201 and the second extraction electrode 1202.

Example 2

Figure 2:
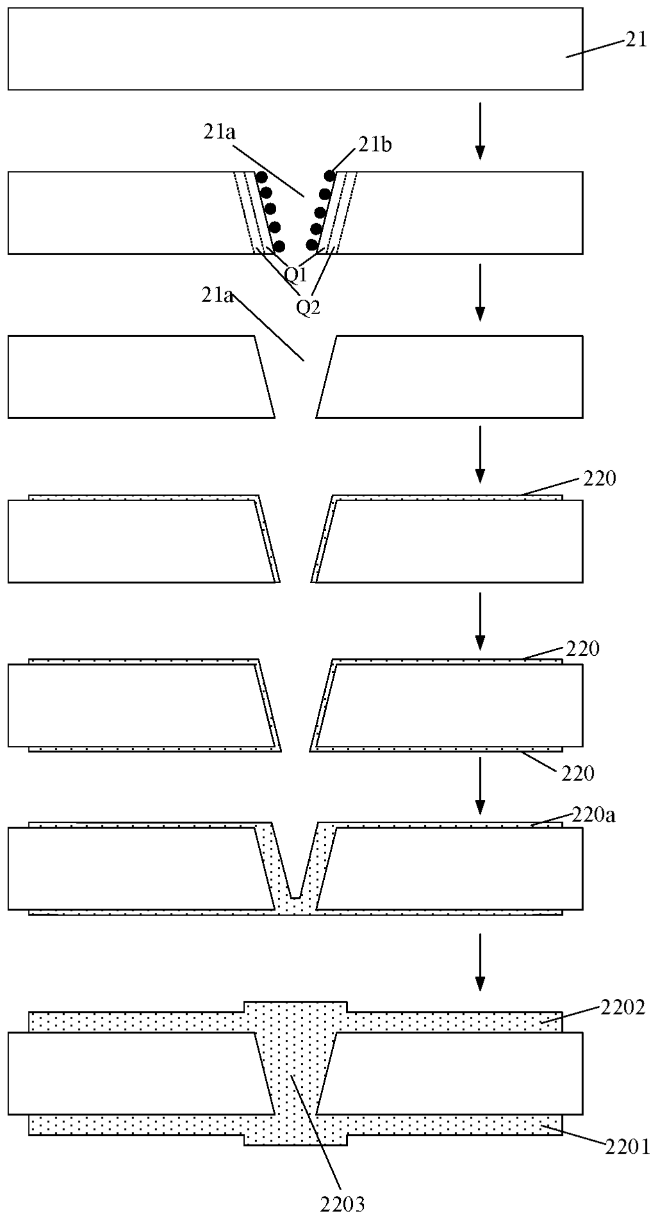
FIG. 2 is a flow chart of example 2 of a method for forming a conductive via according to an embodiment of the present disclosure.

FIG. 2 is a flow chart of example 2 of a method for forming a conductive via according to an embodiment of the present disclosure. As shown in FIG. 2, the formation method specifically includes steps of:

S21, preparing a dielectric layer 21, wherein a material of the dielectric layer 21 includes, but is not limited to, any one of glass, Si, SOI; forming a connection via 21*a* through a mechanical drilling process on the dielectric layer 21.

In some examples, a material of a drill bit used for the mechanical drilling process is a material with a high rigidity, such as a tungsten carbide, a tungsten-cobalt alloy, a tungsten-titanium-cobalt alloy, or other alloys with a high rigidity (an HRC value greater than 90 degrees), or a natural diamond, an artificial diamond, or the like. A thickness of the dielectric layer 21 is in a range of 0.1 mm to 2 mm, and a diameter of the connection via 21*a* is in a range of 0.5 mm to 1.5 mm. According to shapes of different drill bits and drilling conditions (rotating speed, drilling speed and the like), the inner wall of the connection via 21*a* may be kept straight or tapered from top to bottom, and an inclination angle of the connection via 11*a* is approximately in a range of 0° to 15°. For example, the inclination angle of the connection via 11*a* is 15°.

S22, cleaning the dielectric layer 21, after step S21, so that residues, debris (21*b* shown in FIG. 2), and the like near the inner wall and an outer edge of the connection via 21*a* are washed away.

In some examples, step S22 may specifically include: the dielectric layer 21 is placed into a water tank, wherein the dielectric layer 21 is firstly subjected to ultrasonic cleaning to remove floating dust on a surface of the dielectric layer; the dielectric layer 21 is then immersed in a solution containing hydrofluoric acid for chemical corrosion, so that defects, such as microcrack areas Q1, stress concentration areas Q2 and the like, which are near the connection via and in its inner wall on the dielectric layer 21 made of glass, Si or SOI, may be thoroughly removed through the chemical corrosion. A content of HF in the solution is approximately in a range of 1% to 20%, and $NH_4F$ may or may not be contained in the solution. When $NH_4F$ is contained, a content of $NH_4F$ is approximately in a range of 10 to 40%, a temperature of the solution is approximately in a range of 35° C. to 60° C., a duration for the chemical corrosion is approximately in a range of 30 seconds to 5 minutes. Then, the dielectric layer 21 is thoroughly washed by the pure deionized water, and finally, is dried by the air knife. The chemically corroded connection via 21*a* has smooth inner wall and surface and does not contain the defects, such as microcrack areas Q1, stress concentration areas Q2 and the like, which is beneficial to the growth of seed layers with a high quality, the via-filling and the thickening with metal.

S23, forming metal films 220, as seed layers, within the connection via 21*a* of the dielectric layer 21, and on the first surface and the second surface of the dielectric layer 21, after the step S22.

In some examples, step S23 may specifically include: depositing metal films 220 with good conductivity, as seed layers, on the whole first surface and the whole second surface of the dielectric layer 21 through a process including, but being not limited to, a magnetron sputtering process. In addition to the magnetron sputtering process, the metal films 220 may be formed through an electron beam evaporation process, an thermal evaporation process, or a pulsed laser sputtering process.

In some examples, a metal stack is generally used as the metal film 220 to increase the adhesion between the metal films 220 and the dielectric layer 21. That is, the metal films 220 include a first metal sub-layer and a second metal sub-layer sequentially arranged in a direction away from the dielectric layer. A material of the first metal sub-layer includes, but is not limited to, any one of titanium (Ti), molybdenum (Mo), and nickel (Ni), and a material of the second metal sub-layer includes, but is not limited to, any one of copper (Cu), silver (Ag), or gold (Au). For example, the metal film 220 include: any one of Ti/Cu, Mo/Cu, Ni/Cu, Ti/Ag, Mo/Ag and Ni/Ag. In the embodiment of the present disclosure, a thickness of the first metal sub-layer is in a range of about 1 nm to about 100 nm; a thickness of the second metal sub-layer is in a range of about 50 nm to about 1000 nm. In addition, a thickness of the metal film on the inner wall of the connection via 21*a* is in a range of about 1 nm to about 200 nm.

S24, filling the connection via 21*a* through an electroplating process and thickening the metal films 220 formed on the first surface and the second surface, after the step S23, to form a first extraction electrode 2201 on the first surface and a second extraction electrode 2202 on the second surface, respectively, and a connection electrode 2203 within the connection via 21*a*.

In some examples, step S24 may specifically include: firstly, a via-filling electroplating process is performed in an electroplating bath through a reasonable combination of different types of electroplating solutions (such as a formula for filling the metal film 220 into the connection via 21*a* and a formula for thickening the metal films on the whole surfaces), so that the metal film (such as a first metal sub-layer in the metal film) is deposited on the inner wall of the connection via 21*a*, wherein an electroplating rate is in a range of 0.5 um/min to 5 um/min, and depending to an electroplating duration, the metal material may fully fill the connection via (a thickness of the metal film is equal to 0.5 times of a diameter of the connection via) or not fully fill the connection via, only the inner wall of the connection via is metallized (the thickness of the metal film is in a range of 500 nm to 10 um). Then, the dielectric layer 21 is moved into the electroplating bath for the formula for thickening the metal films on the whole surfaces, to thicken the metal films 220 on the first surface and the second surface through an electroplating process, respectively, wherein the electroplating metal is Cu, Ag or Au, the electroplating rate is in a range of 0.5 um/min to 5 um/min, and depending to the electroplating duration, a thickness of each of the thickened metal films 220*a* is approximately in a range of 500 nm to 500 um. After the electroplating process, the surfaces of the dielectric layer 21 are generally undulated and uneven, which adversely affects subsequent processes. Thus, finally, a chemical mechanical polishing process is performed, such that the surfaces of the dielectric layer 21 become flat and smooth.

Alternatively, after the electroplating process, the thickened metal films 220*a* on the first surface and the second surface may be patterned, to form the first extraction electrode 2201 and the second extraction electrode 2202.

Example 3

Figure 3:
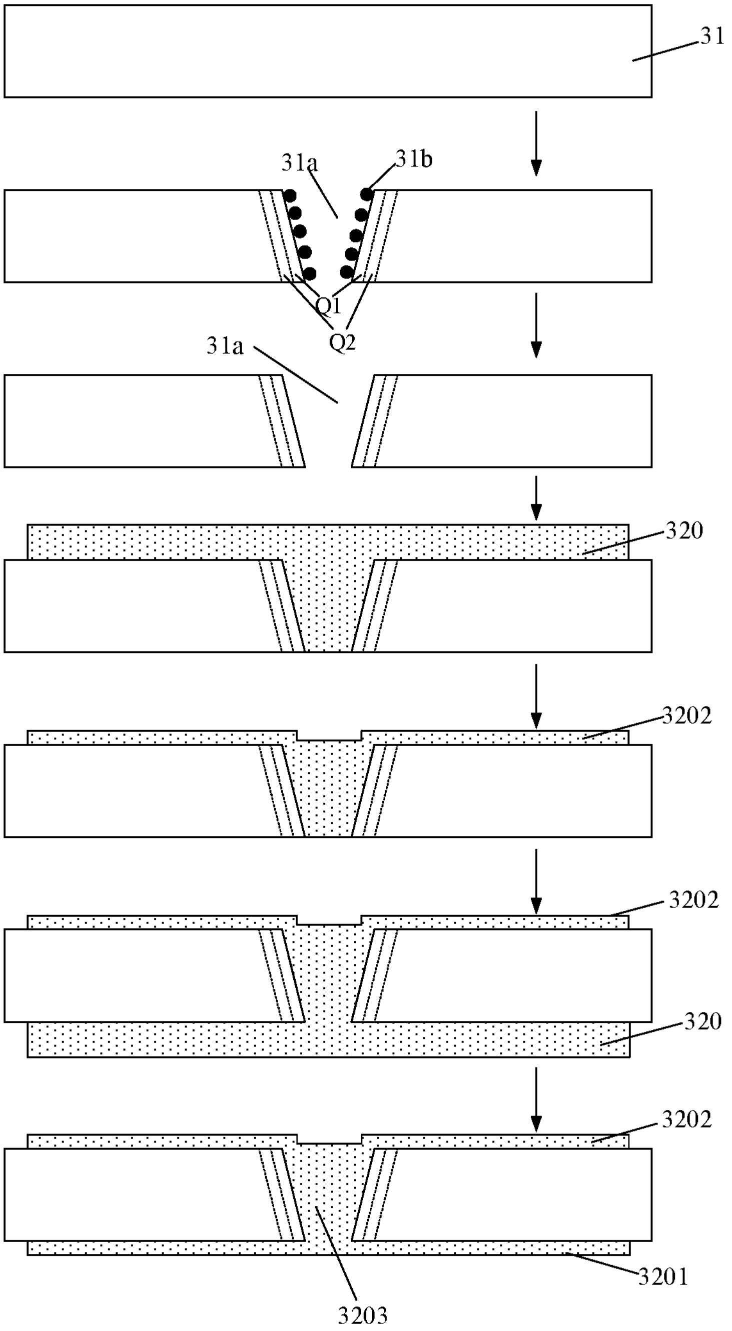
FIG. 3 is a flow chart of example 3 of a method for forming a conductive via according to an embodiment of the present disclosure.

FIG. 3 is a flow chart of example 3 of a method for forming a conductive via according to an embodiment of the present disclosure. As shown in FIG. 3, the formation method specifically includes steps of:

S31, preparing a dielectric layer 31, wherein a material of the dielectric layer 31 includes, but is not limited to, any one of glass, Si, SOI, GaAs, SiC, InP, PCB, $Al_2O_3$; forming a connection via 31*a* through a mechanical drilling process on the dielectric layer 31.

In some examples, a material of a drill bit used for the mechanical drilling process is a material with a high rigidity, such as a tungsten carbide, a tungsten-cobalt alloy, a tungsten-titanium-cobalt alloy, or other alloys with a high rigidity (an HRC value greater than 90 degrees), or a natural diamond, an artificial diamond, or the like. A thickness of the dielectric layer 31 is in a range of 0.1 mm to 2 mm, and a diameter of the connection via 31*a* is in a range of 0.5 mm to 1.5 mm. According to shapes of different drill bits and drilling conditions (rotating speed, drilling speed and the like), the inner wall of the connection via 31*a* may be kept straight or tapered from top to bottom, and an inclination angle of the connection via 31*a* is approximately in a range of 0° to 15°. For example, the inclination angle of the connection via 31*a* is 15°.

S32, cleaning the dielectric layer 31, after step S31, so that residues, debris (31*b* shown in FIG. 3), and the like near the inner wall and an outer edge of the connection via 31*a* are washed away.

In some examples, step S32 may specifically include: placing the dielectric layer 31 into a water tank containing pure deionized water or a combination of the deionized water with a proper amount of cleaning agent (such as an oil-based cleaning agent or a water-based cleaning agent) at a temperature approximately in a range of 35° C. to 70° C., wherein the water is subjected to cavitation, acceleration and direct flow actions by means of ultrasonic waves (with a frequency approximately in a range of 10 kHz to 10 MHz), so that a pollutant layer is dispersed, emulsified and stripped to achieve the purpose of cleaning, wherein the cleaning time is approximately in a range of 2 to 20 minutes; and finally, washing the dielectric layer 31 by using the pure deionized water, and taking the dielectric layer 31 out of the water tank, and drying the dielectric layer 31 by using an air knife.

S33, after the step S32, applying a metal paste into the connection via 31*a* of the dielectric layer 31, and forming the metal paste 320 on the first surface and the second surface of the dielectric layer 31; and then, curing the metal paste 320 on the first surface and the second surface, respectively, to form a connection electrode 3203 filled in the connection via 31*a*, a first extraction electrode 3201 on the first surface and a second extraction electrode 3202 on the second surface.

In some examples, the metal paste 320 may be a conductive paste. A material of the conductive paste includes, but is not limited to, a low-temperature curing type polymer conductive paste, and main components of the conductive paste include conductive particles, a resin, a curing agent, a dispersant, a diluent, an adhesion enhancer, and an anti-settling agent. The conductive particles may be selected from Cu, Ag and Au, and a size of each particle is approximately in a range of 1 nm to 100 um. The resin may be bisphenol epoxy resin. The curing agent may be acid anhydrides. The dispersant may be methylimidazole. The diluent may be butyl acetate. The adhesion enhancer may be tetraethyl titanate. The anti-settling agent may be polyamides.

Step S33 may specifically include: firstly, coating the conductive paste in the connection via 31*a* and around an edge of the connection via 31*a* on the second surface, and then, performing solvent drying and thermocuring processes on the second surface of the dielectric layer 31 to form the connection electrode 3203 filled in the connection via 31*a* and the second extraction electrode 3202 located on the second surface; then, coating the conductive paste around an edge of the connection via 31*a* on the first surface of the dielectric layer 31, and then, performing solvent drying and thermocuring processes on the first surface of the dielectric layer 31 to form the first extraction electrode 3201 located on the first surface. The preferred mode for coating the conductive paste includes, but is not limited to, screen printing, ink-jet printing, slit coating or the like. A vacuum adsorption machine is used in cooperation when the conductive paste is coated, so that the coating efficiency may be improved, and a distribution profile of the conductive paste on the wall and the edge of the connection via may be improved. The solvent drying process may be performed under an atmospheric pressure of air, an atmospheric pressure of N2 or the vacuum, at a temperature in a range of about 40° C. to about 95° C., for a duration in a range of about 1 min to about 30 min. The thermocuring process may be performed in an oven, under the atmosphere of N2, at a heating temperature in a range of about 140° C. to about 200° C. Alternatively, the curing process may be performed by means of illumination with laser beams, which have a wavelength in a range of about 500 nm to about 1510 nm, a laser power in a range of 50 mW to 50 W, and a beam diameter in a range of about 10 um to about 2000 um, and the laser beams may be a single beam or multiple beams.

Example 4

Figure 4:
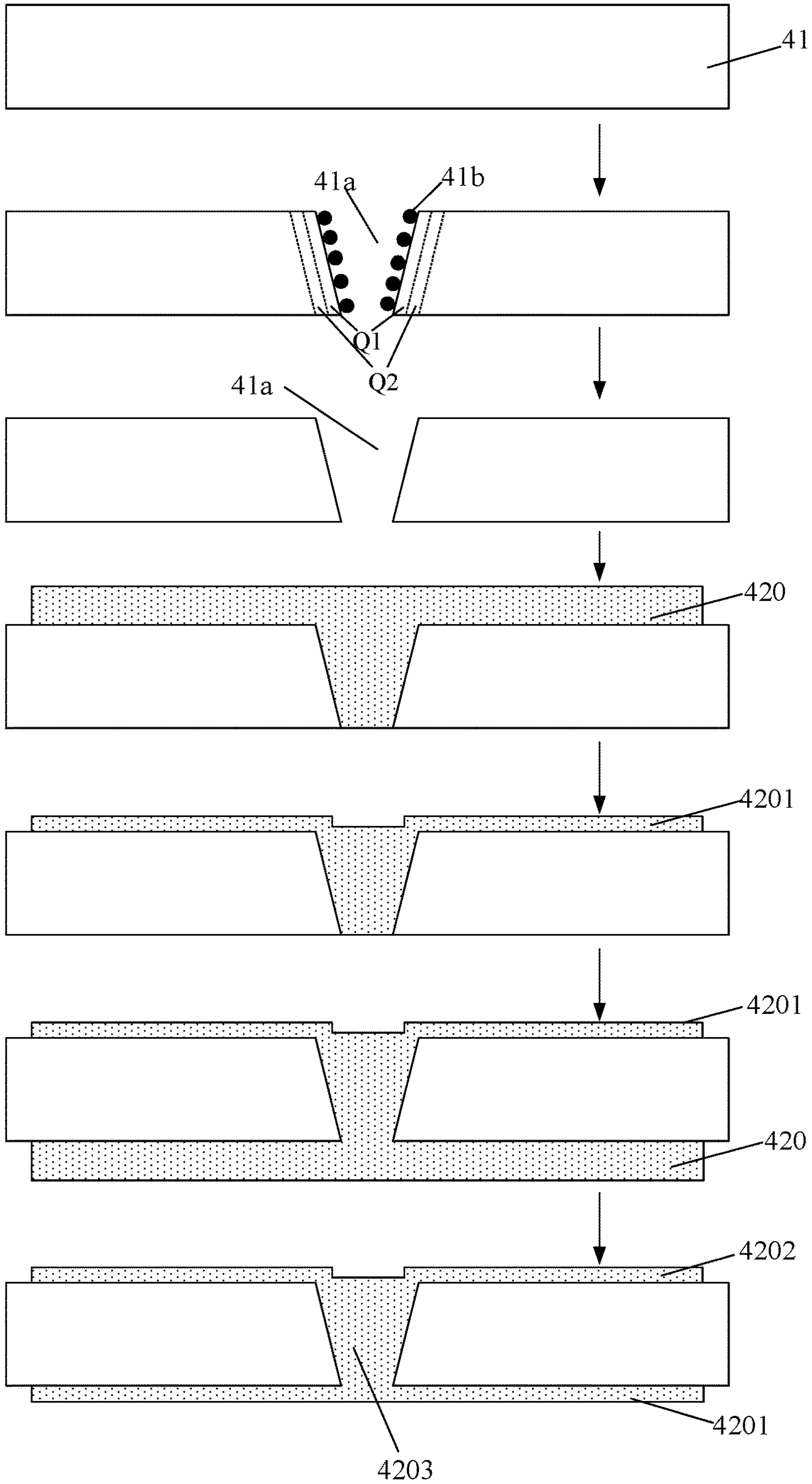
FIG. 4 is a flow chart of example 4 of a method for forming a conductive via according to an embodiment of the present disclosure.

FIG. 4 is a flow chart of example 4 of a method for forming a conductive via according to an embodiment of the present disclosure. As shown in FIG. 4, the formation method specifically includes steps of:

S41, preparing a dielectric layer 41, wherein a material of the dielectric layer 41 includes, but is not limited to, any one of glass, Si, SOI; forming a connection via 41*a* through a mechanical drilling process on the dielectric layer 41.

In some examples, a material of a drill bit used for the mechanical drilling process is a material with a high rigidity, such as a tungsten carbide, a tungsten-cobalt alloy, a tungsten-titanium-cobalt alloy, or other alloys with a high rigidity (an HRC value greater than 90 degrees), or a natural diamond, an artificial diamond, or the like. A thickness of the dielectric layer 41 is in a range of 0.1 mm to 2 mm, and a diameter of the connection via 41*a* is in a range of 0.5 mm to 1.5 mm. According to shapes of different drill bits and drilling conditions (rotating speed, drilling speed and the like), the inner wall of the connection via 41*a* may be kept straight or tapered from top to bottom, and an inclination angle of the connection via 41*a* is approximately in a range of 0° to 15°. For example, the inclination angle of the connection via 41*a* is 15°.

S42, cleaning the dielectric layer 41, after step S41, so that residues, debris (41*b* shown in FIG. 4), and the like near the inner wall and an outer edge of the connection via 41*a* are washed away.

In some examples, step S42 may specifically include: the dielectric layer 41 is placed into a water tank, wherein the dielectric layer 41 is firstly subjected to ultrasonic cleaning to remove floating dust on a surface of the dielectric layer; the dielectric layer 41 is then immersed in a solution containing hydrofluoric acid for chemical corrosion, so that defects, such as microcrack areas Q1, stress concentration areas Q2 and the like, which are near the connection via 41*a* and in its inner wall on the dielectric layer 41 made of glass, Si or SOL, may be thoroughly removed through the chemical corrosion. A content of HF in the solution is approximately in a range of 1% to 20%, and $NH_4F$ may or may not be contained in the solution. When $NH_4F$ is contained, a content of $NH_4F$ is approximately in a range of 10 to 40%, a temperature of the solution is approximately in a range of 35° C. to 60° C., a duration for the chemical corrosion is approximately in a range of 30 seconds to 5 minutes. Then, the dielectric layer 41 is thoroughly washed by the pure deionized water, and finally, is dried by the air knife. The chemically corroded connection via 41*a* has smooth inner wall and surface and does not contain the defects, such as microcrack areas Q1, stress concentration areas Q2 and the like.

S43, after the step S42, applying a metal paste 420 into the connection via 41*a* of the dielectric layer 41, and forming the metal paste 420 on the first surface and the second surface of the dielectric layer 41; and then, curing the metal paste 420 on the first surface and the second surface, respectively, to form a connection electrode 4203 filled in the connection via 41*a*, a first extraction electrode 4201 on the first surface and a second extraction electrode 4202 on the second surface.

In some examples, the metal paste 420 may be a conductive paste. A material of the conductive paste includes, but is not limited to, a low-temperature curing type polymer conductive paste, and main components of the conductive paste include conductive particles, a resin, a curing agent, a dispersant, a diluent, an adhesion enhancer, and an anti-settling agent. The conductive particles may be selected from Cu, Ag and Au, and a size of each particle is approximately in a range of 1 nm to 100 um. The resin may be bisphenol epoxy resin. The curing agent may be acid anhydrides. The dispersant may be methylimidazole. The diluent may be butyl acetate. The adhesion enhancer may be tetraethyl titanate. The anti-settling agent may be polyamides.

Step S43 may specifically include: firstly, coating the conductive paste in the connection via 41*a* and around an edge of the connection via 41*a* on the second surface, and then, performing solvent drying and thermocuring processes on the second surface of the dielectric layer 41 to form the connection electrode 4203 filled in the connection via 41*a* and the second extraction electrode 4202 located on the second surface; then, coating the conductive paste around an edge of the connection via 41*a* on the first surface of the dielectric layer 41, and then, performing solvent drying and thermocuring processes on the first surface of the dielectric layer 41 to form the first extraction electrode 4201 located on the first surface. The preferred mode for coating the conductive paste includes, but is not limited to, screen printing, ink-jet printing, slit coating or the like. A vacuum adsorption machine is used in cooperation when the conductive paste is coated, so that the coating efficiency may be improved, and a distribution profile of the conductive paste on the wall and the edge of the via may be improved. The solvent drying process may be performed under an atmospheric pressure of air, an atmospheric pressure of N2 or the vacuum, at a temperature in a range of about 40° C. to about 95° C., for a duration in a range of about 1 min to about 30 min. The thermocuring process may be performed in an oven, under the atmosphere of N2, at a heating temperature in a range of about 140° C. to about 200° C. Alternatively, the curing process may be performed by means of illumination with laser beams, which have a wavelength in a range of about 500 nm to about 1510 nm, a laser power in a range of 50 mW to 50 W, and a beam diameter in a range of about 10 um to about 2000 um, and the laser beams may be a single beam or multiple beams.

Example 5

Figure 5:
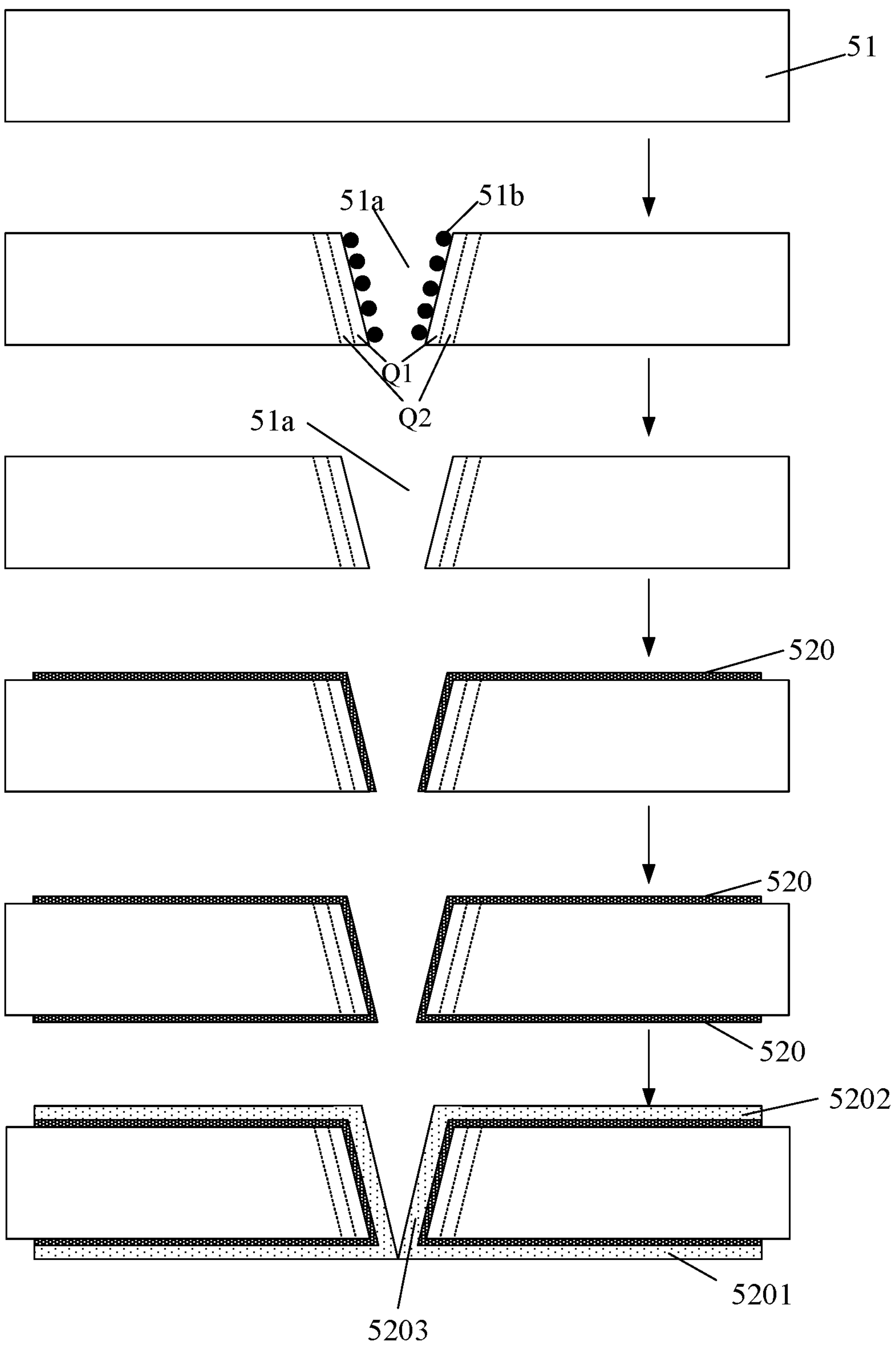
FIG. 5 is a flow chart of example 5 of a method for forming a conductive via according to an embodiment of the present disclosure.

FIG. 5 is a flow chart of example 5 of a method for forming a conductive via according to an embodiment of the present disclosure. As shown in FIG. 5, the formation method specifically includes steps of:

S51, preparing a dielectric layer 51, wherein a material of the dielectric layer 51 includes, but is not limited to, any one of glass, Si, SOI, GaAs, SiC, InP, PCB, $Al_2O_3$; forming a connection via Sla through a mechanical drilling process on the dielectric layer 51.

In some examples, a material of a drill bit used for the mechanical drilling process is a material with a high rigidity, such as a tungsten carbide, a tungsten-cobalt alloy, a tungsten-titanium-cobalt alloy, or other alloys with a high rigidity (an HRC value greater than 90 degrees), or a natural diamond, an artificial diamond, or the like. A thickness of the dielectric layer 51 is in a range of 0.1 mm to 2 mm, and a diameter of the connection via Sla is in a range of 0.5 mm to 1.5 mm. According to shapes of different drill bits and drilling conditions (rotating speed, drilling speed and the like), the inner wall of the connection via Sla may be kept straight or tapered from top to bottom, and an inclination angle of the connection via Sla is approximately in a range of 0° to 15°. For example, the inclination angle of the connection via Sla is 15°.

S52, cleaning the dielectric layer 51, after step S51, so that residues, debris (51*b* shown in FIG. 5), and the like near the inner wall and an outer edge of the connection via Sla are washed away.

In some examples, step S52 may specifically include: placing the dielectric layer 51 into a water tank containing pure deionized water or a combination of the deionized water with a proper amount of cleaning agent (such as an oil-based cleaning agent or a water-based cleaning agent) at a temperature approximately in a range of 35° C. to 70° C., wherein the water is subjected to cavitation, acceleration and direct flow actions by means of ultrasonic waves (with a frequency approximately in a range of 10 kHz to 10 MHz), so that a pollutant layer is dispersed, emulsified and stripped to achieve the purpose of cleaning, wherein the cleaning time is approximately in a range of 2 to 20 minutes; and finally, washing the dielectric layer 51 by using the pure deionized water, and taking the dielectric layer 51 out of the water tank, and drying the dielectric layer 51 by using an air knife.

S53, forming a chemical plating medium 520 on the first surface and the second surface of the dielectric layer 51 provided with the connection via 51*a* after the step S52.

In some examples, step S53 may specifically include: placing the dielectric layer 51, in a spraying mode or directly, into a water tank containing a solution of the chemical plating medium 520, so that a layer of $Sn^{2+}$ is adsorbed on surfaces of the dielectric layer 51. The solution of the chemical plating medium 520 mainly contains $SnCl_2$ of 10 g/L to 30 g/L, concentrated hydrochloric acid (having a concentration of 38%) of 20 ml/L to 60 ml/L and deionized water. A less number of Sn particles are added into the solution to prevent the $Sn^{2+}$ from being oxidated. Then, the dielectric layer 51 is placed, in a spraying mode or directly, into a water tank containing an activation solution, so that surfaces of the dielectric layer 51 reacts with the activation solution (mainly containing $SnCl_2$ of 80 g/L to 120 g/L, concentrated hydrochloric acid of 300 ml/L to 500 ml/L, $Na_2SnO_3$ of 10 g/L to 20 g/L, $PdCl_2$ of 1 g/L to 4 g/L and deionized water), to generate metal palladium particles which are tightly attached to the surfaces of the dielectric layer 51. That is, the chemical plating medium 520 is formed on the first surface and the second surface of the dielectric layer 51 provided with the connection via Sla. It should be noted that the chemical plating medium 520 may be formed on the first surface, and then, on the second surface of the dielectric layer 51.

S54, after the step S53, performing a chemical plating process on the dielectric layer 51 with the chemical plating medium 520 to form metal films on the first surface, the second surface of the dielectric layer 51, and in the connection via 51*a*, and patterning the metal films formed on the first surface and the second surface of the dielectric layer 51, for forming a first extraction electrode 5201 and a second extraction electrode 5202, and a connection electrode 5203 in the connection via 51*a*.

In some examples, the chemically plated metal films may be a single-layer metal film or may be metal films stacked together. For example: only a Cu metal film is plated to form a single-layer metal film (having a thickness in a range of about 1 um to about 100 um). Alternatively, it is also possible to firstly plate a Ni metal film (having a thickness in a range of about 10 um to about 100 um), and then a Cu metal film (having a thickness in a range of about 1 um to about 100 um), wherein the Ni metal film is used to increase the adhesion of the Cu metal film. In the embodiment of the present disclosure, as an example, a material of the single-layer metal film is Cu, and a material of metal films stacked together is Ni/Cu, which does not limit the scope of the embodiment of the present disclosure. It will be described below by taking an example in which Ni/Cu metal films are chemically plated.

In some examples, step S54 may specifically include: placing the dielectric layer 51 into the chemical plating solution, and sequentially performing the chemical plating process with metal Ni and Cu. Then, the metal films formed on the first surface and the second surface of the dielectric layer 51 are patterned, for forming the first extraction electrode 5201 and the second extraction electrode 5202, and the connection electrode 5203 in the connection via Sla. The Ni solution for the chemical plating generally contains NiSO4·6H2O of 10 g/L to 30 g/L, NaH2PO4·2H2O 20 g/L to 40 g/L, Na-Citrate of 5 g/L to 15 g/L and NH4Cl of 20 g/L to 40 g/L, the solution is alkaline, has a PH in a range of 8.0 to 10.0 and a temperature in a range of 75° C. to 90° C. The Cu solution for the chemical plating generally contains KNaC4H4O6 of 30 g/L to 50 g/L, NaOH of 8 g/L to 10 g/L, Na2CO3 of 38 g/L to 40 g/L, CuSO4 of 10 g/L to 20 g/L, NiCl2 of 2 g/L to 6 g/L and formaldehyde of 40 ml/L to 60 ml/L with a concentration of 35%, the solution is alkaline, has a PH in a range of 11.0 to 14.0 and a temperature in a range of 55° C. to 65° C.

Example 6

Figure 6:
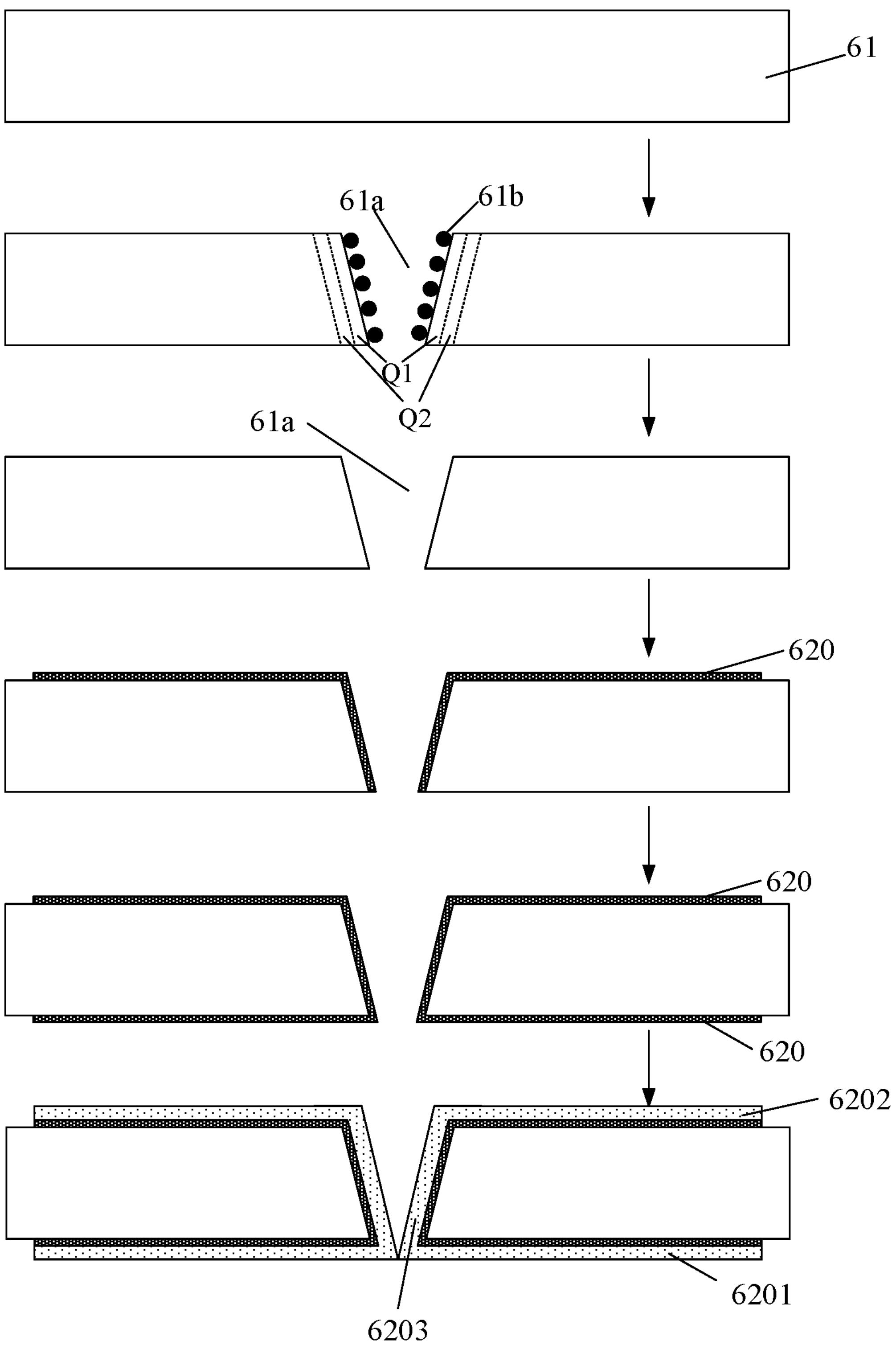
FIG. 6 is a flow chart of example 6 of a method for forming a conductive via according to an embodiment of the present disclosure.

FIG. 6 is a flow chart of example 6 of a method for forming a conductive via according to an embodiment of the present disclosure. As shown in FIG. 6, the formation method specifically includes steps of:

S61, preparing a dielectric layer 61, wherein a material of the dielectric layer 61 includes, but is not limited to, any one of glass, Si, SOI, GaAs, SiC, InP, PCB, $Al_2O_3$; forming a connection via 61*a* through a mechanical drilling process on the dielectric layer 61.

In some examples, a material of a drill bit used for the mechanical drilling process is a material with a high rigidity, such as a tungsten carbide, a tungsten-cobalt alloy, a tungsten-titanium-cobalt alloy, or other alloys with a high rigidity (an HRC value greater than 90 degrees), or a natural diamond, an artificial diamond, or the like. A thickness of the dielectric layer 61 is in a range of 0.1 mm to 2 mm, and a diameter of the connection via 61*a* is in a range of 0.5 mm to 1.5 mm. According to shapes of different drill bits and drilling conditions (rotating speed, drilling speed and the like), the inner wall of the connection via 61*a* may be kept straight or tapered from top to bottom, and an inclination angle of the connection via 61*a* is approximately in a range of 0° to 15°. For example, the inclination angle of the connection via 61*a* is 15°.

S62, cleaning the dielectric layer 61, after step S61, so that residues, debris (61*b* shown in FIG. 6), and the like near the inner wall and an outer edge of the connection via 61*a* are washed away.

In some examples, step S62 may specifically include: the dielectric layer 61 is placed into a water tank, wherein the dielectric layer 61 is firstly subjected to ultrasonic cleaning to remove floating dust on a surface of the dielectric layer; the dielectric layer 61 is then immersed in a solution containing hydrofluoric acid for chemical corrosion, so that defects, such as microcrack areas Q1, stress concentration areas Q2 and the like, which are near the connection via 61*a* and in its inner wall on the dielectric layer 61 made of glass, Si or SOI, may be thoroughly removed through the chemical corrosion. A content of HF in the solution is approximately in a range of 1% to 20%, and $NH_4F$ may or may not be contained in the solution. When $NH_4F$ is contained, a content of $NH_4F$ is approximately in a range of 10 to 40%, a temperature of the solution is approximately in a range of 35° C. to 60° C., a duration for the chemical corrosion is approximately in a range of 30 seconds to 5 minutes. Then, the dielectric layer 61 is thoroughly washed by the pure deionized water, and finally, is dried by the air knife. The chemically corroded connection via 61*a* has smooth inner wall and surface and does not contain the defects, such as microcrack areas Q1, stress concentration areas Q2 and the like.

S63, forming a chemical plating medium 620 on the first surface and the second surface of the dielectric layer 61 provided with the connection via 61*a* after the step S62.

In some examples, step S63 may specifically include: placing the dielectric layer 61, in a spraying mode or directly, into a water tank containing a solution of the chemical plating medium 620, so that a layer of $Sn^{2+}$ is adsorbed on surfaces of the dielectric layer 61. The solution of the chemical plating medium 620 mainly contains $SnCl_2$ of 10 g/L to 30 g/L, concentrated hydrochloric acid (having a concentration of 38%) of 20 ml/L to 60 ml/L and deionized water. A less number of Sn particles are added into the solution to prevent the $Sn^{2+}$ from being oxidated. Then, the dielectric layer 61 is placed, in a spraying mode or directly, into a water tank containing an activation solution, so that surfaces of the dielectric layer 61 reacts with the activation solution (mainly containing $SnCl_2$ of 80 g/L to 120 g/L, concentrated hydrochloric acid of 300 ml/L to 500 ml/L, $Na_2SnO_3$ of 10 g/L to 20 g/L, $PdCl_2$ of 1 g/L to 4 g/L and deionized water), to generate metal palladium particles which are tightly attached to the surfaces of the dielectric layer 61. That is, the chemical plating medium 620 is formed on the first surface and the second surface of the dielectric layer 61 provided with the connection via 61*a*.

S64, after the step S63, performing a chemical plating process on the dielectric layer 61 with the chemical plating medium 620 to form metal films on the first surface and the second surface of the dielectric layer 61, and in the connection via 61*a*, and patterning the metal films formed on the first surface and the second surface of the dielectric layer 61, for forming a first extraction electrode 6201 and a second extraction electrode 6202, and a connection electrode 6203 in the connection via 61*a*.

In some examples, the chemically plated metal films may be a single-layer metal film or may be metal films stacked together. For example: only a Cu metal film is plated to form a single-layer metal film (having a thickness in a range of about 1 um to about 100 um). Alternatively, it is also possible to firstly plate a Ni metal film (having a thickness in a range of about 10 um to about 100 um), and then a Cu metal film (having a thickness in a range of about 1 um to about 100 um), wherein the Ni metal film is used to increase the adhesion of the Cu metal film. In the embodiment of the present disclosure, as an example, a material of the single-layer metal film is Cu, and a material of metal films stacked together is Ni/Cu, which does not limit the scope of the embodiment of the present disclosure. It will be described below by taking an example in which Ni/Cu metal films are chemically plated.

In some examples, step S64 may specifically include: placing the dielectric layer 61 into the chemical plating solution, and sequentially performing the chemical plating process with metal Ni and Cu. Then, the metal films formed on the first surface and the second surface of the dielectric layer 61 are patterned, for forming the first extraction electrode 6201 and the second extraction electrode 6202, and the connection electrode 6203 in the connection via 61*a*. The Ni solution for the chemical plating generally contains NiSO4·6H2O of 10 g/L to 30 g/L, NaH2PO4·2H2O 20 g/L to 40 g/L, Na-Citrate of 5 g/L to 15 g/L and $NH_4Cl$ of 20 g/L to 40 g/L, the solution is alkaline, has a PH in a range of 8.0 to 10.0 and a temperature in a range of 75° C. to 90° C. The Cu solution for the chemical plating generally contains KNaC4H4O6 of 30 g/L to 50 g/L, NaOH of 8 g/L to 10 g/L, Na2CO3 of 38 g/L to 40 g/L, CuSO4 of 10 g/L to 20 g/L, NiCl2 of 2 g/L to 6 g/L and formaldehyde of 40 ml/L to 60 ml/L with a concentration of 35%, the solution is alkaline, has a PH in a range of 11.0 to 14.0 and a temperature in a range of 55° C. to 65° C.

Example 7

Figure 7:
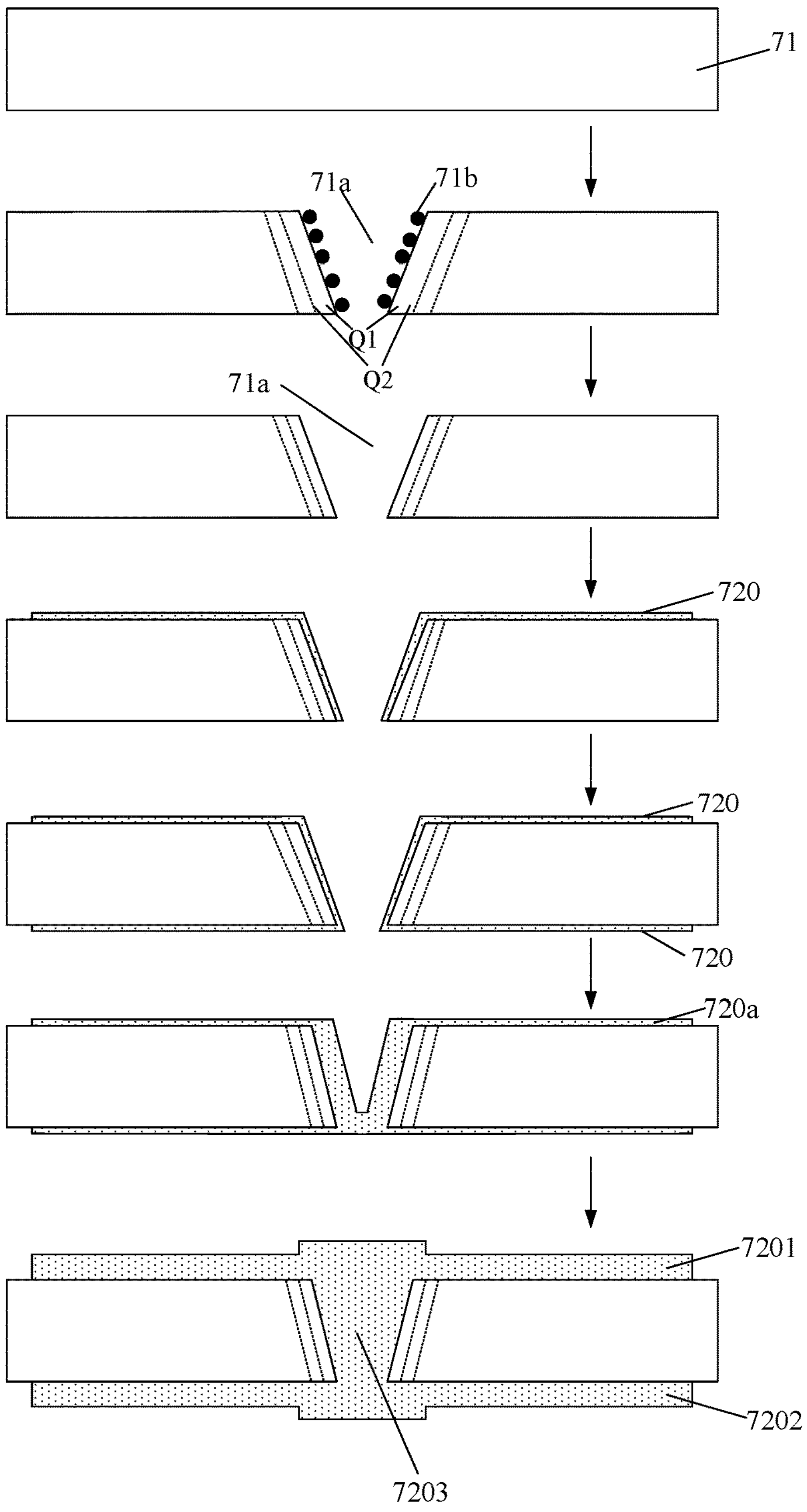
FIG. 7 is a flow chart of example 7 of a method for forming a conductive via according to an embodiment of the present disclosure.

FIG. 7 is a flow chart of example 7 of a method for forming a conductive via according to an embodiment of the present disclosure. As shown in FIG. 7, the formation method specifically includes steps of:

S71, preparing a dielectric layer 71, wherein a material of the dielectric layer 71 includes, but is not limited to, any one of glass, Si, SOI, GaAs, SiC, InP, PCB, $Al_2O_3$; forming a connection via 71*a* through a sand-blasting drilling process on the dielectric layer 71.

In some examples, step S71 may specifically include: forming high-speed injection beams through a sand-blasting process by using compressed air as power in combination with solid abrasive particles or liquid mixed with the solid abrasive particles, injecting the injection beams onto surfaces of the dielectric layer 71 at a high speed. The abrasive particles produce continuous cutting and impact on the surfaces of the dielectric layer 71, such that a via-shaped structure tapered from top to bottom may be formed by adjusting parameters, such as an air pressure, a beam injection angle, a beam track, a beam action time or the like. An inclination angle of the connection via 71*a* is approximately in a range of 15° to 45°. For example, the inclination angle of the connection via 71*a* is 30°. A diameter of a nozzle of a spray gun is in a range of about 10 um to about 50 um, a diameter of each abrasive particle is in a range of about 1 um to about 20 um, and abrasive particles may be selected from carborundum, corundum, calcium carbonate, quartz sand and the like. A thickness of the dielectric layer 71 is in a range of 0.1 mm to 2 mm, a diameter of an upper portion (on the second surface) of the connection via is in a range of about 0.5 mm to about 1.5 mm, and a diameter of a lower portion (on the first surface) of the connection via is in a range of about 0.3 mm to about 1.2 mm.

S72, cleaning the dielectric layer 71, after step S71, so that residues, debris (71*b* shown in FIG. 7), and the like near the inner wall and an outer edge of the connection via are washed away.

In some examples, step S72 may specifically include: placing the dielectric layer 71 into a water tank containing pure deionized water or a combination of the deionized water with a proper amount of cleaning agent (such as an oil-based cleaning agent or a water-based cleaning agent) at a temperature approximately in a range of 35° C. to 70° C., wherein the water is subjected to cavitation, acceleration and direct flow actions by means of ultrasonic waves (with a frequency approximately in a range of 10 kHz to 10 MHz), so that a pollutant layer is dispersed, emulsified and stripped to achieve the purpose of cleaning, wherein the cleaning time is approximately in a range of 2 to 20 minutes; and finally, washing the dielectric layer 71 by using the pure deionized water, and taking the dielectric layer 71 out of the water tank, and drying the dielectric layer 71 by using an air knife.

S73, forming metal films, as seed layers, within the connection via of the dielectric layer 71, and on the first surface and the second surface of the dielectric layer 71, after the step S72.

In some examples, step S73 may specifically include: depositing metal films with good conductivity, as seed layers, on the whole first surface and the whole second surface of the dielectric layer 71 through a process including, but being not limited to, a magnetron sputtering process. In addition to the magnetron sputtering process, the metal films may be formed through an electron beam evaporation process, an thermal evaporation process, or a pulsed laser sputtering process.

In some examples, a metal stack is generally used to increase the adhesion between the metal films 720 and the dielectric layer 71. That is, the metal films 720 include a first metal sub-layer and a second metal sub-layer sequentially arranged in a direction away from the dielectric layer. A material of the first metal sub-layer includes, but is not limited to, any one of titanium (Ti), molybdenum (Mo), and nickel (Ni), and a material of the second metal sub-layer includes, but is not limited to, any one of copper (Cu), silver (Ag), or gold (Au). For example, the metal films 720 include: any one of Ti/Cu, Mo/Cu, Ni/Cu, Ti/Ag, MWAg and Ni/Ag. In the embodiment of the present disclosure, a thickness of the first metal sub-layer is in a range of about 1 nm to about 100 nm; a thickness of the second metal sub-layer is in a range of about 50 nm to about 1000 nm. In addition, a thickness of the metal film on the inner wall of the connection via 71*a* is in a range of about 1 nm to about 200 nm.

S74, filling the connection via 71*a* through an electroplating process and thickening the metal films 720 formed on the first surface and the second surface, after the step S73, to form a first extraction electrode 7201 on the first surface and a second extraction electrode 7202 on the second surface, respectively, and a connection electrode 7203 within the connection via 71*a*.

In some examples, step S74 may specifically include: firstly, a via-filling electroplating process is performed in an electroplating bath through a reasonable combination of different types of electroplating solutions (such as a formula for filling the metal film into the connection via 71*a* and a formula for thickening the metal films on the whole surfaces), so that the metal film 720 (such as a first metal sub-layer in the metal film 720) is deposited on the inner wall of the connection via 71*a*, wherein an electroplating rate is in a range of 0.5 um/min to 5 um/min, and depending to an electroplating duration, the metal material may fully fill the connection via 71*a* (a thickness of the metal film is equal to 0.5 times of a diameter of the connection via 71*a*) or not fully fill the connection via 71*a*, only the inner wall of the connection via 71*a* is metallized (the thickness of the metal film is in a range of 500 nm to 10 um). That is, the connection electrode 7203 is formed. Then, the dielectric layer 71 is moved into the electroplating bath for the formula for thickening the metal films on the whole surfaces, to thicken the metal films 720 on the first surface and the second surface through an electroplating process, respectively, wherein the electroplating metal is Cu, Ag or Au, the electroplating rate is in a range of 0.5 um/min to 5 um/min, and depending to the electroplating duration, a thickness of each of the thickened metal films 720*a* is approximately in a range of 500 nm to 500 um. After the electroplating process, the surfaces of the dielectric layer 71 are generally undulated and uneven, which adversely affects subsequent processes. Thus, finally, a chemical mechanical polishing process is performed, such that the surfaces of the dielectric layer 71 become flat and smooth, thereby forming the first extraction electrode 7201 and the second extraction electrode 7202.

Alternatively, after the electroplating process, the thickened metal films 720*a* on the first surface and the second surface may be patterned, to form the first extraction electrode 7201 and the second extraction electrode 7202.

Example 8

Figure 8:
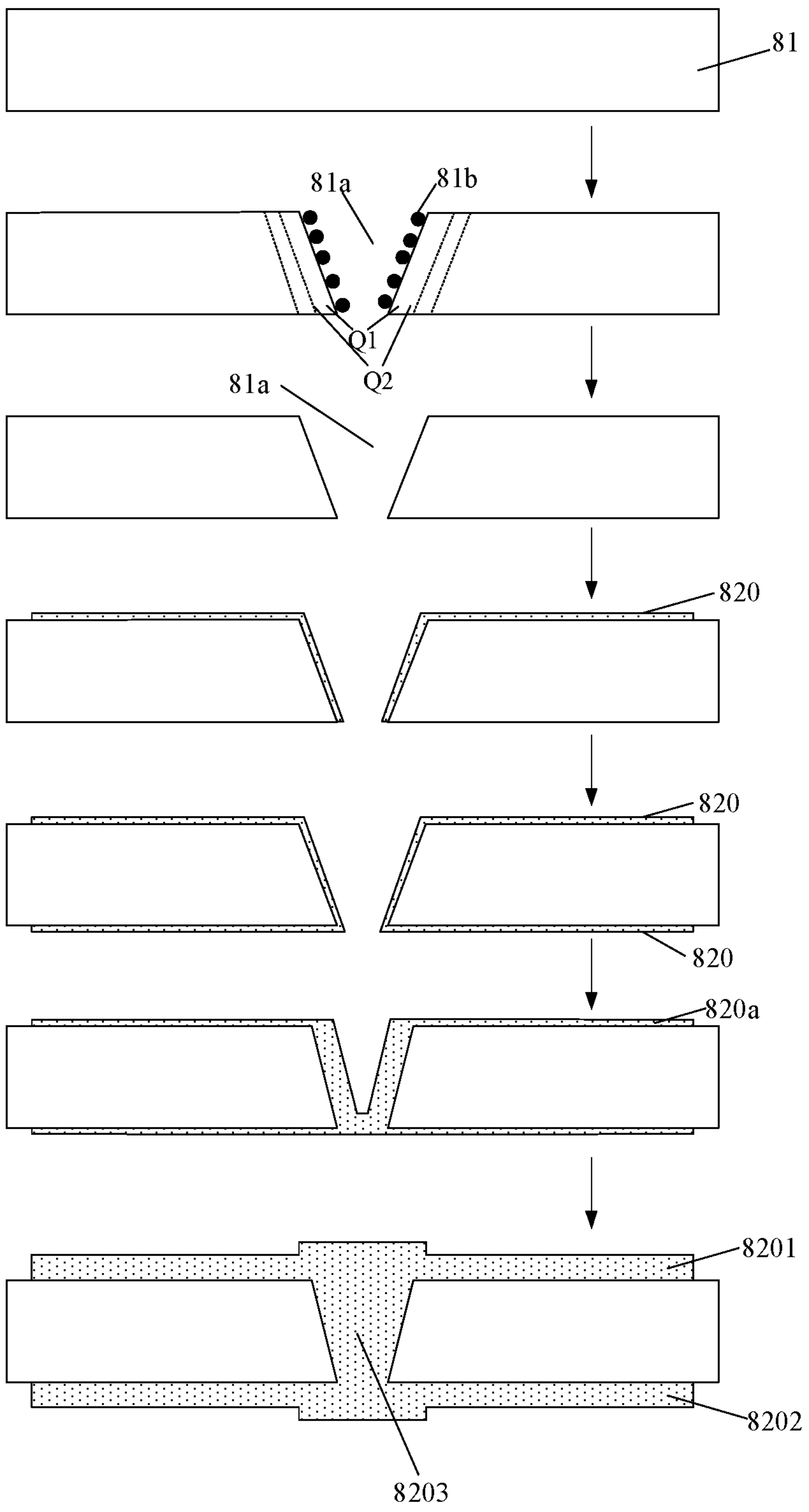
FIG. 8 is a flow chart of example 8 of a method for forming a conductive via according to an embodiment of the present disclosure.

FIG. 8 is a flow chart of example 8 of a method for forming a conductive via according to an embodiment of the present disclosure. As shown in FIG. 8, the formation method specifically includes steps of:

S81, preparing a dielectric layer 81, wherein a material of the dielectric layer 81 includes, but is not limited to, any one of glass, Si, SO, GaAs, SiC, InP, PCB, $Al_2O_3$; forming a connection via 81*a* through a sand-blasting drilling process on the dielectric layer 81.

In some examples, step S81 may specifically include: forming high-speed injection beams through a sand-blasting process by using compressed air as power in combination with solid abrasive particles or liquid mixed with the solid abrasive particles, injecting the injection beams onto surfaces of the dielectric layer 81 at a high speed. The abrasive particles produce continuous cutting and impact on the surfaces of the dielectric layer 81, such that a via-shaped structure tapered from top to bottom may be formed by adjusting parameters, such as an air pressure, a beam injection angle, a beam track, a beam action time or the like. An inclination angle of the connection via 81*a* is approximately in a range of 15° to 45°. For example, the inclination angle of the connection via 81*a* is 30°. A diameter of a nozzle of a spray gun is in a range of about 10 um to about 50 um, a diameter of each abrasive particle is in a range of about 1 um to about 20 um, and abrasive particles may be selected from carborundum, corundum, calcium carbonate, quartz sand and the like. A thickness of the dielectric layer 81 is in a range of 0.1 mm to 2 mm, a diameter of an upper portion (on the second surface) of the connection via Sla is in a range of about 0.5 mm to about 1.5 mm, and a diameter of a lower portion (on the first surface) of the connection via Sla is in a range of about 0.3 mm to about 1.2 mm.

S82, cleaning the dielectric layer 81, after step S81, so that residues, debris (81*b* shown in FIG. 8), and the like near the inner wall and an outer edge of the connection via 81*a* are washed away.

In some examples, step S82 may specifically include: the dielectric layer 81 is placed into a water tank, wherein the dielectric layer 81 is firstly subjected to ultrasonic cleaning to remove floating dust on a surface of the dielectric layer; the dielectric layer 81 is then immersed in a solution containing hydrofluoric acid for chemical corrosion, so that defects, such as microcrack areas Q1, stress concentration areas Q2 and the like, which are near the connection via 81*a* and in its inner wall on the dielectric layer 81 made of glass, Si or SO, may be thoroughly removed through the chemical corrosion. A content of HF in the solution is approximately in a range of 1% to 20%, and $NH_4F$ may or may not be contained in the solution. When $NH_4F$ is contained, a content of $NH_4F$ is approximately in a range of 10 to 40%, a temperature of the solution is approximately in a range of 35° C. to 60° C., a duration for the chemical corrosion is approximately in a range of 30 seconds to 5 minutes. Then, the dielectric layer 81 is thoroughly washed by the pure deionized water, and finally, is dried by the air knife. The chemically corroded connection via 81*a* has smooth inner wall and surface and does not contain the defects, such as microcrack areas Q1, stress concentration areas Q2 and the like, which is beneficial to the growth of seed layers with a high quality, the via-filling and the thickening with metal.

S83, forming metal films, as seed layers, within the connection via of the dielectric layer 81, and on the first surface and the second surface of the dielectric layer 81, after the step S82.

In some examples, step S83 may specifically include: depositing metal films with good conductivity, as seed layers, on the whole first surface and the whole second surface of the dielectric layer 81 through a process including, but being not limited to, a magnetron sputtering process. In addition to the magnetron sputtering process, the metal films may be formed through an electron beam evaporation process, a thermal evaporation process, or a pulsed laser sputtering process.

In some examples, a metal stack is generally used to increase the adhesion between the metal films 820 and the dielectric layer 81. That is, the metal films 820 include a first metal sub-layer and a second metal sub-layer sequentially arranged in a direction away from the dielectric layer. A material of the first metal sub-layer includes, but is not limited to, any one of titanium (Ti), molybdenum (Mo), and nickel (Ni), and a material of the second metal sub-layer includes, but is not limited to, any one of copper (Cu), silver (Ag), or gold (Au). For example, the metal films 820 include: any one of Ti/Cu, Mo/Cu, Ni/Cu, Ti/Ag, Mo/Ag and Ni/Ag. In the embodiment of the present disclosure, a thickness of the first metal sub-layer is in a range of about 1 nm to about 100 nm; a thickness of the second metal sub-layer is in a range of about 50 nm to about 1000 nm. In addition, a thickness of the metal film on the inner wall of the connection via 81*a* is in a range of about 1 nm to about 200 nm.

S84, filling the connection via 81*a* through an electroplating process and thickening the metal films 820 formed on the first surface and the second surface, after the step S83, to form a first extraction electrode 8201 on the first surface and a second extraction electrode 8202 on the second surface, respectively, and a connection electrode 8203 within the connection via 81*a*.

In some examples, step S94 may specifically include: firstly, a via-filling electroplating process is performed in an electroplating bath through a reasonable combination of different types of electroplating solutions (such as a formula for filling the metal film into the connection via 81*a* and a formula for thickening the metal films on the whole surfaces), so that the metal film 820 (such as a first metal sub-layer in the metal film 820) is deposited on the inner wall of the connection via 81*a*, wherein an electroplating rate is in a range of 0.5 um/min to 5 um/min, and depending to an electroplating duration, the metal material may fully fill the connection via Sla (a thickness of the metal film is equal to 0.5 times of a diameter of the connection via Sla) or not fully fill the connection via Sla, only the inner wall of the connection via Sla is metallized (the thickness of the metal film is in a range of 500 nm to 10 um). That is, the connection electrode 8203 is formed. Then, the dielectric layer 81 is moved into the electroplating bath for the formula for thickening the metal films on the whole surfaces, to thicken the metal films 820 on the first surface and the second surface through an electroplating process, respectively, wherein the electroplating metal is Cu, Ag or Au, the electroplating rate is in a range of 0.5 um/min to 5 um/min, and depending to the electroplating duration, a thickness of each of the thickened metal films 820*a* is approximately in a range of 500 nm to 500 um. After the electroplating process, the surfaces of the dielectric layer 81 are generally undulated and uneven, which adversely affects subsequent processes. Thus, finally, a chemical mechanical polishing process is performed, such that the surfaces of the dielectric layer 81 become flat and smooth, thereby forming the first extraction electrode 8201 and the second extraction electrode 8202.

Alternatively, after the electroplating process, the thickened metal films 820*a* on the first surface and the second surface may be patterned, to form the first extraction electrode 8201 and the second extraction electrode 8202.

Example 9

Figure 9:
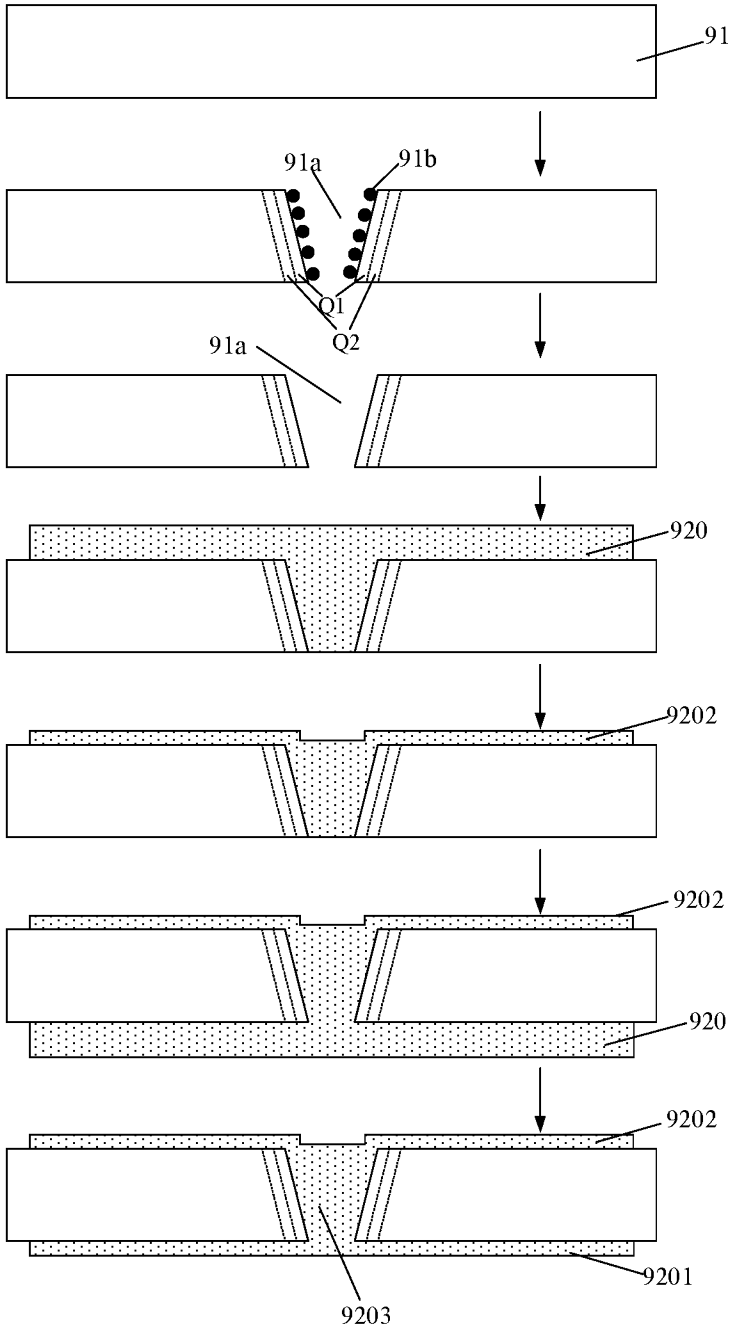
FIG. 9 is a flow chart of example 9 of a method for forming a conductive via according to an embodiment of the present disclosure.

FIG. 9 is a flow chart of example 9 of a method for forming a conductive via according to an embodiment of the present disclosure. As shown in FIG. 9, the formation method specifically includes steps of:

S91, preparing a dielectric layer 91, wherein a material of the dielectric layer 91 includes, but is not limited to, any one of glass, Si, SO, GaAs, SiC, InP, PCB, $Al_2O_3$; forming a connection via 91*a* through a sand-blasting drilling process on the dielectric layer 91.

In some examples, step S91 may specifically include: forming high-speed injection beams through a sand-blasting process by using compressed air as power in combination with solid abrasive particles or liquid mixed with the solid abrasive particles, injecting the injection beams onto surfaces of the dielectric layer 91 at a high speed. The abrasive particles produce continuous cutting and impact on the surfaces of the dielectric layer 91, such that a via-shaped structure tapered from top to bottom may be formed by adjusting parameters, such as an air pressure, a beam injection angle, a beam track, a beam action time or the like. An inclination angle of the connection via 91*a* is approximately in a range of 15° to 45°. For example, the inclination angle of the connection via 91*a* is 30°. A diameter of a nozzle of a spray gun is in a range of about 10 um to about 50 um, a diameter of each abrasive particle is in a range of about 1 um to about 20 um, and abrasive particles may be selected from carborundum, corundum, calcium carbonate, quartz sand and the like. A thickness of the dielectric layer 91 is in a range of 0.1 mm to 2 mm, a diameter of an upper portion (on the second surface) of the connection via 91*a* is in a range of about 0.5 mm to about 1.5 mm, and a diameter of a lower portion (on the first surface) of the connection via 91*a* is in a range of about 0.3 mm to about 1.2 mm.

S92, cleaning the dielectric layer 91, after step S91, so that residues, debris (91*b* shown in FIG. 9), and the like near the inner wall and an outer edge of the connection via 91*a* are washed away.

In some examples, step S92 may specifically include: placing the dielectric layer 91 into a water tank containing pure deionized water or a combination of the deionized water with a proper amount of cleaning agent (such as an oil-based cleaning agent or a water-based cleaning agent) at a temperature approximately in a range of 35° C. to 70° C., wherein the water is subjected to cavitation, acceleration and direct flow actions by means of ultrasonic waves (with a frequency approximately in a range of 10 kHz to 10 MHz), so that a pollutant layer is dispersed, emulsified and stripped to achieve the purpose of cleaning, wherein the cleaning time is approximately in a range of 2 to 20 minutes; and finally, washing the dielectric layer 91 by using the pure deionized water, and taking the dielectric layer 91 out of the water tank, and drying the dielectric layer 91 by using an air knife.

S93, after the step S92, applying a metal paste 920 into the connection via 91*a* of the dielectric layer 91, and forming the metal paste 920 on the first surface and the second surface of the dielectric layer 91; and then, curing the metal paste 920 on the first surface and the second surface, respectively, to form a connection electrode 9203 filled in the connection via 91*a*, a first extraction electrode 9201 on the first surface and a second extraction electrode 9202 on the second surface.

In some examples, the metal paste 920 may be a conductive paste. A material of the conductive paste includes, but is not limited to, a low-temperature curing type polymer conductive paste, and main components of the conductive paste include conductive particles, a resin, a curing agent, a dispersant, a diluent, an adhesion enhancer, and an anti-settling agent. The conductive particles may be selected from Cu, Ag and Au, and a size of each particle is approximately in a range of 1 nm to 100 um. The resin may be bisphenol epoxy resin. The curing agent may be acid anhydrides. The dispersant may be methylimidazole. The diluent may be butyl acetate. The adhesion enhancer may be tetraethyl titanate. The anti-settling agent may be polyamides.

Step S93 may specifically include: firstly, coating the conductive paste in the connection via 91*a* and around an edge of the connection via 91*a* on the second surface, and then, performing solvent drying and thermocuring processes on the second surface of the dielectric layer 91 to form the connection electrode 9203 filled in the connection via 91*a* and the second extraction electrode 9202 located on the second surface; then, coating the conductive paste around an edge of the connection via 91*a* on the first surface of the dielectric layer 91, and then, performing solvent drying and thermocuring processes on the first surface of the dielectric layer 91 to form the first extraction electrode 9201 located on the first surface. The preferred mode for coating the conductive paste includes, but is not limited to, screen printing, ink-jet printing, slit coating or the like. A vacuum adsorption machine is used in cooperation when the conductive paste is coated, so that the coating efficiency may be improved, and a distribution profile of the conductive paste on the wall and the edge of the connection via may be improved. The solvent drying process may be performed under an atmospheric pressure of air, an atmospheric pressure of N2 or the vacuum, at a temperature in a range of about 40° C. to about 95° C., for a duration in a range of about 1 min to about 30 min. The thermocuring process may be performed in an oven, under the atmosphere of N2, at a heating temperature in a range of about 140° C. to about 200° C. Alternatively, the curing process may be performed by means of illumination with laser beams, which have a wavelength in a range of about 500 nm to about 1510 nm, a laser power in a range of 50 mW to 50 W, and a beam diameter in a range of about 10 um to about 2000 um, and the laser beams may be a single beam or multiple beams.

Example 10

Figure 10:
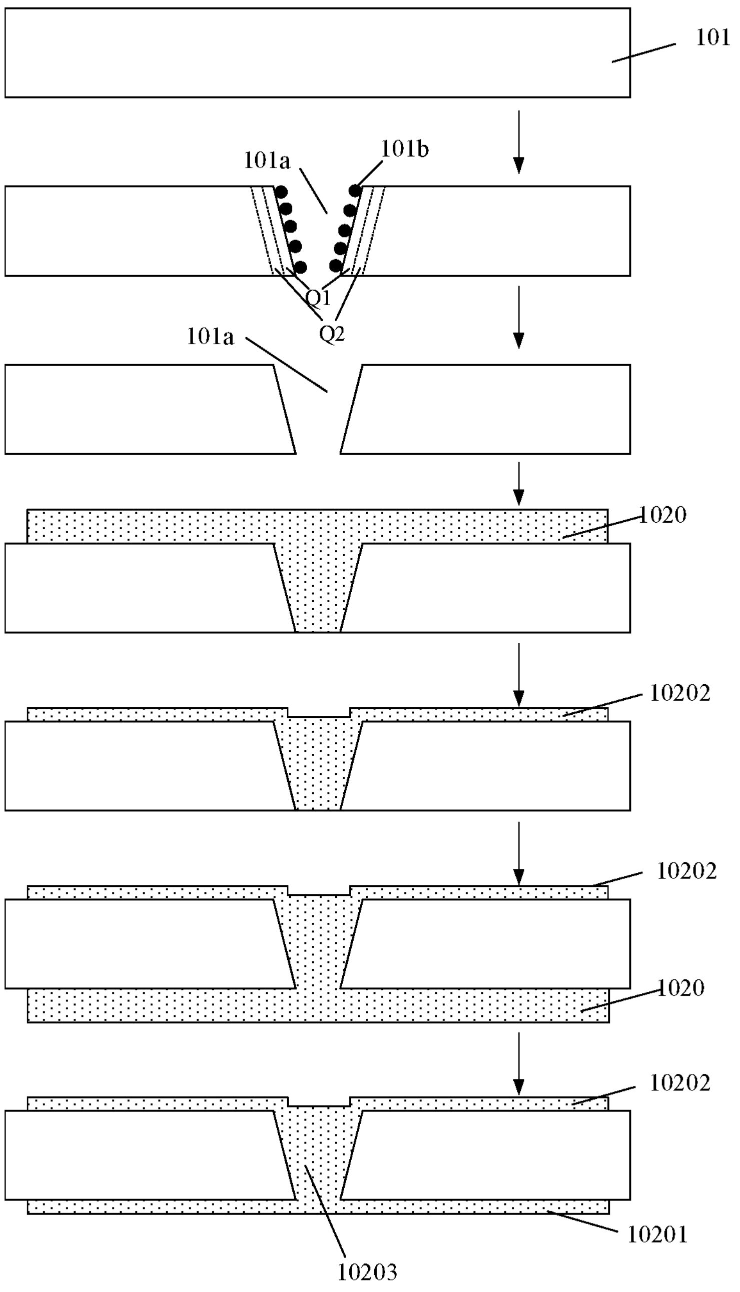
FIG. 10 is a flow chart of example 10 of a method for forming a conductive via according to an embodiment of the present disclosure.

FIG. 10 is a flow chart of example 10 of a method for forming a conductive via according to an embodiment of the present disclosure. As shown in FIG. 10, the formation method specifically includes steps of:

S101, preparing a dielectric layer 101, wherein a material of the dielectric layer 101 includes, but is not limited to, any one of glass, Si, SOI, GaAs, SiC, InP, PCB, $Al_2O_3$; forming a connection via 101*a* through a sand-blasting drilling process on the dielectric layer 101.

In some examples, step S101 may specifically include: forming high-speed injection beams through a sand-blasting process by using compressed air as power in combination with solid abrasive particles or liquid mixed with the solid abrasive particles, injecting the injection beams onto surfaces of the dielectric layer 101 at a high speed. The abrasive particles produce continuous cutting and impact on the surfaces of the dielectric layer 101, such that a via-shaped structure tapered from top to bottom may be formed by adjusting parameters, such as an air pressure, a beam injection angle, a beam track, a beam action time or the like. An inclination angle of the connection via 101*a* is approximately in a range of 15° to 45°. For example, the inclination angle of the connection via 101*a* is 30°. A diameter of a nozzle of a spray gun is in a range of about 10 um to about 50 um, a diameter of each abrasive particle is in a range of about 1 um to about 20 um, and abrasive particles may be selected from carborundum, corundum, calcium carbonate, quartz sand and the like. A thickness of the dielectric layer 101 is in a range of 0.1 mm to 2 mm, a diameter of an upper portion (on the second surface) of the connection via 101*a* is in a range of about 0.5 mm to about 1.5 mm, and a diameter of a lower portion (on the first surface) of the connection via 101*a* is in a range of about 0.3 mm to about 1.2 mm.

S102, cleaning the dielectric layer 101, after step S101, so that residues, debris (101*b* shown in FIG. 10), and the like near the inner wall and an outer edge of the connection via 101*a* are washed away.

In some examples, step S102 may specifically include: the dielectric layer 101 is placed into a water tank, wherein the dielectric layer 101 is firstly subjected to ultrasonic cleaning to remove floating dust on a surface of the dielectric layer; the dielectric layer 101 is then immersed in a solution containing hydrofluoric acid for chemical corrosion, so that defects, such as microcrack areas Q1, stress concentration areas Q2 and the like, which are near the connection via 101*a* and in its inner wall on the dielectric layer 101 made of glass, Si or SO, may be thoroughly removed through the chemical corrosion. A content of HF in the solution is approximately in a range of 1% to 20%, and $NH_4F$ may or may not be contained in the solution. When $NH_4F$ is contained, a content of $NH_4F$ is approximately in a range of 10 to 40%, a temperature of the solution is approximately in a range of 35° C. to 60° C., a duration for the chemical corrosion is approximately in a range of 30 seconds to 5 minutes. Then, the dielectric layer 101 is thoroughly washed by the pure deionized water, and finally, is dried by the air knife. The chemically corroded connection via 101*a* has smooth inner wall and surface and does not contain the defects, such as microcrack areas Q1, stress concentration areas Q2 and the like, which is beneficial to the growth of seed layers with a high quality, the via-filling and the thickening with metal.

S103, after the step S102, applying a metal paste into the connection via 101*a* of the dielectric layer 101, and forming the metal paste on the first surface and the second surface of the dielectric layer 101; and then, curing the metal paste on the first surface and the second surface, respectively, to form a connection electrode 10203 filled in the connection via 101*a*, a first extraction electrode 10201 on the first surface and a second extraction electrode 10202 on the second surface.

In some examples, the metal paste may be a conductive paste. A material of the conductive paste includes, but is not limited to, a low-temperature curing type polymer conductive paste, and main components of the conductive paste include conductive particles, a resin, a curing agent, a dispersant, a diluent, an adhesion enhancer, and an anti-settling agent. The conductive particles may be selected from Cu, Ag and Au, and a size of each particle is approximately in a range of 1 nm to 100 um. The resin may be bisphenol epoxy resin. The curing agent may be acid anhydrides. The dispersant may be methylimidazole. The diluent may be butyl acetate. The adhesion enhancer may be tetraethyl titanate. The anti-settling agent may be polyamides.

Step S103 may specifically include: firstly, coating the conductive paste in the connection via 101*a* and around an edge of the connection via 101*a* on the second surface, and then, performing solvent drying and thermocuring processes on the second surface of the dielectric layer 101 to form the connection electrode 10203 filled in the connection via 101*a* and the second extraction electrode 10202 located on the second surface; then, coating the conductive paste around an edge of the connection via 101*a* on the first surface of the dielectric layer 101, and then, performing solvent drying and thermocuring processes on the first surface of the dielectric layer 101 to form the first extraction electrode 10201 located on the first surface. The preferred mode for coating the conductive paste includes, but is not limited to, screen printing, ink-jet printing, slit coating or the like. A vacuum adsorption machine is used in cooperation when the conductive paste is coated, so that the coating efficiency may be improved, and a distribution profile of the conductive paste on the wall and the edge of the connection via may be improved. The solvent drying process may be performed under an atmospheric pressure of air, an atmospheric pressure of N2 or the vacuum, at a temperature in a range of about 40° C. to about 95° C., for a duration in a range of about 1 min to about 30 min. The thermocuring process may be performed in an oven, under the atmosphere of N2, at a heating temperature in a range of about 140° C. to about 200° C. Alternatively, the curing process may be performed by means of illumination with laser beams, which have a wavelength in a range of about 500 nm to about 1510 nm, a laser power in a range of 50 mW to 50 W, and a beam diameter in a range of about 10 um to about 2000 um, and the laser beams may be a single beam or multiple beams.

Example 11

Figure 11:
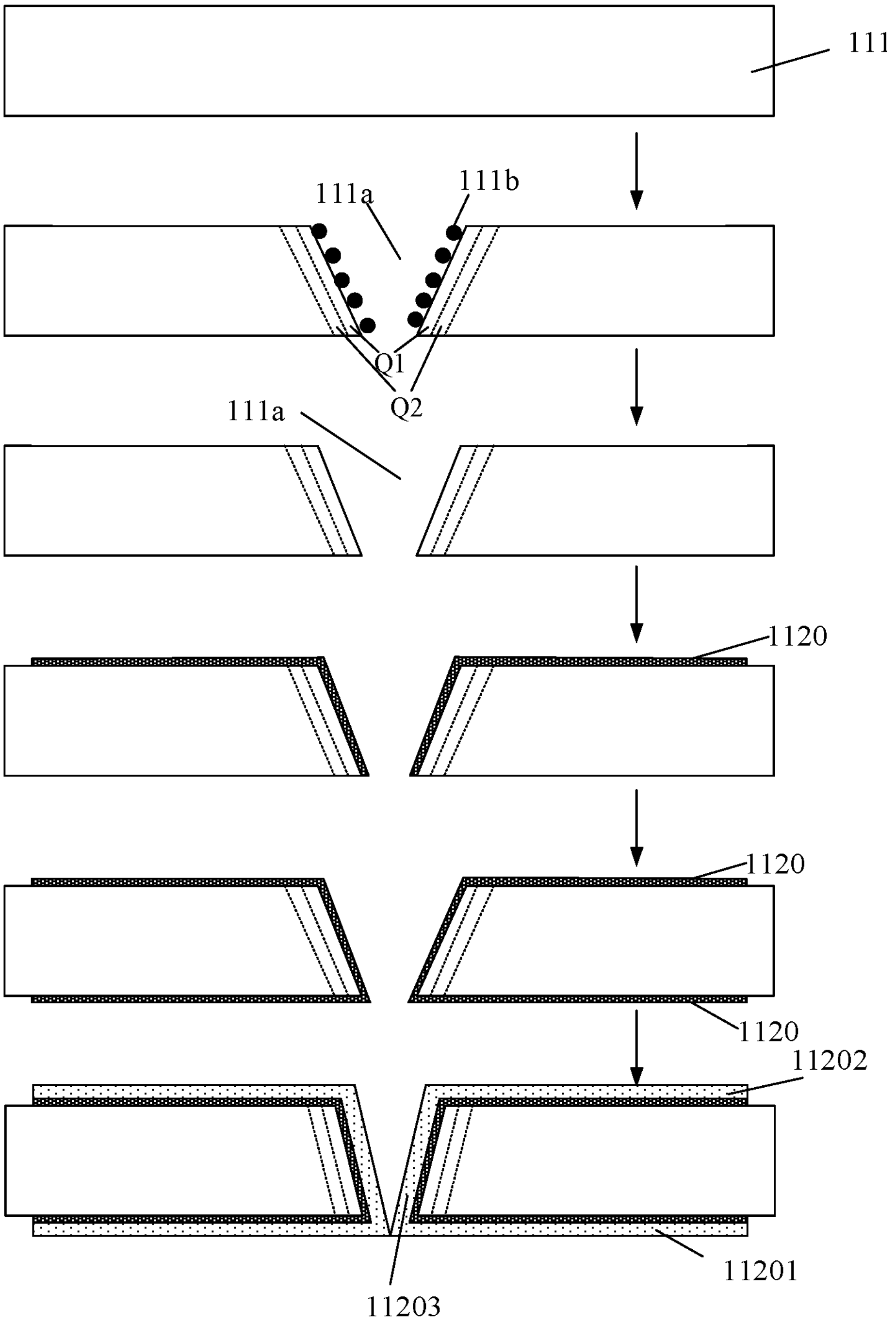
FIG. 11 is a flow chart of example 11 of a method for forming a conductive via according to an embodiment of the present disclosure.

FIG. 11 is a flow chart of example 11 of a method for forming a conductive via according to an embodiment of the present disclosure. As shown in FIG. 11, the formation method specifically includes steps of:

S111, preparing a dielectric layer 111, wherein a material of the dielectric layer 111 includes, but is not limited to, any one of glass, Si, SOI, GaAs, SiC, InP, PCB, $Al_2O_3$; forming a connection via 111*a* through a sand-blasting drilling process on the dielectric layer 111.

In some examples, step S111 may specifically include: forming high-speed injection beams through a sand-blasting process by using compressed air as power in combination with solid abrasive particles or liquid mixed with the solid abrasive particles, injecting the injection beams onto surfaces of the dielectric layer 111 at a high speed. The abrasive particles produce continuous cutting and impact on the surfaces of the dielectric layer 111, such that a via-shaped structure tapered from top to bottom may be formed by adjusting parameters, such as an air pressure, a beam injection angle, a beam track, a beam action time or the like. An inclination angle of the connection via 111*a* is approximately in a range of 15° to 45°. For example, the inclination angle of the connection via 111*a* is 30°. A diameter of a nozzle of a spray gun is in a range of about 10 um to about 50 um, a diameter of each abrasive particle is in a range of about 1 um to about 20 um, and abrasive particles may be selected from carborundum, corundum, calcium carbonate, quartz sand and the like. A thickness of the dielectric layer 111 is in a range of 0.1 mm to 2 mm, a diameter of an upper portion (on the second surface) of the connection via 111*a* is in a range of about 0.5 mm to about 1.5 mm, and a diameter of a lower portion (on the first surface) of the connection via 111*a* is in a range of about 0.3 mm to about 1.2 mm.

S112, cleaning the dielectric layer 111, after step S111, so that residues, debris (111*b* shown in FIG. 11), and the like near the inner wall and an outer edge of the connection via 111*a* are washed away.

In some examples, step S112 may specifically include: placing the dielectric layer 111 into a water tank containing pure deionized water or a combination of the deionized water with a proper amount of cleaning agent (such as an oil-based cleaning agent or a water-based cleaning agent) at a temperature approximately in a range of 35° C. to 70° C., wherein the water is subjected to cavitation, acceleration and direct flow actions by means of ultrasonic waves (with a frequency approximately in a range of 10 kHz to 10 MHz), so that a pollutant layer is dispersed, emulsified and stripped to achieve the purpose of cleaning, wherein the cleaning time is approximately in a range of 2 to 20 minutes; and finally, washing the dielectric layer 111 by using the pure deionized water, and taking the dielectric layer 111 out of the water tank, and drying the dielectric layer 111 by using an air knife.

S113, forming a chemical plating medium 1120 on the first surface and the second surface of the dielectric layer 111 provided with the connection via 111*a* after the step S112.

In some examples, step S113 may specifically include: placing the dielectric layer 111, in a spraying mode or directly, into a water tank containing a solution of the chemical plating medium 1120, so that a layer of $Sn^{2+}$ is adsorbed on surfaces of the dielectric layer 111. The solution of the chemical plating medium 1120 mainly contains $SnCl_2$ of 10 g/L to 30 g/L, concentrated hydrochloric acid (having a concentration of 38%) of 20 ml/L to 60 ml/L and deionized water. A less number of Sn particles are added into the solution to prevent the $Sn^{2+}$ from being oxidated. Then, the dielectric layer 111 is placed, in a spraying mode or directly, into a water tank containing an activation solution, so that surfaces of the dielectric layer III reacts with the activation solution (mainly containing $SnCl_2$ of 80 g/L to 120 g/L, concentrated hydrochloric acid of 300 ml/L to 500 ml/L, $Na_2SnO_3$ of 10 g/L to 20 g/L, $PdCl_2$ of 1 g/L to 4 g/L and deionized water), to generate metal palladium particles which are tightly attached to the surfaces of the dielectric layer 111. That is, the chemical plating medium 1120 is formed on the first surface and the second surface of the dielectric layer III provided with the connection via 111*a*.

S114, after the step S113, performing a chemical plating process on the dielectric layer III with the chemical plating medium 1120 to form metal films on the first surface and the second surface of the dielectric layer 111, and in the connection via 111*a*, and patterning the metal films formed on the first surface and the second surface of the dielectric layer 111, for forming a first extraction electrode 11201 and a second extraction electrode 11202, and a connection electrode 11203 in the connection via 111*a*.

In some examples, the chemically plated metal films may be a single-layer metal film or may be metal films stacked together. For example: only a Cu metal film is plated to form a single-layer metal film (having a thickness in a range of about 1 um to about 100 um). Alternatively, it is also possible to firstly plate a Ni metal film (having a thickness in a range of about 10 um to about 100 um), and then a Cu metal film (having a thickness in a range of about 1 um to about 100 um), wherein the Ni metal film is used to increase the adhesion of the Cu metal film. In the embodiment of the present disclosure, as an example, a material of the single-layer metal film is Cu, and a material of metal films stacked together is Ni/Cu, which does not limit the scope of the embodiment of the present disclosure. It will be described below by taking an example in which Ni/Cu metal films are chemically plated.

In some examples, step S114 may specifically include: placing the dielectric layer III into the chemical plating solution, and sequentially performing the chemical plating process with metal Ni and Cu. Then, the metal films formed on the first surface and the second surface of the dielectric layer III are patterned, for forming the first extraction electrode 11201 and the second extraction electrode 11202, and the connection electrode 11203 in the connection via 111*a*. The Ni solution for the chemical plating generally contains NiSO4·6H2O of 10 g/L to 30 g/L, NaH2PO4·2H2O 20 g/L to 40 g/L, Na-Citrate of 5 g/L to 15 g/L and NH4Cl of 20 g/L to 40 g/L, the solution is alkaline, has a PH in a range of 8.0 to 10.0 and a temperature in a range of 75° C. to 90° C. The Cu solution for the chemical plating generally contains KNaC4H4O6 of 30 g/L to 50 g/L, NaOH of 8 g/L to 10 g/L, Na2CO3 of 38 g/L to 40 g/L, CuSO4 of 10 g/L to 20 g/L, NiCl2 of 2 g/L to 6 g/L and formaldehyde of 40 ml/L to 60 ml/L with a concentration of 35%, the solution is alkaline, has a PH in a range of 11.0 to 14.0 and a temperature in a range of 55° C. to 65° C.

Example 12

Figure 12:
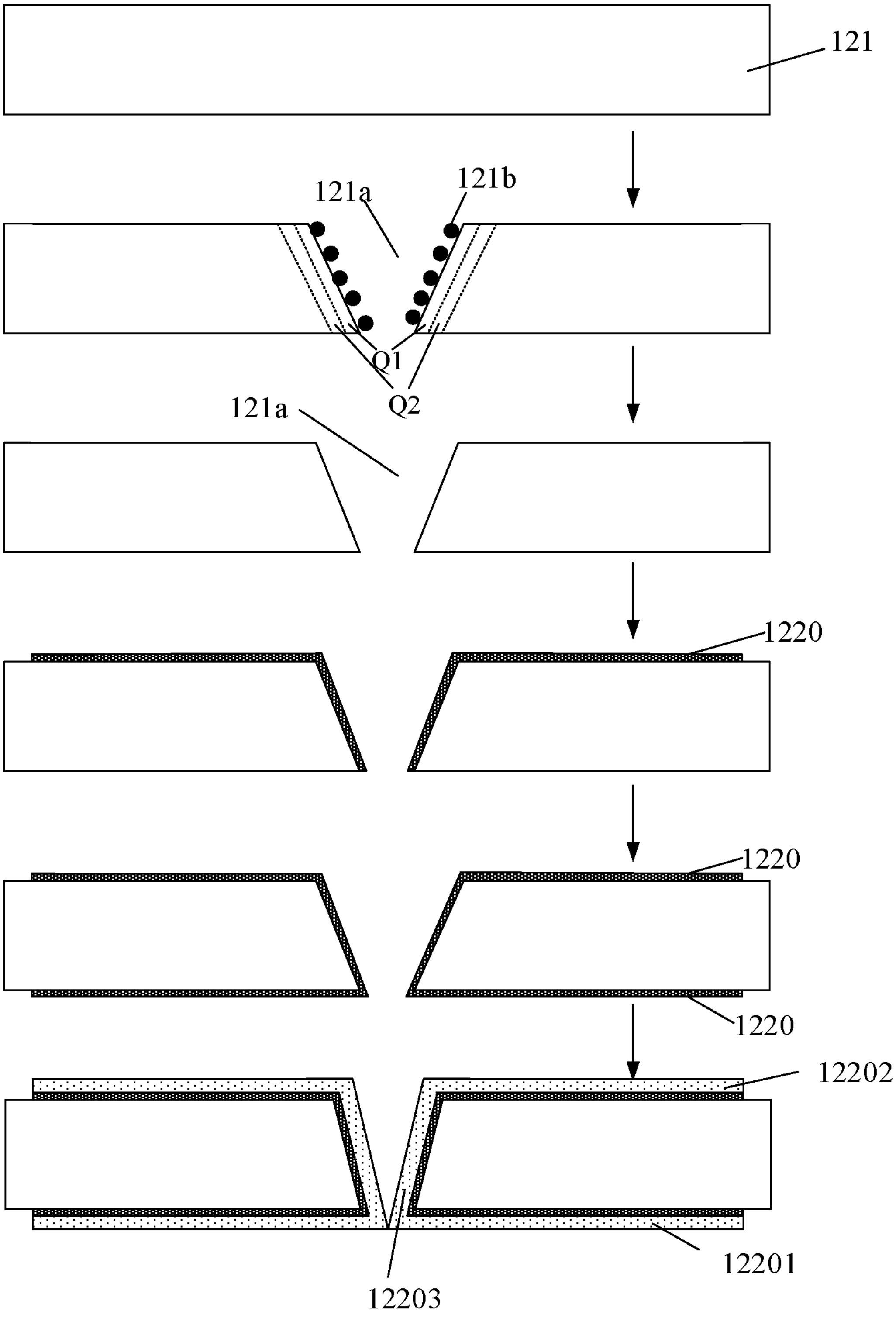
FIG. 12 is a flow chart of example 12 of a method for forming a conductive via according to an embodiment of the present disclosure.

FIG. 12 is a flow chart of example 12 of a method for forming a conductive via according to an embodiment of the present disclosure. As shown in FIG. 12, the formation method specifically includes steps of:

S121, preparing a dielectric layer 121, wherein a material of the dielectric layer 121 includes, but is not limited to, any one of glass, Si, SOI, GaAs, SiC, InP, PCB, $Al_2O_3$; forming a connection via 121*a* through a sand-blasting drilling process on the dielectric layer 121.

In some examples, step S121 may specifically include: forming high-speed injection beams through a sand-blasting process by using compressed air as power in combination with solid abrasive particles or liquid mixed with the solid abrasive particles, injecting the injection beams onto surfaces of the dielectric layer 121 at a high speed. The abrasive particles produce continuous cutting and impact on the surfaces of the dielectric layer 121, such that a via-shaped structure tapered from top to bottom may be formed by adjusting parameters, such as an air pressure, a beam injection angle, a beam track, a beam action time or the like. An inclination angle of the connection via 121*a* is approximately in a range of 15° to 45°. For example, the inclination angle of the connection via 121*a* is 30°. A diameter of a nozzle of a spray gun is in a range of about 10 um to about 50 um, a diameter of each abrasive particle is in a range of about 1 um to about 20 um, and abrasive particles may be selected from carborundum, corundum, calcium carbonate, quartz sand and the like. A thickness of the dielectric layer 121 is in a range of 0.1 mm to 2 mm, a diameter of an upper portion (on the second surface) of the connection via 121*a* is in a range of about 0.5 mm to about 1.5 mm, and a diameter of a lower portion (on the first surface) of the connection via 121*a* is in a range of about 0.3 mm to about 1.2 mm.

S122, cleaning the dielectric layer 121, after step S121, so that residues, debris (121*b* shown in FIG. 12), and the like near the inner wall and an outer edge of the connection via 121*a* are washed away.

In some examples, step S122 may specifically include: the dielectric layer 121 is placed into a water tank, wherein the dielectric layer 121 is firstly subjected to ultrasonic cleaning to remove floating dust on a surface of the dielectric layer; the dielectric layer 121 is then immersed in a solution containing hydrofluoric acid for chemical corrosion, so that defects, such as microcrack areas Q1, stress concentration areas Q2 and the like, which are near the connection via 121*a* and in its inner wall on the dielectric layer 121 made of glass, Si or SOL, may be thoroughly removed through the chemical corrosion. A content of HF in the solution is approximately in a range of 1% to 20%, and $NH_4F$ may or may not be contained in the solution. When $NH_4F$ is contained, a content of $NH_4F$ is approximately in a range of 10 to 40%, a temperature of the solution is approximately in a range of 35° C. to 60° C., a duration for the chemical corrosion is approximately in a range of 30 seconds to 5 minutes. Then, the dielectric layer 121 is thoroughly washed by the pure deionized water, and finally, is dried by the air knife. The chemically corroded connection via 121*a* has smooth inner wall and surface and does not contain the defects, such as microcrack areas Q1, stress concentration areas Q2 and the like.

S123, forming a chemical plating medium 1220 on the first surface and the second surface of the dielectric layer 121 provided with the connection via 121*a* after the step S122.

In some examples, step S123 may specifically include: placing the dielectric layer 121, in a spraying mode or directly, into a water tank containing a solution of the chemical plating medium 1220, so that a layer of $Sn^{2+}$ is adsorbed on surfaces of the dielectric layer 121. The solution of the chemical plating medium 1220 mainly contains $SnCl_2$ of 10 g/L to 30 g/L, concentrated hydrochloric acid (having a concentration of 38%) of 20 ml/L to 60 ml/L and deionized water. A less number of Sn particles are added into the solution to prevent the $Sn^{2+}$ from being oxidated. Then, the dielectric layer 121 is placed, in a spraying mode or directly, into a water tank containing an activation solution, so that surfaces of the dielectric layer 121 reacts with the activation solution (mainly containing $SnCl_2$ of 80 g/L to 120 g/L, concentrated hydrochloric acid of 300 ml/L to 500 ml/L, $Na_2SnO_3$ of 10 g/L to 20 g/L, $PdCl_2$ of 1 g/L to 4 g/L and deionized water), to generate metal palladium particles which are tightly attached to the surfaces of the dielectric layer 121. That is, the chemical plating medium 1220 is formed on the first surface and the second surface of the dielectric layer 121 provided with the connection via 121*a*.

S124, after the step S123, performing a chemical plating process on the dielectric layer 121 with the chemical plating medium 1220 to form metal films on the the first surface, the second surface of the dielectric layer 121, and in the connection via 121*a*, and patterning the metal films formed on the first surface and the second surface of the dielectric layer 121, for forming a first extraction electrode 12201 and a second extraction electrode 12202, and a connection electrode 12203 in the connection via 121*a*.

In some examples, the chemically plated metal films may be a single-layer metal film or may be metal films stacked together. For example: only a Cu metal film is plated to form a single-layer metal film (having a thickness in a range of about 1 um to about 100 um). Alternatively, it is also possible to firstly plate a Ni metal film (having a thickness in a range of about 10 um to about 100 um), and then a Cu metal film (having a thickness in a range of about 1 um to about 100 um), wherein the Ni metal film is used to increase the adhesion of the Cu metal film. In the embodiment of the present disclosure, as an example, a material of the single-layer metal film is Cu, and a material of metal films stacked together is Ni/Cu, which does not limit the scope of the embodiment of the present disclosure. It will be described below by taking an example in which Ni/Cu metal films are chemically plated.

In some examples, step S124 may specifically include: placing the dielectric layer 121 into the chemical plating solution, and sequentially performing the chemical plating process with metal Ni and Cu. Then, the metal films formed on the first surface and the second surface of the dielectric layer 121 are patterned, for forming the first extraction electrode 12201 and the second extraction electrode 12202, and the connection electrode 12203 in the connection via 121*a*. The Ni solution for the chemical plating generally contains NiSO4·6H2O of 10 g/L to 30 g/L, NaH2PO4·2H2O 20 g/L to 40 g/L, Na-Citrate of 5 g/L to 15 g/L and $NH_4Cl$ of 20 g/L to 40 g/L, the solution is alkaline, has a PH in a range of 8.0 to 10.0 and a temperature in a range of 75° C. to 90° C. The Cu solution for the chemical plating generally contains KNaC4H406 of 30 g/L to 50 g/L, NaOH of 8 g/L to 10 g/L, Na2CO3 of 38 g/L to 40 g/L, CuSO4 of 10 g/L to 20 g/L, NiCl2 of 2 g/L to 6 g/L and formaldehyde of 40 ml/L to 60 ml/L with a concentration of 35%, the solution is alkaline, has a PH in a range of 11.0 to 14.0 and a temperature in a range of 55° C. to 65° C.

Example 13

Figure 13:
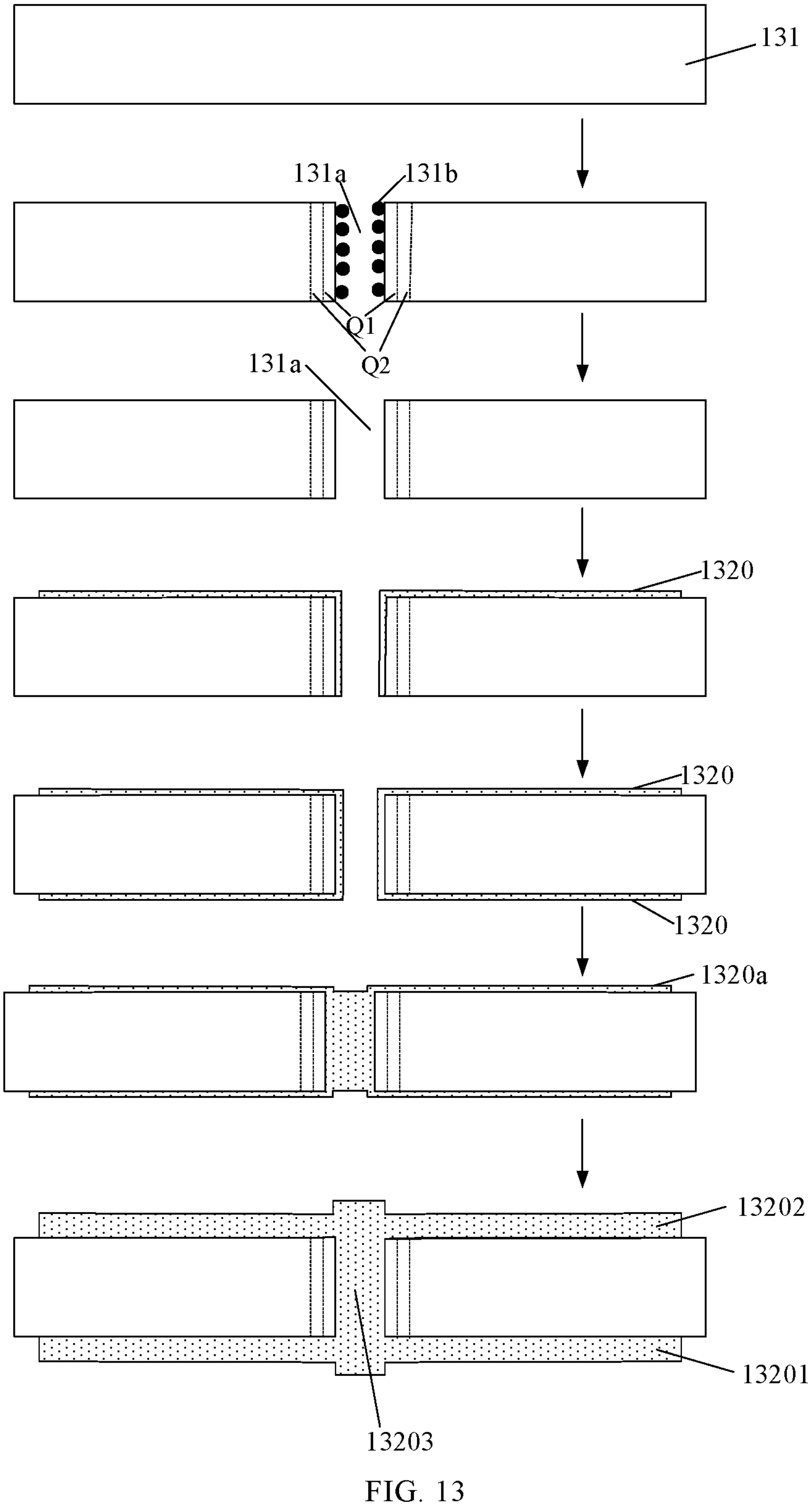
FIG. 13 is a flow chart of example 13 of a method for forming a conductive via according to an embodiment of the present disclosure.

FIG. 13 is a flow chart of example 13 of a method for forming a conductive via according to an embodiment of the present disclosure. As shown in FIG. 13, the formation method specifically includes steps of:

S131, preparing a dielectric layer 131, wherein a material of the dielectric layer 131 includes, but is not limited to, any one of glass, Si, SOI, GaAs, SiC, InP, PCB, $Al_2O_3$; forming a connection via 131*a* through a laser drilling process on the dielectric layer 131.

In some examples, step S131 may specifically include: vertically irradiating a laser onto a surface (a first surface or a second surface) of the dielectric layer 131 by means of a laser device. When the laser interacts with the dielectric layer 131, atoms forming the dielectric layer 131 are ionized and projected out of the surface of the dielectric layer 131 due to higher photon energy of the laser, and the drilled via is gradually deepened along with time, until the whole dielectric layer 131 is penetrated. That is, the connection via 131*a* is formed. An inclination angle of the connection via 131*a* is approximately in a range of 0° to 5°. For example, the inclination angle of the connection via 131*a* is 5°. That is, the connection via 131*a* has a shape like a cylinder or a truncated cone, an inverted truncated cone. Generally, the laser has a wavelength selected from 532 nm, 355 nm, 266 nm, 248 nm, 197 nm or the like, the laser may have a pulse width selected from 1 fs to 100 fs, 1 ps to 100 ps, 1 ns to 100 ns or the like, and a type of the laser device may be selected from a continuous laser device, a pulse laser device or the like. The laser drilling includes the following two modes: when a diameter of a light spot is large, a relative position between a laser beam and the dielectric layer 131 is fixed, the dielectric layer 131 is directly penetrated by means of the high energy, such that a shape of the connection via 131*a* is the inverted truncated cone, and diameters of the connection via are gradually reduced from top to bottom (along a propagation direction of the laser). The diameter of the connection via 131*a* on the second surface is in a range of about 80 um to about 120 um, and the diameter of the connection via 131*a* on the first surface is in a range of about 60 um to about 100 um. The other mode of the laser drilling is: when the diameter of the light spot is small, the laser beam moves (scans) in circles on the dielectric layer 131. Specifically, a focal point of the light spot is constantly changed, a depth of the focal point is constantly changed, the laser beam moves in a spiral line from a lower surface of the dielectric layer 131 to an upper surface of the dielectric layer 131, and radiuses of the spiral line are gradually reduced from the lower surface to the upper surface. In this way, a portion of the dielectric layer 131 is obtained through the laser cut and is truncated cone shaped, and falls down due to the gravity, thereby forming the connection via 131*a* which is truncated cone shaped. The diameter of the connection via 131*a* on the second surface is in a range of about 100 um to about 1000 um, and the diameter of the connection via 131*a* on the first surface is in a range of about 150 um to about 1500 um.

S132, cleaning the dielectric layer 131, after step S131, so that residues, debris, and the like near the inner wall and an outer edge of the connection via 131*a* are washed away.

In some examples, step S132 may specifically include: placing the dielectric layer 131 into a water tank containing pure deionized water or a combination of the deionized water with a proper amount of cleaning agent (such as an oil-based cleaning agent or a water-based cleaning agent) at a temperature approximately in a range of 35° C. to 70° C., wherein the water is subjected to cavitation, acceleration and direct flow actions by means of ultrasonic waves (with a frequency approximately in a range of 10 kHz to 10 MHz), so that a pollutant layer is dispersed, emulsified and stripped to achieve the purpose of cleaning, wherein the cleaning time is approximately in a range of 2 to 20 minutes; and finally, washing the dielectric layer 131 by using the pure deionized water, and taking the dielectric layer 11 out of the water tank, and drying the dielectric layer 11 by using an air knife.

S133, forming metal films 1320, as seed layers, within the connection via 131*a* of the dielectric layer 131, and on the first surface and the second surface of the dielectric layer 131, after the step S132.

In some examples, step S133 may specifically include: depositing metal films 1320 with good conductivity, as seed layers, on the whole first surface and the whole second surface of the dielectric layer 131 through a process including, but being not limited to, a magnetron sputtering process. In addition to the magnetron sputtering process, the metal films 1320 may be formed through an electron beam evaporation process, an thermal evaporation process, or a pulsed laser sputtering process.

In some examples, a metal stack is generally used to increase the adhesion between the metal films and the dielectric layer 131. That is, the metal films include a first metal sub-layer and a second metal sub-layer sequentially arranged in a direction away from the dielectric layer 131. A material of the first metal sub-layer includes, but is not limited to, any one of titanium (Ti), molybdenum (Mo), and nickel (Ni), and a material of the second metal sub-layer includes, but is not limited to, any one of copper (Cu), silver (Ag), or gold (Au). For example, the metal films include: any one of Ti/Cu, Mo/Cu, Ni/Cu, Ti/Ag, MWAg and Ni/Ag. In the embodiment of the present disclosure, a thickness of the first metal sub-layer is in a range of about 1 nm to about 100 nm; a thickness of the second metal sub-layer is in a range of about 50 nm to about 1000 nm. In addition, a thickness of the metal film on the inner wall of the connection via 131*a* is in a range of about 1 nm to about 200 nm.

S134, filling the connection via 131*a* through an electroplating process and thickening the metal films 1320 formed on the first surface and the second surface, after the step S133, to form a first extraction electrode 13201 on the first surface and a second extraction electrode 13202 on the second surface, respectively, and a connection electrode 13203 within the connection via 131*a*.

In some examples, step S134 may specifically include: firstly, a via-filling electroplating process is performed in an electroplating bath through a reasonable combination of different types of electroplating solutions (such as a formula for filling the metal film into the connection via 131*a* and a formula for thickening the metal films on the whole surfaces), so that the metal film 1320 (such as a first metal sub-layer in the metal film 1320) is deposited on the inner wall of the connection via 131*a*, wherein an electroplating rate is in a range of 0.5 um/min to 5 um/min, and depending to an electroplating duration, the metal material may fully fill the connection via 131*a* (a thickness of the metal film is equal to 0.5 times of a diameter of the connection via 131*a*) or not fully fill the connection via 131*a*, only the inner wall of the connection via 131*a* is metallized (the thickness of the metal film is in a range of 500 nm to 10 um). That is, the connection electrode 13203 is formed. Then, the dielectric layer 131 is moved into the electroplating bath for the formula for thickening the metal films on the whole surfaces, to thicken the metal films 1320 on the first surface and the second surface through an electroplating process, respectively, wherein the electroplating metal is Cu, Ag or Au, the electroplating rate is in a range of 0.5 um/min to 5 um/min, and depending to the electroplating duration, a thickness of each of the thickened metal films 1320*a* is approximatively in a range of 500 nm to 500 um. After the electroplating process, the surfaces of the dielectric layer 131 are generally undulated and uneven, which adversely affects subsequent processes. Thus, finally, a chemical mechanical polishing process is performed, such that the surfaces of the dielectric layer 131 become flat and smooth, thereby forming the first extraction electrode 13201 and the second extraction electrode 13202.

Alternatively, after the electroplating process, the thickened metal films 1320*a* on the first surface and the second surface may be patterned, to form the first extraction electrode 13201 and the second extraction electrode 13202.

Example 14

Figure 14:
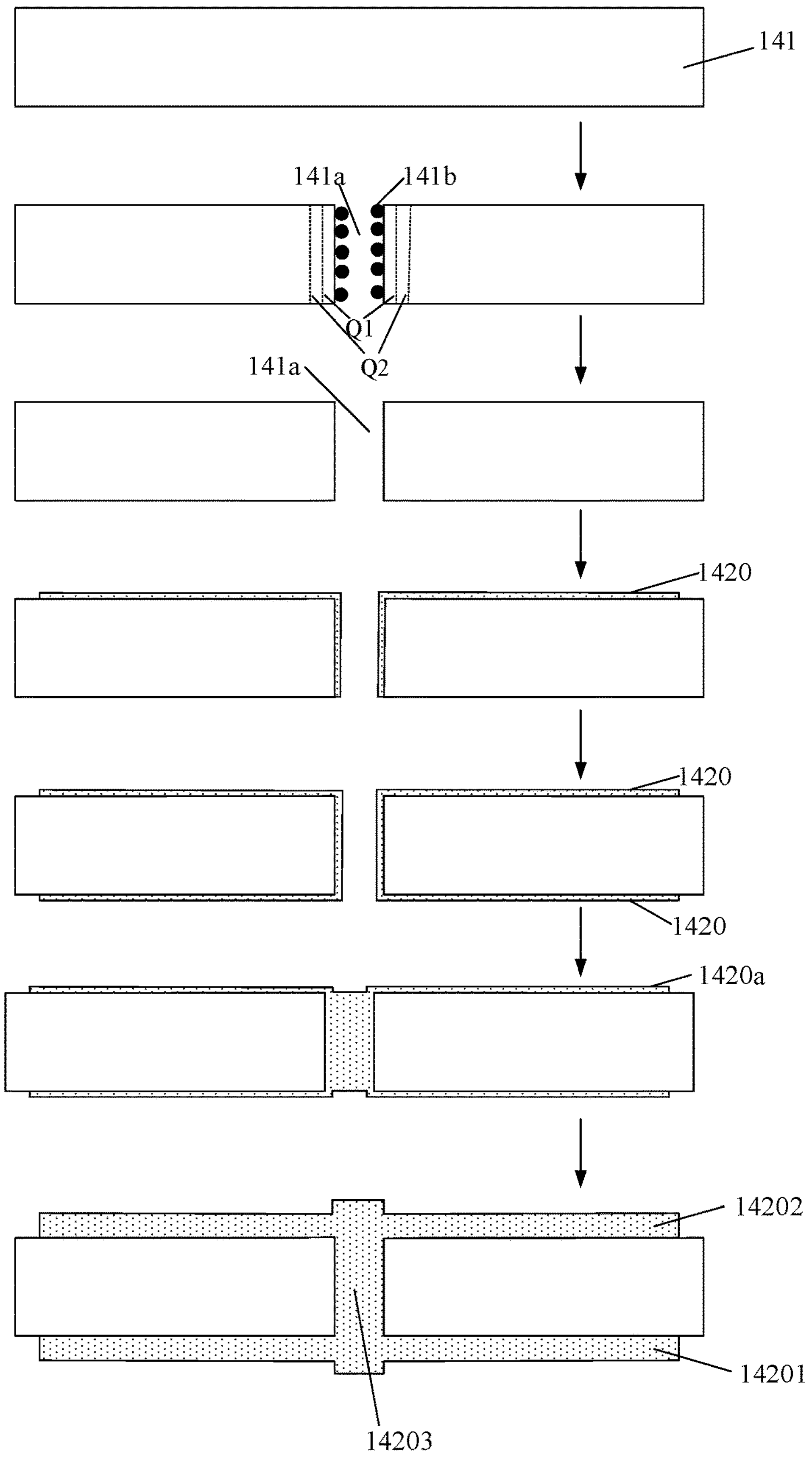
FIG. 14 is a flow chart of example 14 of a method for forming a conductive via according to an embodiment of the present disclosure.

FIG. 14 is a flow chart of example 14 of a method for forming a conductive via according to an embodiment of the present disclosure. As shown in FIG. 14, the formation method specifically includes steps of:

S141, preparing a dielectric layer 141, wherein a material of the dielectric layer 141 includes, but is not limited to, any one of glass, Si, SOI; forming a connection via 141*a* through a laser drilling process on the dielectric layer 141.

In some examples, step S141 may specifically include: vertically irradiating a laser onto a surface (a first surface or a second surface) of the dielectric layer 141 by means of a laser device. When the laser interacts with the dielectric layer 141, atoms forming the dielectric layer 141 are ionized and projected out of the surface of the dielectric layer 141 due to higher photon energy of the laser, and the drilled via is gradually deepened along with time, until the whole dielectric layer 141 is penetrated. That is, the connection via 141*a* is formed. An inclination angle of the connection via 141*a* is approximately in a range of 0° to 5°. For example, the inclination angle of the connection via 141*a* is 5°. That is, the connection via 141*a* has a shape like a cylinder or a truncated cone, an inverted truncated cone. Generally, the laser has a wavelength selected from 532 nm, 355 nm, 266 nm, 248 nm, 197 nm or the like, the laser may have a pulse width selected from 1 fs to 100 fs, 1 ps to 100 ps, 1 ns to 100 ns or the like, and a type of the laser device may be selected from a continuous laser device, a pulse laser device or the like. The laser drilling includes the following two modes: when a diameter of a light spot is large, a relative position between a laser beam and the dielectric layer 141 is fixed, the dielectric layer 141 is directly penetrated by means of the high energy, such that a shape of the connection via 141*a* is the inverted truncated cone, and diameters of the connection via are gradually reduced from top to bottom (along a propagation direction of the laser). The diameter of the connection via 141*a* on the second surface is in a range of about 80 um to about 120 um, and the diameter of the connection via 141*a* on the first surface is in a range of about 60 um to about 100 um. The other mode of the laser drilling is: when the diameter of the light spot is small, the laser beam moves (scans) in circles on the dielectric layer 141. Specifically, a focal point of the light spot is constantly changed, a depth of the focal point is constantly changed, the laser beam moves in a spiral line from a lower surface of the dielectric layer 141 to an upper surface of the dielectric layer 141, and radiuses of the spiral line are gradually reduced from the lower surface to the upper surface. In this way, a portion of the dielectric layer 141 is obtained through the laser cut and is truncated cone shaped, and falls down due to the gravity, thereby forming the connection via 141*a* which is truncated cone shaped. The diameter of the connection via 141*a* on the second surface is in a range of about 100 um to about 1000 um, and the diameter of the connection via 141*a* on the first surface is in a range of about 150 um to about 1500 um.

S142, cleaning the dielectric layer 141, after step S141, so that residues, debris, and the like near the inner wall and an outer edge of the connection via 141*a* are washed away.

In some examples, step S142 may specifically include: the dielectric layer 141 is placed into a water tank, wherein the dielectric layer 141 is firstly subjected to ultrasonic cleaning to remove floating dust on a surface of the dielectric layer, the dielectric layer 141 is then immersed in a solution containing hydrofluoric acid for chemical corrosion, so that defects, such as microcrack areas Q1, stress concentration areas Q2 and the like, which are near the connection via 141*a* and in its inner wall on the dielectric layer 141 made of glass, Si or SOI, may be thoroughly removed through the chemical corrosion. A content of HF in the solution is approximately in a range of 1% to 20%, and $NH_4F$ may or may not be contained in the solution. When $NH_4F$ is contained, a content of $NH_4F$ is approximately in a range of 10 to 40%, a temperature of the solution is approximately in a range of 35° C. to 60° C., a duration for the chemical corrosion is approximately in a range of 30 seconds to 5 minutes. Then, the dielectric layer 141 is thoroughly washed by the pure deionized water, and finally, is dried by the air knife. The chemically corroded connection via 141*a* has smooth inner wall and surface and does not contain the defects, such as microcrack areas Q1, stress concentration areas Q2 and the like, which is beneficial to the growth of seed layers with a high quality, the via-filling and the thickening with metal.

S143, forming metal films 1420, as seed layers, within the connection via 141*a* of the dielectric layer 141, and on the first surface and the second surface of the dielectric layer 141, after the step S142.

In some examples, step S143 may specifically include: depositing metal films 1420 with good conductivity, as seed layers, on the whole first surface and the whole second surface of the dielectric layer 141 through a process including, but being not limited to, a magnetron sputtering process. In addition to the magnetron sputtering process, the metal films 1420 may be formed through an electron beam evaporation process, an thermal evaporation process, or a pulsed laser sputtering process.

In some examples, a metal stack is generally used to increase the adhesion between the metal films and the dielectric layer 141. That is, the metal films include a first metal sub-layer and a second metal sub-layer sequentially arranged in a direction away from the dielectric layer 141. A material of the first metal sub-layer includes, but is not limited to, any one of titanium (Ti), molybdenum (Mo), and nickel (Ni), and a material of the second metal sub-layer includes, but is not limited to, any one of copper (Cu), silver (Ag), or gold (Au). For example, the metal films include: any one of Ti/Cu, Mo/Cu, Ni/Cu, Ti/Ag, MWAg and Ni/Ag. In the embodiment of the present disclosure, a thickness of the first metal sub-layer is in a range of about 1 nm to about 100 nm; a thickness of the second metal sub-layer is in a range of about 50 nm to about 1000 nm. In addition, a thickness of the metal film on the inner wall of the connection via 141*a* is in a range of about 1 nm to about 200 nm.

S144, filling the connection via 141*a* through an electroplating process and thickening the metal films 1420 formed on the first surface and the second surface, after the step S143, to form a first extraction electrode 14201 on the first surface and a second extraction electrode 14202 on the second surface, respectively, and a connection electrode 14203 within the connection via 141*a*.

In some examples, step S144 may specifically include: firstly, a via-filling electroplating process is performed in an electroplating bath through a reasonable combination of different types of electroplating solutions (such as a formula for filling the metal film into the connection via 141*a* and a formula for thickening the metal films on the whole surfaces), so that the metal film 1420 (such as a first metal sub-layer in the metal film 1420) is deposited on the inner wall of the connection via 141*a*, wherein an electroplating rate is in a range of 0.5 um/min to 5 um/min, and depending to an electroplating duration, the metal material may fully fill the connection via 141*a* (a thickness of the metal film is equal to 0.5 times of a diameter of the connection via 141*a*) or not fully fill the connection via 141*a*, only the inner wall of the connection via 141*a* is metallized (the thickness of the metal film is in a range of 500 nm to 10 um). That is, the connection electrode 14203 is formed. Then, the dielectric layer 141 is moved into the electroplating bath for the formula for thickening the metal films on the whole surfaces, to thicken the metal films 1420 on the first surface and the second surface through an electroplating process, respectively, wherein the electroplating metal is Cu, Ag or Au, the electroplating rate is in a range of 0.5 um/min to 5 um/min, and depending to the electroplating duration, a thickness of each of the thickened metal films 1420*a* is approximately in a range of 500 nm to 500 um. After the electroplating process, the surfaces of the dielectric layer 141 are generally undulated and uneven, which adversely affects subsequent processes. Thus, finally, a chemical mechanical polishing process is performed, such that the surfaces of the dielectric layer 141 become flat and smooth, thereby forming the first extraction electrode 14201 and the second extraction electrode 14202.

Alternatively, after the electroplating process, the thickened metal films 1420*a* on the first surface and the second surface may be patterned, to form the first extraction electrode 14201 and the second extraction electrode 14202.

Example 15

Figure 15:
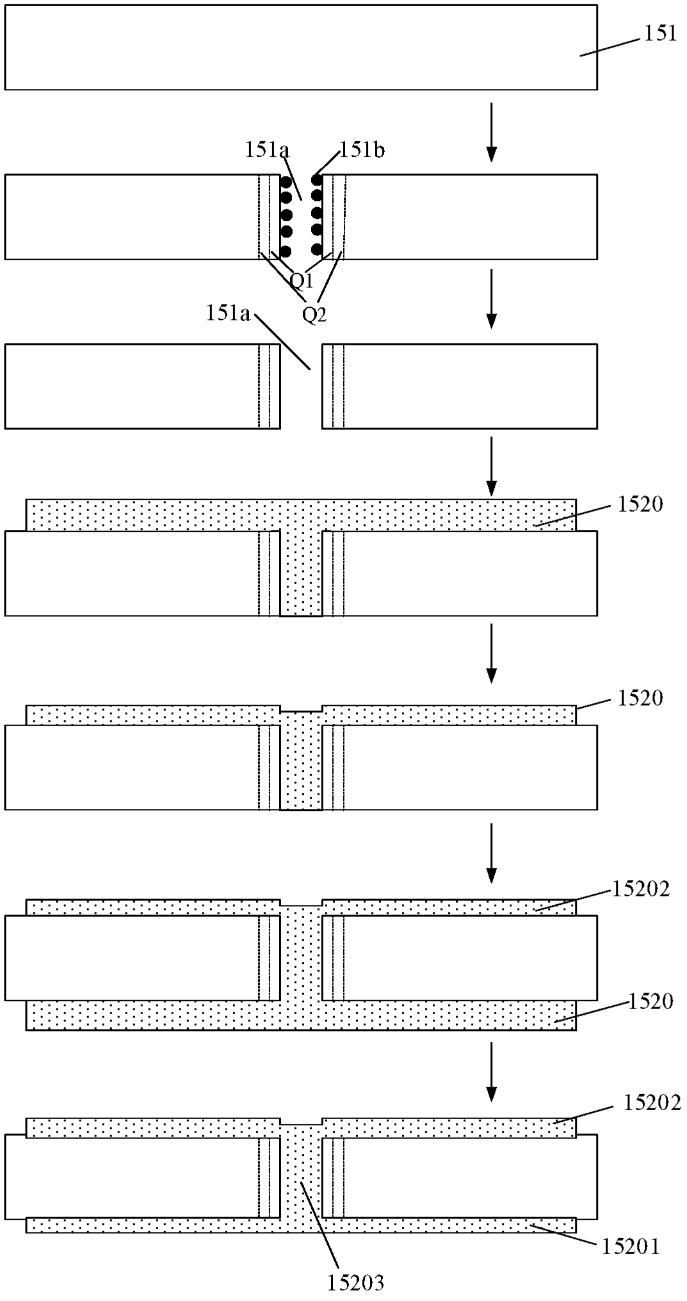
FIG. 15 is a flow chart of example 15 of a method for forming a conductive via according to an embodiment of the present disclosure.

FIG. 15 is a flow chart of example 15 of a method for forming a conductive via according to an embodiment of the present disclosure. As shown in FIG. 15, the formation method specifically includes steps of:

S151, preparing a dielectric layer 151, wherein a material of the dielectric layer 151 includes, but is not limited to, any one of glass, Si, SOI, GaAs, SiC, InP, PCB, $Al_2O_3$; forming a connection via 151*a* through a laser drilling process on the dielectric layer 151.

In some examples, step S151 may specifically include: vertically irradiating a laser onto a surface (a first surface or a second surface) of the dielectric layer 151 by means of a laser device. When the laser interacts with the dielectric layer 151, atoms forming the dielectric layer 151 are ionized and projected out of the surface of the dielectric layer 151 due to higher photon energy of the laser, and the drilled via is gradually deepened along with time, until the whole dielectric layer 151 is penetrated. That is, the connection via 151*a* is formed. An inclination angle of the connection via 151*a* is approximately in a range of 0° to 5°. For example, the inclination angle of the connection via 151*a* is 5. That is, the connection via 151*a* has a shape like a cylinder or a truncated cone, an inverted truncated cone. Generally, the laser has a wavelength selected from 532 nm, 355 nm, 266 nm, 248 nm, 197 nm or the like, the laser may have a pulse width selected from 1 fs to 100 fs, 1 ps to 100 ps, 1 ns to 100 ns or the like, and a type of the laser device may be selected from a continuous laser device, a pulse laser device or the like. The laser drilling includes the following two modes: when a diameter of a light spot is large, a relative position between a laser beam and the dielectric layer 151 is fixed, the dielectric layer 151 is directly penetrated by means of the high energy, such that a shape of the connection via 151*a* is the inverted truncated cone, and diameters of the connection via are gradually reduced from top to bottom (along a propagation direction of the laser). The diameter of the connection via 151*a* on the second surface is in a range of about 80 um to about 120 um, and the diameter of the connection via 151*a* on the first surface is in a range of about 60 um to about 100 um. The other mode of the laser drilling is: when the diameter of the light spot is small, the laser beam moves (scans) in circles on the dielectric layer 151. Specifically, a focal point of the light spot is constantly changed, a depth of the focal point is constantly changed, the laser beam moves in a spiral line from a lower surface of the dielectric layer 151 to an upper surface of the dielectric layer 151, and radiuses of the spiral line are gradually reduced from the lower surface to the upper surface. In this way, a portion of the dielectric layer 151 is obtained through the laser cut and is truncated cone shaped, and falls down due to the gravity, thereby forming the connection via 151*a* which is truncated cone shaped. The diameter of the connection via 151*a* on the second surface is in a range of about 100 um to about 1000 um, and the diameter of the connection via 151*a* on the first surface is in a range of about 150 um to about 1500 um.

S152, cleaning the dielectric layer 151, after step S151, so that residues, debris (151*b* shown in FIG. 15), and the like near the inner wall and an outer edge of the connection via 151*a* are washed away.

In some examples, step S152 may specifically include: placing the dielectric layer 151 into a water tank containing pure deionized water or a combination of the deionized water with a proper amount of cleaning agent (such as an oil-based cleaning agent or a water-based cleaning agent) at a temperature approximately in a range of 35° C. to 70° C., wherein the water is subjected to cavitation, acceleration and direct flow actions by means of ultrasonic waves (with a frequency approximately in a range of 10 kHz to 10 MHz), so that a pollutant layer is dispersed, emulsified and stripped to achieve the purpose of cleaning, wherein the cleaning time is approximately in a range of 2 to 20 minutes; and finally, washing the dielectric layer 151 by using the pure deionized water, and taking the dielectric layer 151 out of the water tank, and drying the dielectric layer 151 by using an air knife.

S153, after the step S152, applying a metal paste 1520 into the connection via 151*a* of the dielectric layer 151, and forming the metal paste 1520 on the first surface and the second surface of the dielectric layer 151; and then, curing the metal paste 1520 on the first surface and the second surface, respectively, to form a connection electrode 15203 filled in the connection via 151*a*, a first extraction electrode 15201 on the first surface and a second extraction electrode 15202 on the second surface.

In some examples, the metal paste 1520 may be a conductive paste. A material of the conductive paste includes, but is not limited to, a low-temperature curing type polymer conductive paste, and main components of the conductive paste include conductive particles, a resin, a curing agent, a dispersant, a diluent, an adhesion enhancer, and an anti-settling agent. The conductive particles may be selected from Cu, Ag and Au, and a size of each particle is approximately in a range of 1 nm to 100 um. The resin may be bisphenol epoxy resin. The curing agent may be acid anhydrides. The dispersant may be methylimidazole. The diluent may be butyl acetate. The adhesion enhancer may be tetraethyl titanate. The anti-settling agent may be polyamides.

Step S153 may specifically include: firstly, coating the conductive paste in the connection via 151*a* and around an edge of the connection via 151*a* on the second surface, and then, performing solvent drying and thermocuring processes on the second surface of the dielectric layer 151 to form the connection electrode 15203 filled in the connection via 151*a* and the second extraction electrode 15202 located on the second surface; then, coating the conductive paste around an edge of the connection via 151*a* on the first surface of the dielectric layer 151, and then, performing solvent drying and thermocuring processes on the first surface of the dielectric layer 151 to form the first extraction electrode 15201 located on the first surface. The preferred mode for coating the conductive paste includes, but is not limited to, screen printing, ink-jet printing, slit coating or the like. A vacuum adsorption machine is used in cooperation when the conductive paste is coated, so that the coating efficiency may be improved, and a distribution profile of the conductive paste on the wall and the edge of the connection via may be improved. The solvent drying process may be performed under an atmospheric pressure of air, an atmospheric pressure of N2 or the vacuum, at a temperature in a range of about 40° C. to about 95° C., for a duration in a range of about 1 min to about 30 min. The thermocuring process may be performed in an oven, under the atmosphere of N2, at a heating temperature in a range of about 140° C. to about 200° C. Alternatively, the curing process may be performed by means of illumination with laser beams, which have a wavelength in a range of about 500 nm to about 1510 nm, a laser power in a range of 50 mW to 50 W, and a beam diameter in a range of about 10 um to about 2000 um, and the laser beams may be a single beam or multiple beams.

Example 16

Figure 16:
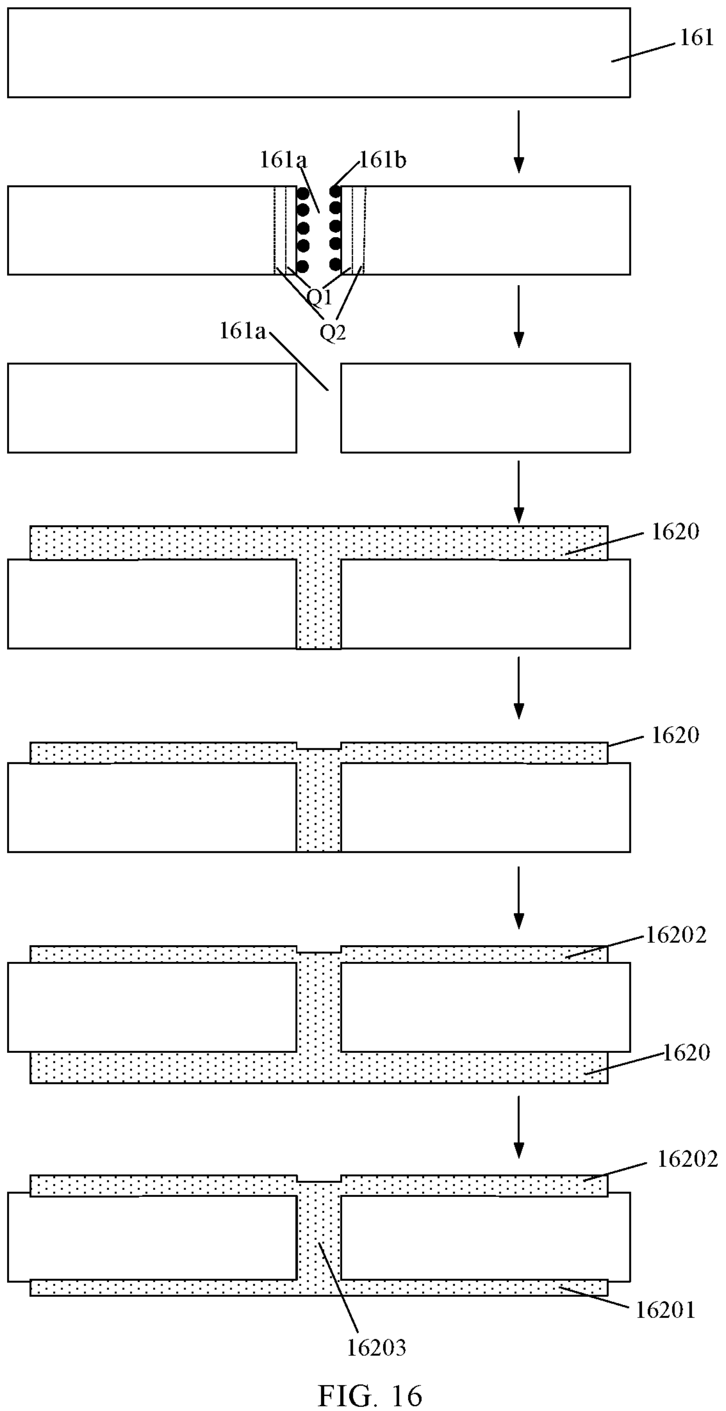
FIG. 16 is a flow chart of example 16 of a method for forming a conductive via according to an embodiment of the present disclosure.

FIG. 16 is a flow chart of example 16 of a method for forming a conductive via according to an embodiment of the present disclosure. As shown in FIG. 16, the formation method specifically includes steps of:

S161, preparing a dielectric layer 161, wherein a material of the dielectric layer 161 includes, but is not limited to, any one of glass, Si, SOI; forming a connection via 161*a* through a laser drilling process on the dielectric layer 161.

In some examples, step S161 may specifically include: vertically irradiating a laser onto a surface (a first surface or a second surface) of the dielectric layer 161 by means of a laser device. When the laser interacts with the dielectric layer 161, atoms forming the dielectric layer 161 are ionized and projected out of the surface of the dielectric layer 161 due to higher photon energy of the laser, and the drilled via is gradually deepened along with time, until the whole dielectric layer 161 is penetrated. That is, the connection via 161*a* is formed. An inclination angle of the connection via 161*a* is approximately in a range of 0° to 5°. For example, the inclination angle of the connection via 161*a* is 5°. That is, the connection via 161*a* has a shape like a cylinder or a truncated cone, an inverted truncated cone. Generally, the laser has a wavelength selected from 532 nm, 355 nm, 266 nm, 248 nm, 197 nm or the like, the laser may have a pulse width selected from 1 fs to 100 fs, 1 ps to 100 ps, 1 ns to 100 ns or the like, and a type of the laser device may be selected from a continuous laser device, a pulse laser device or the like. The laser drilling includes the following two modes: when a diameter of a light spot is large, a relative position between a laser beam and the dielectric layer 161 is fixed, the dielectric layer 161 is directly penetrated by means of the high energy, such that a shape of the connection via 161*a* is the inverted truncated cone, and diameters of the connection via are gradually reduced from top to bottom (along a propagation direction of the laser). The diameter of the connection via 161*a* on the second surface is in a range of about 80 um to about 120 um, and the diameter of the connection via 161*a* on the first surface is in a range of about 60 um to about 100 um. The other mode of the laser drilling is: when the diameter of the light spot is small, the laser beam moves (scans) in circles on the dielectric layer 161. Specifically, a focal point of the light spot is constantly changed, a depth of the focal point is constantly changed, the laser beam moves in a spiral line from a lower surface of the dielectric layer 161 to an upper surface of the dielectric layer 161, and radiuses of the spiral line are gradually reduced from the lower surface to the upper surface. In this way, a portion of the dielectric layer 161 is obtained through the laser cut and is truncated cone shaped, and falls down due to the gravity, thereby forming the connection via 161*a* which is truncated cone shaped. The diameter of the connection via 161*a* on the second surface is in a range of about 100 um to about 1000 um, and the diameter of the connection via 161*a* on the first surface is in a range of about 150 um to about 1500 um.

S162, cleaning the dielectric layer 161, after step S161, so that residues, debris (161*b* shown in FIG. 16), and the like near the inner wall and an outer edge of the connection via 161*a* are washed away.

In some examples, step S162 may specifically include: the dielectric layer 161 is placed into a water tank, wherein the dielectric layer 161 is firstly subjected to ultrasonic cleaning to remove floating dust on a surface of the dielectric layer; the dielectric layer 161 is then immersed in a solution containing hydrofluoric acid for chemical corrosion, so that defects, such as microcrack areas Q1, stress concentration areas Q2 and the like, which are near the connection via 161*a* and in its inner wall on the dielectric layer 161 made of glass, Si or SO, may be thoroughly removed through the chemical corrosion. A content of HF in the solution is approximately in a range of 1% to 20%, and $NH_4F$ may or may not be contained in the solution. When $NH_4F$ is contained, a content of $NH_4F$ is approximately in a range of 10 to 40%, a temperature of the solution is approximately in a range of 35° C. to 60° C., a duration for the chemical corrosion is approximately in a range of 30 seconds to 5 minutes. Then, the dielectric layer 161 is thoroughly washed by the pure deionized water, and finally, is dried by the air knife. The chemically corroded connection via 161*a* has smooth inner wall and surface and does not contain the defects, such as microcrack areas Q1, stress concentration areas Q2 and the like, which is beneficial to the growth of seed layers with a high quality, the via-filling and the thickening with metal.

S163, after the step S162, applying a metal paste into the connection via 161*a* of the dielectric layer 161, and forming the metal paste on the first surface and the second surface of the dielectric layer 161; and then, curing the metal paste on the first surface and the second surface, respectively, to form a connection electrode 16203 filled in the connection via 161*a*, a first extraction electrode 16201 on the first surface and a second extraction electrode 16202 on the second surface.

In some examples, the metal paste may be a conductive paste. A material of the conductive paste includes, but is not limited to, a low-temperature curing type polymer conductive paste, and main components of the conductive paste include conductive particles, a resin, a curing agent, a dispersant, a diluent, an adhesion enhancer, and an anti-settling agent. The conductive particles may be selected from Cu, Ag and Au, and a size of each particle is approximately in a range of 1 nm to 100 um. The resin may be bisphenol epoxy resin. The curing agent may be acid anhydrides. The dispersant may be methylimidazole. The diluent may be butyl acetate. The adhesion enhancer may be tetraethyl titanate. The anti-settling agent may be polyamides.

Step S163 may specifically include: firstly, coating the conductive paste in the connection via 161*a* and around an edge of the connection via 161*a* on the second surface, and then, performing solvent drying and thermocuring processes on the second surface of the dielectric layer 161 to form the connection electrode 16203 filled in the connection via 161*a* and the second extraction electrode 16202 located on the second surface; then, coating the conductive paste around an edge of the connection via 161*a* on the first surface of the dielectric layer 161, and then, performing solvent drying and thermocuring processes on the first surface of the dielectric layer 161 to form the first extraction electrode 16201 located on the first surface. The preferred mode for coating the conductive paste includes, but is not limited to, screen printing, ink-jet printing, slit coating or the like. A vacuum adsorption machine is used in cooperation when the conductive paste is coated, so that the coating efficiency may be improved, and a distribution profile of the conductive paste on the wall and the edge of the connection via may be improved. The solvent drying process may be performed under an atmospheric pressure of air, an atmospheric pressure of N2 or the vacuum, at a temperature in a range of about 40° C. to about 95° C., for a duration in a range of about 1 min to about 30 min. The thermocuring process may be performed in an oven, under the atmosphere of N2, at a heating temperature in a range of about 140° C. to about 200° C. Alternatively, the curing process may be performed by means of illumination with laser beams, which have a wavelength in a range of about 500 nm to about 1510 nm, a laser power in a range of 50 mW to 50 W, and a beam diameter in a range of about 10 um to about 2000 um, and the laser beams may be a single beam or multiple beams.

Example 17

Figure 17:
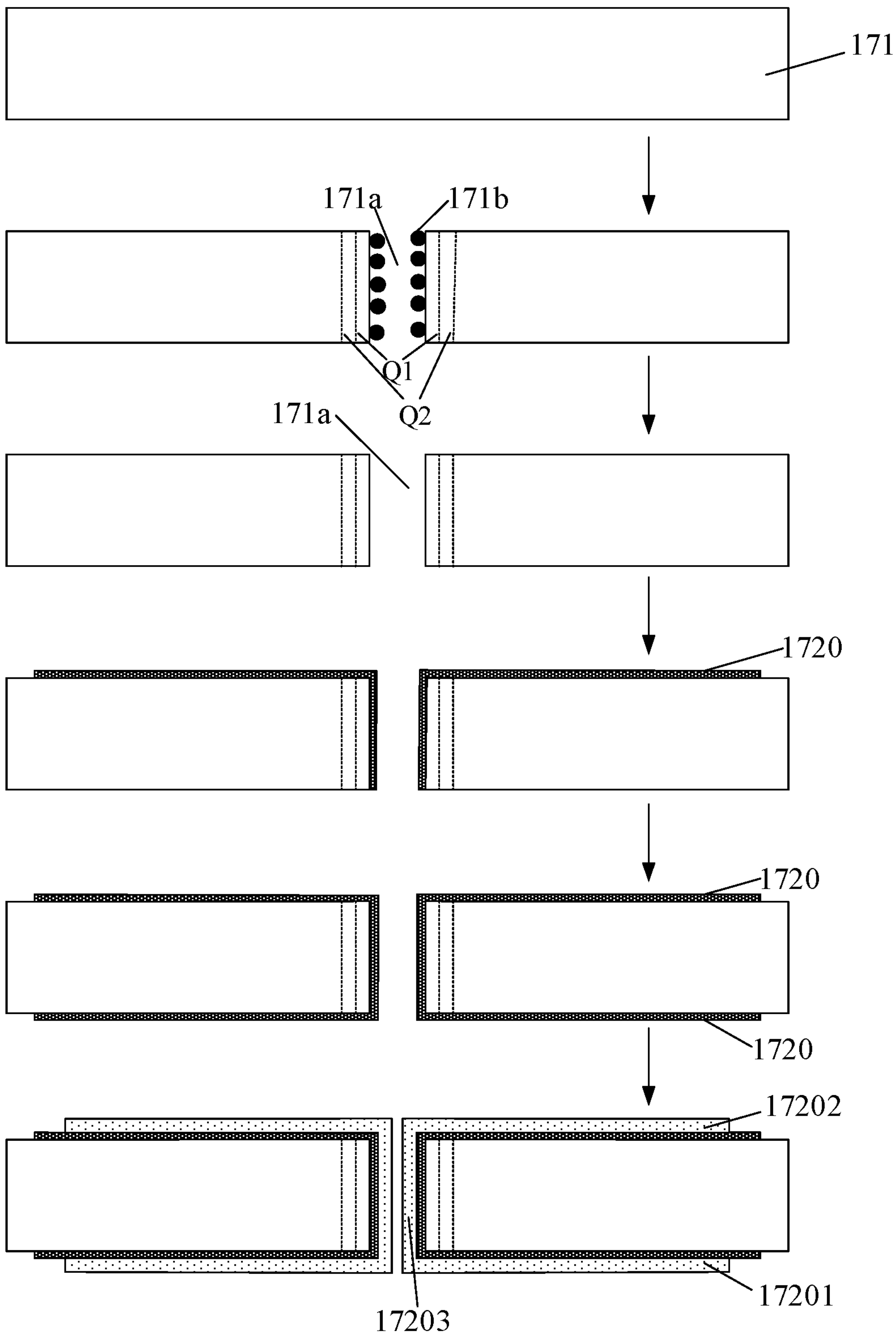
FIG. 17 is a flow chart of example 17 of a method for forming a conductive via according to an embodiment of the present disclosure.

FIG. 17 is a flow chart of example 17 of a method for forming a conductive via according to an embodiment of the present disclosure. As shown in FIG. 17, the formation method specifically includes steps of:

S171, preparing a dielectric layer 171, wherein a material of the dielectric layer 171 includes, but is not limited to, any one of glass, Si, SOI, GaAs, SiC, InP, PCB, $Al_2O_3$; forming a connection via 171*a* through a laser drilling process on the dielectric layer 171.

In some examples, step S171 may specifically include: vertically irradiating a laser onto a surface (a first surface or a second surface) of the dielectric layer 171 by means of a laser device. When the laser interacts with the dielectric layer 171, atoms forming the dielectric layer 171 are ionized and projected out of the surface of the dielectric layer 171 due to higher photon energy of the laser, and the drilled via is gradually deepened along with time, until the whole dielectric layer 171 is penetrated. That is, the connection via 171*a* is formed. An inclination angle of the connection via 171*a* is approximately in a range of 0° to 5°. For example, the inclination angle of the connection via 171*a* is 5. That is, the connection via 171*a* has a shape like a cylinder or a truncated cone, an inverted truncated cone. Generally, the laser has a wavelength selected from 532 nm, 355 nm, 266 nm, 248 nm, 197 nm or the like, the laser may have a pulse width selected from 1 fs to 100 fs, 1 ps to 100 ps, 1 ns to 100 ns or the like, and a type of the laser device may be selected from a continuous laser device, a pulse laser device or the like. The laser drilling includes the following two modes: when a diameter of a light spot is large, a relative position between a laser beam and the dielectric layer 171 is fixed, the dielectric layer 171 is directly penetrated by means of the high energy, such that a shape of the connection via 171*a* is the inverted truncated cone, and diameters of the connection via are gradually reduced from top to bottom (along a propagation direction of the laser). The diameter of the connection via 171*a* on the second surface is in a range of about 80 um to about 120 um, and the diameter of the connection via 171*a* on the first surface is in a range of about 60 um to about 100 um. The other mode of the laser drilling is: when the diameter of the light spot is small, the laser beam moves (scans) in circles on the dielectric layer 171. Specifically, a focal point of the light spot is constantly changed, a depth of the focal point is constantly changed, the laser beam moves in a spiral line from a lower surface of the dielectric layer 171 to an upper surface of the dielectric layer 171, and radiuses of the spiral line are gradually reduced from the lower surface to the upper surface. In this way, a portion of the dielectric layer 171 is obtained through the laser cut and is truncated cone shaped, and falls down due to the gravity, thereby forming the connection via 171*a* which is truncated cone shaped. The diameter of the connection via 171*a* on the second surface is in a range of about 100 um to about 1000 um, and the diameter of the connection via 171*a* on the first surface is in a range of about 150 um to about 1500 um.

S172, cleaning the dielectric layer 171, after step S171, so that residues, debris (171*b* shown in FIG. 17), and the like near the inner wall and an outer edge of the connection via 171*a* are washed away.

In some examples, step S172 may specifically include: placing the dielectric layer 171 into a water tank containing pure deionized water or a combination of the deionized water with a proper amount of cleaning agent (such as an oil-based cleaning agent or a water-based cleaning agent) at a temperature approximately in a range of 35° C. to 70° C., wherein the water is subjected to cavitation, acceleration and direct flow actions by means of ultrasonic waves (with a frequency approximately in a range of 10 kHz to 10 MHz), so that a pollutant layer is dispersed, emulsified and stripped to achieve the purpose of cleaning, wherein the cleaning time is approximately in a range of 2 to 20 minutes; and finally, washing the dielectric layer 171 by using the pure deionized water, and taking the dielectric layer 171 out of the water tank, and drying the dielectric layer 171 by using an air knife.

S173, forming a chemical plating medium 1720 on the first surface and the second surface of the dielectric layer 171 provided with the connection via 171*a* after the step S172.

In some examples, step S173 may specifically include: placing the dielectric layer 171, in a spraying mode or directly, into a water tank containing a solution of the chemical plating medium 1720, so that a layer of $Sn^{2+}$ is adsorbed on surfaces of the dielectric layer 171. The solution of the chemical plating medium 1720 mainly contains $SnCl_2$ of 10 g/L to 30 g/L, concentrated hydrochloric acid (having a concentration of 38%) of 20 ml/L to 60 ml/L and deionized water. A less number of Sn particles are added into the solution to prevent the $Sn^{2+}$ from being oxidated. Then, the dielectric layer 171 is placed, in a spraying mode or directly, into a water tank containing an activation solution, so that surfaces of the dielectric layer 171 reacts with the activation solution (mainly containing $SnCl_2$ of 80 g/L to 120 g/L, concentrated hydrochloric acid of 300 ml/L to 500 ml/L, $Na_2SnO_3$ of 10 g/L to 20 g/L, $PdCl_2$ of 1 g/L to 4 g/L and deionized water), to generate metal palladium particles which are tightly attached to the surfaces of the dielectric layer 171. That is, the chemical plating medium 1720 is formed on the first surface and the second surface of the dielectric layer 171 provided with the connection via 171*a*.

S174, after the step S173, performing a chemical plating process on the dielectric layer 171 with the chemical plating medium 1720 to form metal films on the first surface, the second surface of the dielectric layer 171, and in the connection via 171*a*, and patterning the metal films formed on the first surface and the second surface of the dielectric layer 171, for forming a first extraction electrode 17201 and a second extraction electrode 17202, and a connection electrode 17203 in the connection via 171*a*.

In some examples, the chemically plated metal films may be a single-layer metal film or may be metal films stacked together. For example: only a Cu metal film is plated to form a single-layer metal film (having a thickness in a range of about 1 um to about 100 um). Alternatively, it is also possible to firstly plate a Ni metal film (having a thickness in a range of about 10 um to about 100 um), and then a Cu metal film (having a thickness in a range of about 1 um to about 100 um), wherein the Ni metal film is used to increase the adhesion of the Cu metal film. In the embodiment of the present disclosure, as an example, a material of the single-layer metal film is Cu, and a material of metal films stacked together is Ni/Cu, which does not limit the scope of the embodiment of the present disclosure. It will be described below by taking an example in which Ni/Cu metal films are chemically plated.

In some examples, step S174 may specifically include: placing the dielectric layer 171 into the chemical plating solution, and sequentially performing the chemical plating process with metal Ni and Cu. Then, the metal films formed on the first surface and the second surface of the dielectric layer 171 are patterned, for forming the first extraction electrode 17201 and the second extraction electrode 17202, and the connection electrode 17203 in the connection via 171*a*. The Ni solution for the chemical plating generally contains NiSO4·6H2O of 10 g/L to 30 g/L, NaH2PO4·2H2O 20 g/L to 40 g/L, Na-Citrate of 5 g/L to 15 g/L and NH4Cl of 20 g/L to 40 g/L, the solution is alkaline, has a PH in a range of 8.0 to 10.0 and a temperature in a range of 75° C. to 90° C. The Cu solution for the chemical plating generally contains KNaC4H4O6 of 30 g/L to 50 g/L, NaOH of 8 g/L to 10 g/L, Na2CO3 of 38 g/L to 40 g/L, CuSO4 of 10 g/L to 20 g/L, NiCl2 of 2 g/L to 6 g/L and formaldehyde of 40 ml/L to 60 ml/L with a concentration of 35%, the solution is alkaline, has a PH in a range of 11.0 to 14.0 and a temperature in a range of 55° C. to 65° C.

Example 18

Figure 18:
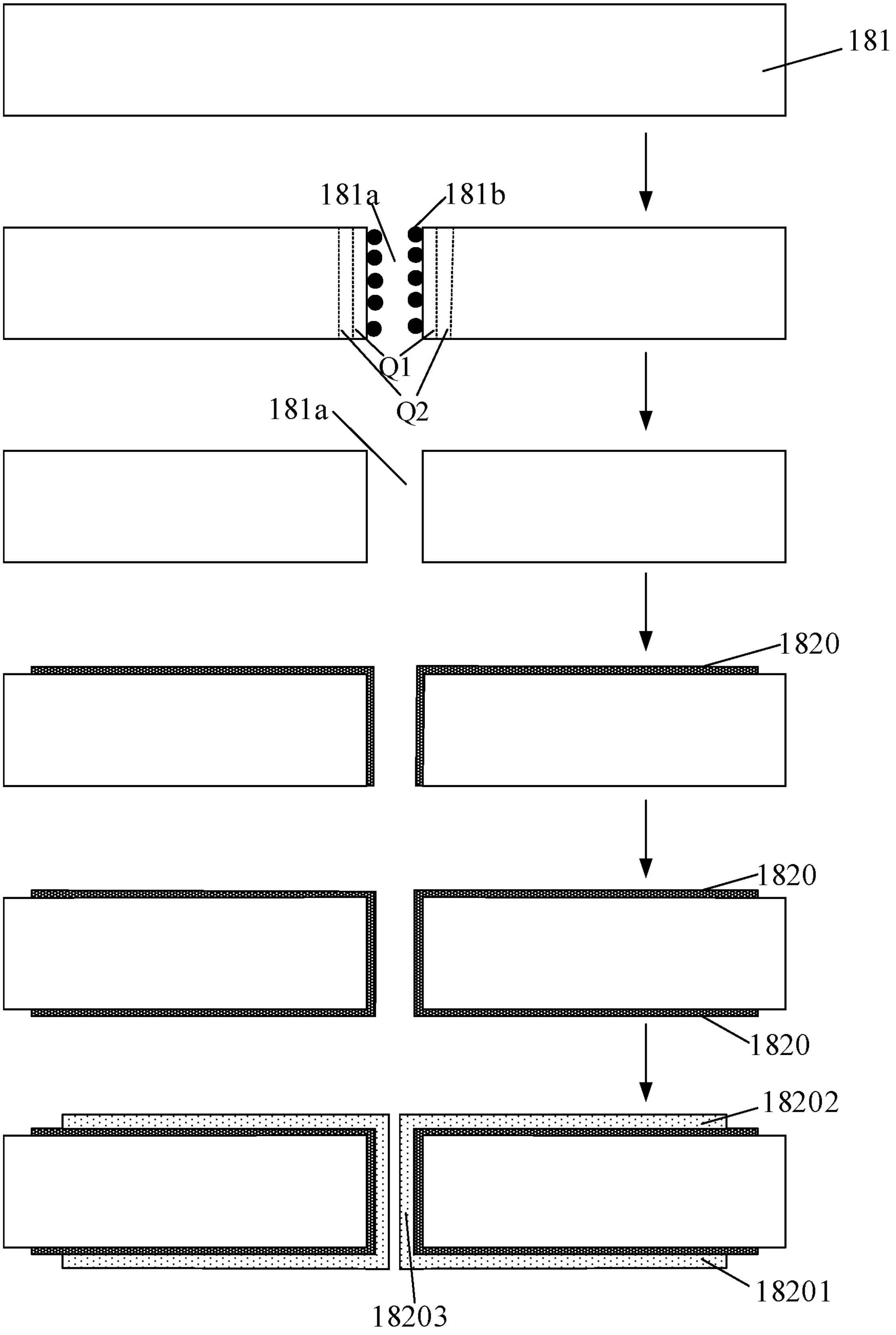
FIG. 18 is a flow chart of example 18 of a method for forming a conductive via according to an embodiment of the present disclosure.

FIG. 18 is a flow chart of example 18 of a method for forming a conductive via according to an embodiment of the present disclosure. As shown in FIG. 18, the formation method specifically includes steps of:

S181, preparing a dielectric layer 181, wherein a material of the dielectric layer 181 includes, but is not limited to, any one of glass, Si, SOI; forming a connection via 181*a* through a laser drilling process on the dielectric layer 181.

In some examples, step S181 may specifically include: vertically irradiating a laser onto a surface (a first surface or a second surface) of the dielectric layer 181 by means of a laser device. When the laser interacts with the dielectric layer 181, atoms forming the dielectric layer 181 are ionized and projected out of the surface of the dielectric layer 181 due to higher photon energy of the laser, and the drilled via is gradually deepened along with time, until the whole dielectric layer 181 is penetrated. That is, the connection via 181*a* is formed. An inclination angle of the connection via 181*a* is approximately in a range of 0° to 5°. For example, the inclination angle of the connection via 181*a* is 5°. That is, the connection via 181*a* has a shape like a cylinder or a truncated cone, an inverted truncated cone. Generally, the laser has a wavelength selected from 532 nm, 355 nm, 266 nm, 248 nm, 197 nm or the like, the laser may have a pulse width selected from 1 fs to 100 fs, 1 ps to 100 ps, 1 ns to 100 ns or the like, and a type of the laser device may be selected from a continuous laser device, a pulse laser device or the like. The laser drilling includes the following two modes: when a diameter of a light spot is large, a relative position between a laser beam and the dielectric layer 181 is fixed, the dielectric layer 181 is directly penetrated by means of the high energy, such that a shape of the connection via 181*a* is the inverted truncated cone, and diameters of the connection via are gradually reduced from top to bottom (along a propagation direction of the laser). The diameter of the connection via 181*a* on the second surface is in a range of about 80 um to about 120 um, and the diameter of the connection via 181*a* on the first surface is in a range of about 60 um to about 100 um. The other mode of the laser drilling is: when the diameter of the light spot is small, the laser beam moves (scans) in circles on the dielectric layer 181. Specifically, a focal point of the light spot is constantly changed, a depth of the focal point is constantly changed, the laser beam moves in a spiral line from a lower surface of the dielectric layer 181 to an upper surface of the dielectric layer 181, and radiuses of the spiral line are gradually reduced from the lower surface to the upper surface. In this way, a portion of the dielectric layer 181 is obtained through the laser cut and is truncated cone shaped, and falls down due to the gravity, thereby forming the connection via 181*a* which is truncated cone shaped. The diameter of the connection via 181*a* on the second surface is in a range of about 100 um to about 1000 um, and the diameter of the connection via 181*a* on the first surface is in a range of about 150 um to about 1500 um.

S182, cleaning the dielectric layer 181, after step S181, so that residues, debris (181*b* shown in FIG. 18), and the like near the inner wall and an outer edge of the connection via 181*a* are washed away.

In some examples, step S182 may specifically include: the dielectric layer 181 is placed into a water tank, wherein the dielectric layer 181 is firstly subjected to ultrasonic cleaning to remove floating dust on a surface of the dielectric layer; the dielectric layer 181 is then immersed in a solution containing hydrofluoric acid for chemical corrosion, so that defects, such as microcrack areas Q1, stress concentration areas Q2 and the like, which are near the connection via 181*a* and in its inner wall on the dielectric layer 181 made of glass, Si or SO, may be thoroughly removed through the chemical corrosion. A content of HF in the solution is approximately in a range of 1% to 20%, and $NH_4F$ may or may not be contained in the solution. When $NH_4F$ is contained, a content of $NH_4F$ is approximately in a range of 10 to 40%, a temperature of the solution is approximately in a range of 35° C. to 60° C., a duration for the chemical corrosion is approximately in a range of 30 seconds to 5 minutes. Then, the dielectric layer 181 is thoroughly washed by the pure deionized water, and finally, is dried by the air knife. The chemically corroded connection via 181*a* has smooth inner wall and surface and does not contain the defects, such as microcrack areas Q1, stress concentration areas Q2 and the like, which is beneficial to the growth of seed layers with a high quality, the via-filling and the thickening with metal.

S183, forming a chemical plating medium on the first surface and the second surface of the dielectric layer 181 provided with the connection via 181*a* after the step S182.

In some examples, step S183 may specifically include: placing the dielectric layer 181, in a spraying mode or directly, into a water tank containing a solution of the chemical plating medium, so that a layer of $Sn^{2+}$ is adsorbed on surfaces of the dielectric layer 181. The solution of the chemical plating medium mainly contains $SnCl_2$ of 10 g/L to 30 g/L, concentrated hydrochloric acid (having a concentration of 38%) of 20 ml/L to 60 ml/L and deionized water. A less number of Sn particles are added into the solution to prevent the $Sn^{2+}$ from being oxidated. Then, the dielectric layer 181 is placed, in a spraying mode or directly, into a water tank containing an activation solution, so that surfaces of the dielectric layer 121 reacts with the activation solution (mainly containing $SnCl_2$ of 80 g/L to 120 g/L, concentrated hydrochloric acid of 300 ml/L to 500 ml/L, $Na_2SnO_3$ of 10 g/L to 20 g/L, $PdCl_2$ of 1 g/L to 4 g/L and deionized water), to generate metal palladium particles which are tightly attached to the surfaces of the dielectric layer 181. That is, the chemical plating medium is formed on the first surface and the second surface of the dielectric layer 181 provided with the connection via 181*a*.

S184, after the step S183, performing a chemical plating process on the dielectric layer 181 with the chemical plating medium to form metal films on the first surface, the second surface of the dielectric layer 181, and in the connection via 181*a*, and patterning the metal films formed on the first surface and the second surface of the dielectric layer 181, for forming a first extraction electrode 18201 and a second extraction electrode 18202, and a connection electrode 18203 in the connection via 181*a*.

In some examples, the chemically plated metal films may be a single-layer metal film or may be metal films stacked together. For example: only a Cu metal film is plated to form a single-layer metal film (having a thickness in a range of about 1 um to about 100 um). Alternatively, it is also possible to firstly plate a Ni metal film (having a thickness in a range of about 10 um to about 100 um), and then a Cu metal film (having a thickness in a range of about 1 um to about 100 um), wherein the Ni metal film is used to increase the adhesion of the Cu metal film. In the embodiment of the present disclosure, as an example, a material of the single-layer metal film is Cu, and a material of metal films stacked together is Ni/Cu, which does not limit the scope of the embodiment of the present disclosure. It will be described below by taking an example in which Ni/Cu metal films are chemically plated.

In some examples, step S184 may specifically include: placing the dielectric layer 181 into the chemical plating solution, and sequentially performing the chemical plating process with metal Ni and Cu. Then, the metal films formed on the first surface and the second surface of the dielectric layer 181 are patterned, for forming the first extraction electrode 18201 and the second extraction electrode 18202, and the connection electrode 18203 in the connection via 181*a*. The Ni solution for the chemical plating generally contains NiSO4·6H2O of 10 g/L to 30 g/L, NaH2PO4·2H2O 20 g/L to 40 g/L, Na-Citrate of 5 g/L to 15 g/L and NH4Cl of 20 g/L to 40 g/L, the solution is alkaline, has a PH in a range of 8.0 to 10.0 and a temperature in a range of 75° C. to 90° C.

The Cu solution for the chemical plating generally contains KNaC4H406 of 30 g/L to 50 g/L, NaOH of 8 g/L to 10 g/L, Na2CO3 of 38 g/L to 40 g/L, CuSO4 of 10 g/L to 20 g/L, NiCl2 of 2 g/L to 6 g/L and formaldehyde of 40 ml/L to 60 ml/L with a concentration of 35%, the solution is alkaline, has a PH in a range of 11.0 to 14.0 and a temperature in a range of 55° C. to 65° C.

Example 19

Figure 19A:
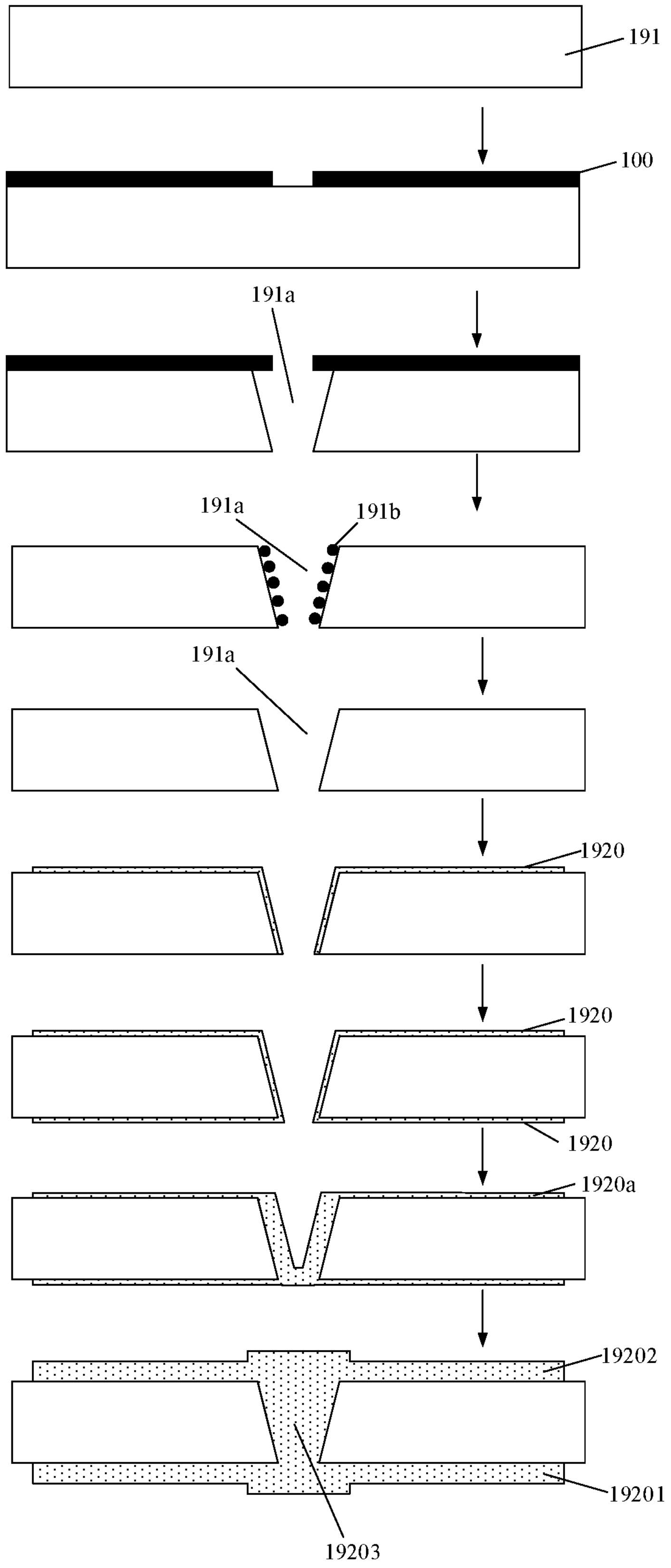
FIG. 19*a* is a flow chart of example 19 of a method for forming a conductive via according to an embodiment of the present disclosure.
Figure 19B:
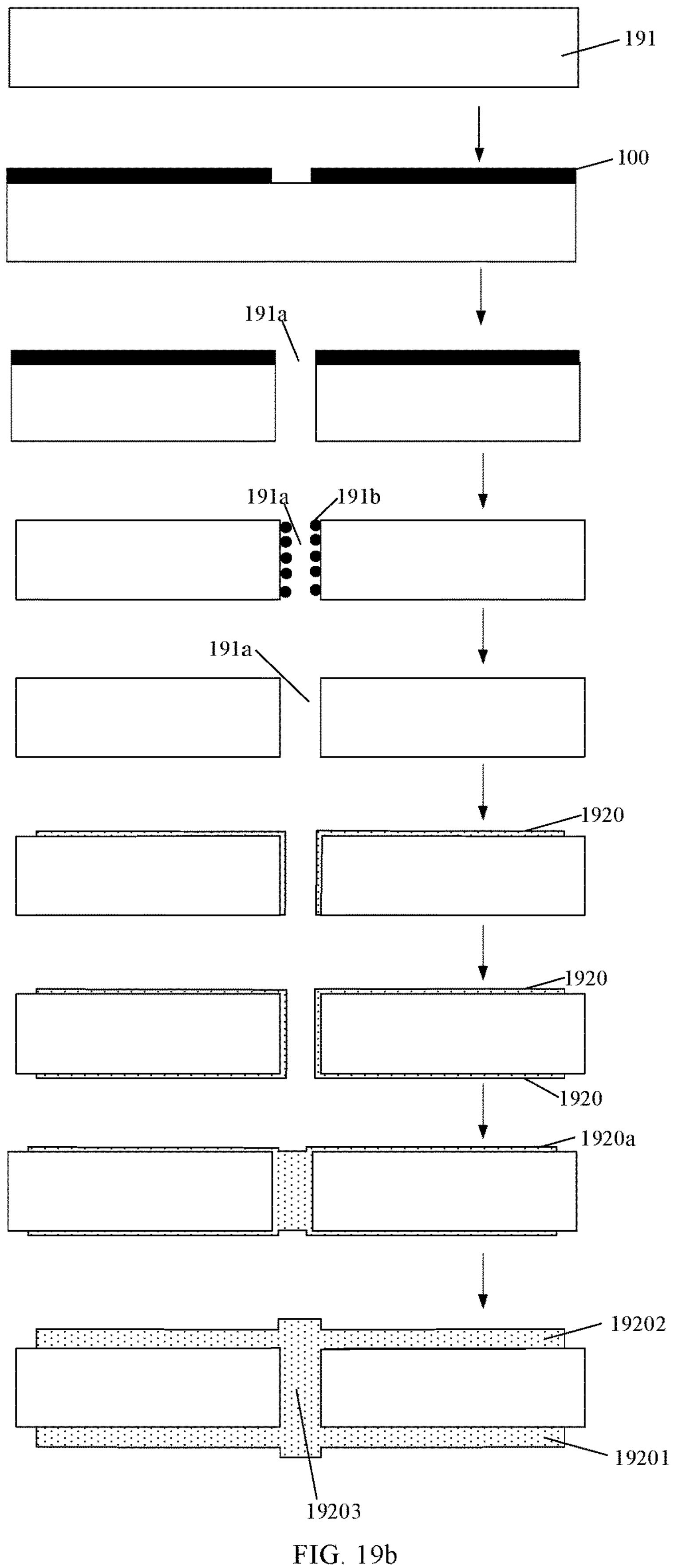
FIG. 19*b* is another flow chart of example 19 of a method for forming a conductive via according to an embodiment of the present disclosure.

FIG. 19*a* is a flow chart of example 19 of a method for forming a conductive via according to an embodiment of the present disclosure. FIG. 19*b* is another flow chart of example 19 of a method for forming a conductive via according to an embodiment of the present disclosure. As shown in FIGS. 19*a* and 19*b*, the formation method specifically includes steps of:

S191, preparing a dielectric layer 191; and forming a connection via 191*a* extending through the dielectric layer 191 through a patterning process.

In some examples, step S191 may specifically include: forming the connection via 191*a* in the dielectric layer 191 through an etching process. The etching process includes two types of etching processes, that is, a wet etching process and a dry etching process. The connection via 191*a* may be formed in the dielectric layer 191 by reasonably selecting the type of the etching process, a formula of etching liquid or a proportion of etching gas, an etching duration, a temperature and the like. It will be described below that the connection via 191*a* extending through the dielectric layer 191 is formed through the wet etching process and the dry etching process, respectively.

In one example, for a silicon substrate with a crystal orientation (100) as the dielectric layer 191, firstly, a mask layer 100 is formed on a first surface of the dielectric layer 191 through a photolithographic process. For example, the mask layer 100 is formed of a photoresist or a silicon dioxide film. The dielectric layer 191 is placed into a tetramethyl ammonium hydroxide aqueous solution at a temperature of 90° C. for the wet etching. A depth of the via increases with time, until the dielectric layer 191 is penetrated. The mask layer 100 is removed. That is, the connection via 191*a* is formed. An inclination angle of the connection via 191*a* is in a range of about 0° to about 45°. For example, the inclination angle of the connection via 191*a* is 15°. When the mask layer 100 is made of the photoresist, the photoresist is cleaned with acetone by means of ultrasonic waves such that the photoresist is removed. When the mask layer 100 is made of the silicon dioxide film, the silicon dioxide film is etched away with diluted hydrofluoric acid. In addition, if the dielectric layer 191 is made of the glass, the wet etching process is at a temperature of 25° C., wherein a ratio of 40% NF4F solution to 49% HF solution is in a range of 4.8:1 to 5.2:1.

In another example, for a silicon substrate with a crystal orientation (100) as the dielectric layer 191, firstly, a mask layer 100 is formed on a first surface of the dielectric layer 191 through a photolithographic process. For example, the mask layer 100 is formed of a photoresist or a silicon dioxide film. The dielectric layer 191 is placed into a vacuum chamber of a reactive ion etching device or an inductively coupled plasma etching device for the dry etching, wherein a gas pressure is in a range of 40 Pa to 60 Pa and a ratio of Cl2 gas to He gas is in a range of 3:10 to 6:10, and the dielectric layer 191 is heated to 40° C. A depth of the via increases with time, until the dielectric layer 191 is penetrated. The mask layer 100 is removed. That is, the connection via 191*a* is formed. An inclination angle of the connection via 191*a* is in a range of about 0° to about 5°. For example, the inclination angle of the connection via 191*a* is 5°. When the mask layer 100 is made of the photoresist, the photoresist is cleaned with acetone by means of ultrasonic waves such that the photoresist is removed. When the mask layer 100 is made of the silicon dioxide film, the silicon dioxide film is etched away with diluted hydrofluoric acid. In addition, if the dielectric layer 191 is made of the glass, the dry etching process is at a temperature of 25° C. and at a gas pressure in a range of 250 Pa to 450 Pa, wherein a proportion of CF4 is in a range of 80 to 100, a proportion of CHF3 is in a range of 25 to 35 and a proportion of He is in a range of 110 to 130.

S192, cleaning the dielectric layer 191, after step S191, so that residues, debris, and the like near the inner wall and an outer edge of the connection via 191*a* are washed away.

In some examples, step S192 may specifically include: placing the dielectric layer 191 into a water tank containing pure deionized water or a combination of the deionized water with a proper amount of cleaning agent (such as an oil-based cleaning agent or a water-based cleaning agent) at a temperature approximately in a range of 35° C. to 70° C., wherein the water is subjected to cavitation, acceleration and direct flow actions by means of ultrasonic waves (with a frequency approximately in a range of 10 kHz to 10 MHz), so that a pollutant layer is dispersed, emulsified and stripped to achieve the purpose of cleaning, wherein the cleaning time is approximately in a range of 2 to 20 minutes; and finally, washing the dielectric layer 191 by using the pure deionized water, and taking the dielectric layer 191 out of the water tank, and drying the dielectric layer 191 by using an air knife.

S193, forming metal films, as seed layers, within the connection via of the dielectric layer 191, and on the first surface and the second surface of the dielectric layer 191, after the step S192.

In some examples, step S193 may specifically include: depositing metal films with good conductivity, as seed layers, on the whole first surface and the whole second surface of the dielectric layer 191 through a process including, but being not limited to, a magnetron sputtering process. In addition to the magnetron sputtering process, the metal films may be formed through an electron beam evaporation process, an thermal evaporation process, or a pulsed laser sputtering process.

In some examples, a metal stack is generally used to increase the adhesion between the metal films and the dielectric layer 191. That is, the metal films include a first metal sub-layer and a second metal sub-layer sequentially arranged in a direction away from the dielectric layer 191. A material of the first metal sub-layer includes, but is not limited to, any one of titanium (Ti), molybdenum (Mo), and nickel (Ni), and a material of the second metal sub-layer includes, but is not limited to, any one of copper (Cu), silver (Ag), or gold (Au). For example, the metal films include: any one of Ti/Cu, Mo/Cu, Ni/Cu, Ti/Ag, MWAg and Ni/Ag. In the embodiment of the present disclosure, a thickness of the first metal sub-layer is in a range of about 1 nm to about 100 nm; a thickness of the second metal sub-layer is in a range of about 50 nm to about 1000 nm. In addition, a thickness of the metal film on the inner wall of the connection via 191*a* is in a range of about 1 nm to about 200 nm.

S194, filling the connection via 191*a* through an electroplating process and thickening the metal films 1920 formed on the first surface and the second surface, after the step S193, to form a first extraction electrode 19201 on the first surface and a second extraction electrode 19202 on the second surface, respectively, and a connection electrode 19203 within the connection via 191*a*.

In some examples, step S194 may specifically include: firstly, a via-filling electroplating process is performed in an electroplating bath through a reasonable combination of different types of electroplating solutions (such as a formula for filling the metal film into the connection via 191*a* and a formula for thickening the metal films on the whole surfaces), so that the metal film 1920 (such as a first metal sub-layer in the metal film 1920) is deposited on the inner wall of the connection via 191*a*, wherein an electroplating rate is in a range of 0.5 um/min to 5 um/min, and depending to an electroplating duration, the metal material may fully fill the connection via 191*a* (a thickness of the metal film is equal to 0.5 times of a diameter of the connection via 191*a*) or not fully fill the connection via 191*a*, only the inner wall of the connection via 191*a* is metallized (the thickness of the metal film is in a range of 500 nm to 10 um). That is, the connection electrode 19203 is formed. Then, the dielectric layer 191 is moved into the electroplating bath for the formula for thickening the metal films on the whole surfaces, to thicken the metal films 1920 on the first surface and the second surface through an electroplating process, respectively, wherein the electroplating metal is Cu, Ag or Au, the electroplating rate is in a range of 0.5 um/min to 5 um/min, and depending to the electroplating duration, a thickness of each of the thickened metal films 1920*a* is approximately in a range of 500 nm to 500 um. After the electroplating process, the surfaces of the dielectric layer 191 are generally undulated and uneven, which adversely affects subsequent processes. Thus, finally, a chemical mechanical polishing process is performed, such that the surfaces of the dielectric layer 191 become flat and smooth, thereby forming the first extraction electrode 19201 and the second extraction electrode 19202.

Alternatively, after the electroplating process, the thickened metal films 1920*a* on the first surface and the second surface may be patterned, to form the first extraction electrode 19201 and the second extraction electrode 19202.

Example 20

Figure 20A:
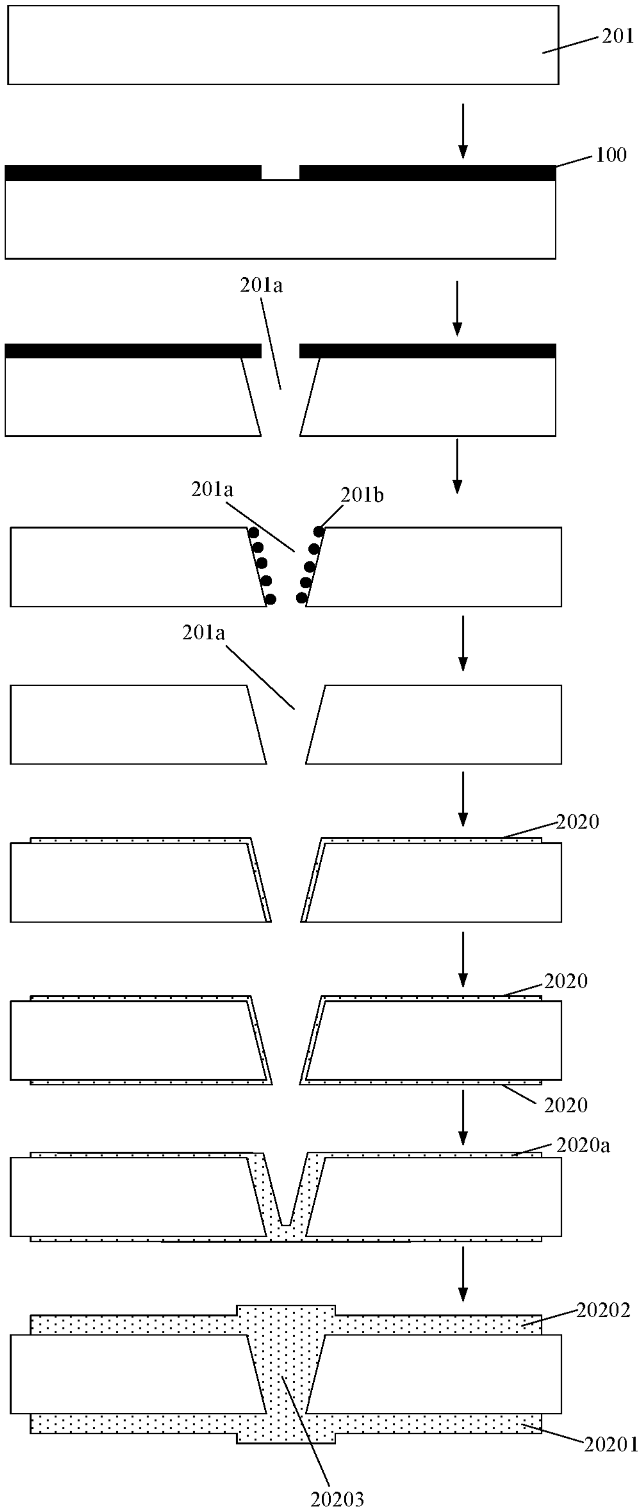
FIG. 20*a* is a flow chart of example 20 of a method for forming a conductive via according to an embodiment of the present disclosure.
Figure 20B:
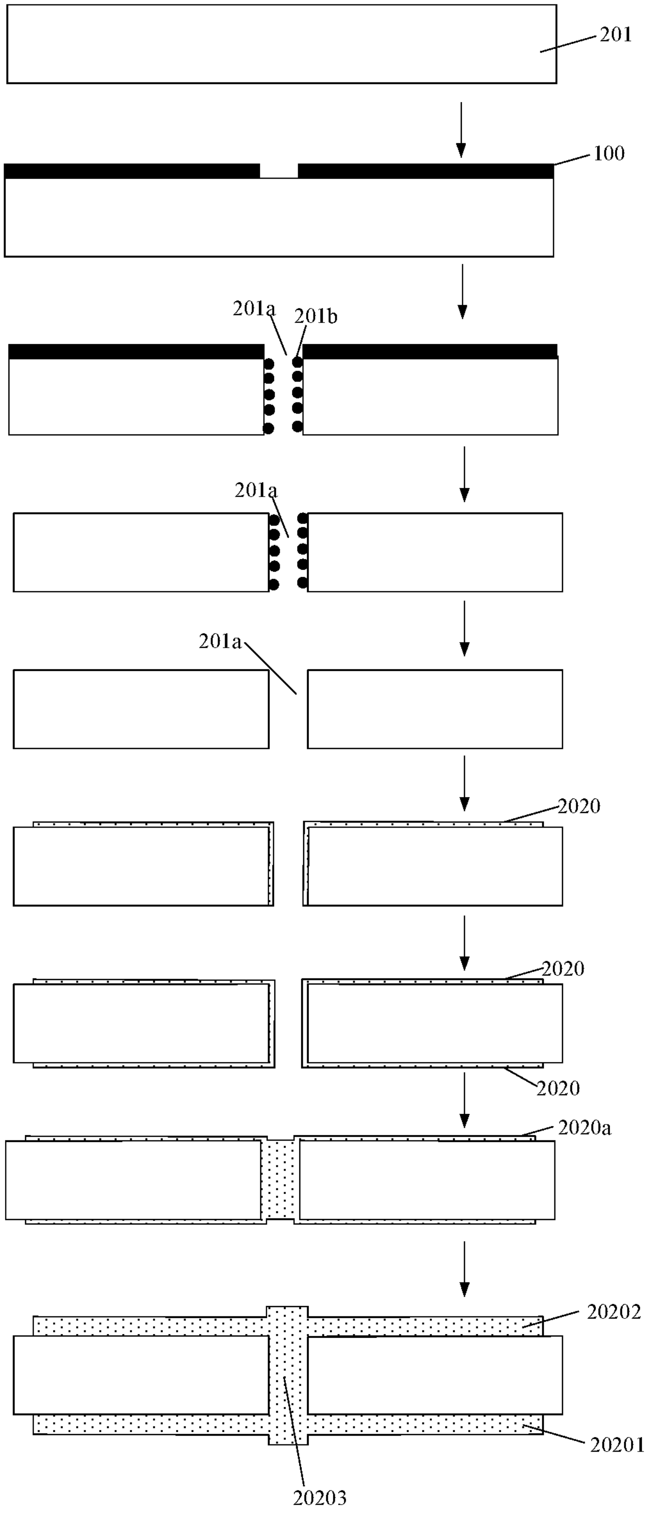
FIG. 20*b* is another flow chart of example 20 of a method for forming a conductive via according to an embodiment of the present disclosure.

FIG. 20*a* is a flow chart of example 20 of a method for forming a conductive via according to an embodiment of the present disclosure. FIG. 20*b* is another flow chart of example 20 of a method for forming a conductive via according to an embodiment of the present disclosure. As shown in FIGS. 20*a* and 20*b*, the formation method specifically includes steps of:

S201, preparing a dielectric layer 201; and forming a connection via 201*a* extending through the dielectric layer 201 through a patterning process.

In some examples, step S201 may specifically include: forming the connection via 201*a* in the dielectric layer 201 through an etching process. The etching process includes two types of etching processes, that is, a wet etching process and a dry etching process. The connection via 201*a* may be formed in the dielectric layer 201 by reasonably selecting the type of the etching process, a formula of etching liquid or a proportion of etching gas, an etching duration, a temperature and the like. It will be described below that the connection via 201*a* extending through the dielectric layer 201 is formed through the wet etching process and the dry etching process, respectively.

In one example, for a silicon substrate with a crystal orientation (100) as the dielectric layer 201, firstly, a mask layer 100 is formed on a first surface of the dielectric layer 201 through a photolithographic process. For example, the mask layer 100 is formed of a photoresist or a silicon dioxide film. The dielectric layer 201 is placed into a tetramethyl ammonium hydroxide aqueous solution at a temperature of 90° C. for the wet etching. A depth of the via increases with time, until the dielectric layer 201 is penetrated. The mask layer 100 is removed. That is, the connection via 201*a* is formed. An inclination angle of the connection via 201*a* is in a range of about 0° to about 45°. For example, the inclination angle of the connection via 201*a* is 15°. When the mask layer 100 is made of the photoresist, the photoresist is cleaned with acetone by means of ultrasonic waves such that the photoresist is removed. When the mask layer 100 is made of the silicon dioxide film, the silicon dioxide film is etched away with diluted hydrofluoric acid. In addition, if the dielectric layer 201 is made of the glass, the wet etching process is at a temperature of 25° C., wherein a ratio of 40% NF4F solution to 49% HF solution is in a range of 4.8:1 to 5.2:1.

In another example, for a silicon substrate with a crystal orientation (100) as the dielectric layer 201, firstly, a mask layer 100 is formed on a first surface of the dielectric layer 201 through a photolithographic process. For example, the mask layer 100 is formed of a photoresist or a silicon dioxide film. The dielectric layer 201 is placed into a vacuum chamber of a reactive ion etching device or an inductively coupled plasma etching device for the dry etching, wherein a gas pressure is in a range of 40 Pa to 60 Pa and a ratio of Cl2 gas to He gas is in a range of 3:10 to 6:10, and the dielectric layer 201 is heated to 40° C. A depth of the via increases with time, until the dielectric layer 201 is penetrated. The mask layer 100 is removed. That is, the connection via 201*a* is formed. An inclination angle of the connection via 201*a* is in a range of about 0° to about 5°. For example, the inclination angle of the connection via 201*a* is 5°. When the mask layer 100 is made of the photoresist, the photoresist is cleaned with acetone by means of ultrasonic waves such that the photoresist is removed. When the mask layer 100 is made of the silicon dioxide film, the silicon dioxide film is etched away with diluted hydrofluoric acid. In addition, if the dielectric layer 201 is made of the glass, the dry etching process is at a temperature of 25° C. and at a gas pressure in a range of 250 Pa to 450 Pa, wherein a proportion of CF4 is in a range of 80 to 100, a proportion of CHF3 is in a range of 25 to 35 and a proportion of He is in a range of 110 to 130.

S202, cleaning the dielectric layer 201, after step S201, so that residues, debris (201*b* shown in FIGS. 20*a* and 20*b*), and the like near the inner wall and an outer edge of the connection via 201*a* are washed away.

In some examples, step S202 may specifically include: the dielectric layer 201 is placed into a water tank, wherein the dielectric layer 201 is firstly subjected to ultrasonic cleaning to remove floating dust on a surface of the dielectric layer, the dielectric layer 201 is then immersed in a solution containing hydrofluoric acid for chemical corrosion, so that defects, such as microcrack areas Q1, stress concentration areas Q2 and the like, which are near the connection via 201*a* and in its inner wall on the dielectric layer 201 made of glass, Si or SO, may be thoroughly removed through the chemical corrosion. A content of HF in the solution is approximately in a range of 1% to 20%, and $NH_4F$ may or may not be contained in the solution. When $NH_4F$ is contained, a content of $NH_4F$ is approximately in a range of 10 to 40%, a temperature of the solution is approximately in a range of 35° C. to 60° C., a duration for the chemical corrosion is approximately in a range of 30 seconds to 5 minutes. Then, the dielectric layer 201 is thoroughly washed by the pure deionized water, and finally, is dried by the air knife. The chemically corroded connection via 201*a* has smooth inner wall and surface and does not contain the defects, such as microcrack areas Q1, stress concentration areas Q2 and the like, which is beneficial to the growth of seed layers with a high quality, the via-filling and the thickening with metal.

S203, forming metal films 2020, as seed layers, within the connection via 201a of the dielectric layer 201, and on the first surface and the second surface of the dielectric layer 201, after the step S202.

In some examples, step S203 may specifically include: depositing metal films 2020 with good conductivity, as seed layers, on the whole first surface and the whole second surface of the dielectric layer 201 through a process including, but being not limited to, a magnetron sputtering process. In addition to the magnetron sputtering process, the metal films 2020 may be formed through an electron beam evaporation process, an thermal evaporation process, or a pulsed laser sputtering process.

In some examples, a metal stack is generally used to increase the adhesion between the metal films and the dielectric layer 201. That is, the metal films include a first metal sub-layer and a second metal sub-layer sequentially arranged in a direction away from the dielectric layer 201. A material of the first metal sub-layer includes, but is not limited to, any one of titanium (Ti), molybdenum (Mo), and nickel (Ni), and a material of the second metal sub-layer includes, but is not limited to, any one of copper (Cu), silver (Ag), or gold (Au). For example, the metal films include: any one of Ti/Cu, Mo/Cu, Ni/Cu, Ti/Ag, Mo/Ag and Ni/Ag. In the embodiment of the present disclosure, a thickness of the first metal sub-layer is in a range of about 1 nm to about 100 nm; a thickness of the second metal sub-layer is in a range of about 50 nm to about 1000 nm. In addition, a thickness of the metal film on the inner wall of the connection via 201a is in a range of about 1 nm to about 200 nm.

S204, filling the connection via 201a through an electroplating process and thickening the metal films 2020 formed on the first surface and the second surface, after the step S203, to form a first extraction electrode 20201 on the first surface and a second extraction electrode 20202 on the second surface, respectively, and a connection electrode 20203 within the connection via 201a.

In some examples, step S204 may specifically include: firstly, a via-filling electroplating process is performed in an electroplating bath through a reasonable combination of different types of electroplating solutions (such as a formula for filling the metal film into the connection via 201a and a formula for thickening the metal films on the whole surfaces), so that the metal film 2020 (such as a first metal sub-layer in the metal film 2020) is deposited on the inner wall of the connection via 201a, wherein an electroplating rate is in a range of 0.5 um/min to 5 um/min, and depending to an electroplating duration, the metal material may fully fill the connection via 201a (a thickness of the metal film is equal to 0.5 times of a diameter of the connection via 201a) or not fully fill the connection via 201a, only the inner wall of the connection via 201a is metallized (the thickness of the metal film is in a range of 500 nm to 10 um). That is, the connection electrode 20203 is formed. Then, the dielectric layer 201 is moved into the electroplating bath for the formula for thickening the metal films on the whole surfaces, to thicken the metal films 2020 on the first surface and the second surface through an electroplating process, respectively, wherein the electroplating metal is Cu, Ag or Au, the electroplating rate is in a range of 0.5 um/min to 5 um/min, and depending to the electroplating duration, a thickness of each of the thickened metal films 2020a is approximately in a range of 500 nm to 500 um. After the electroplating process, the surfaces of the dielectric layer 201 are generally undulated and uneven, which adversely affects subsequent processes. Thus, finally, a chemical mechanical polishing process is performed, such that the surfaces of the dielectric layer 201 become flat and smooth, thereby forming the first extraction electrode 20201 and the second extraction electrode 20202.

Alternatively, after the electroplating process, the thickened metal films 2020a on the first surface and the second surface may be patterned, to form the first extraction electrode 20201 and the second extraction electrode 20202.

Example 21

Figure 21A:
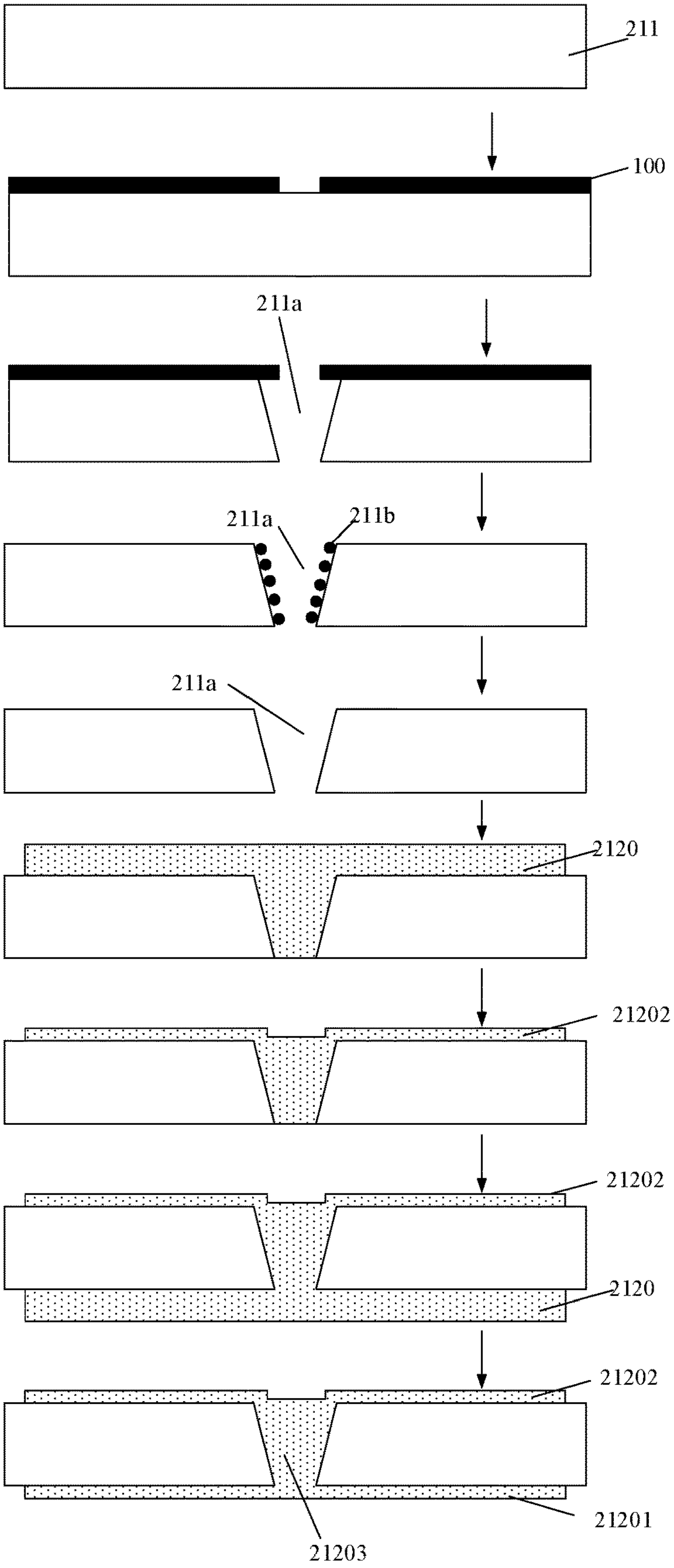
FIG. 21*a* is a flow chart of example 21 of a method for forming a conductive via according to an embodiment of the present disclosure.
Figure 21B:
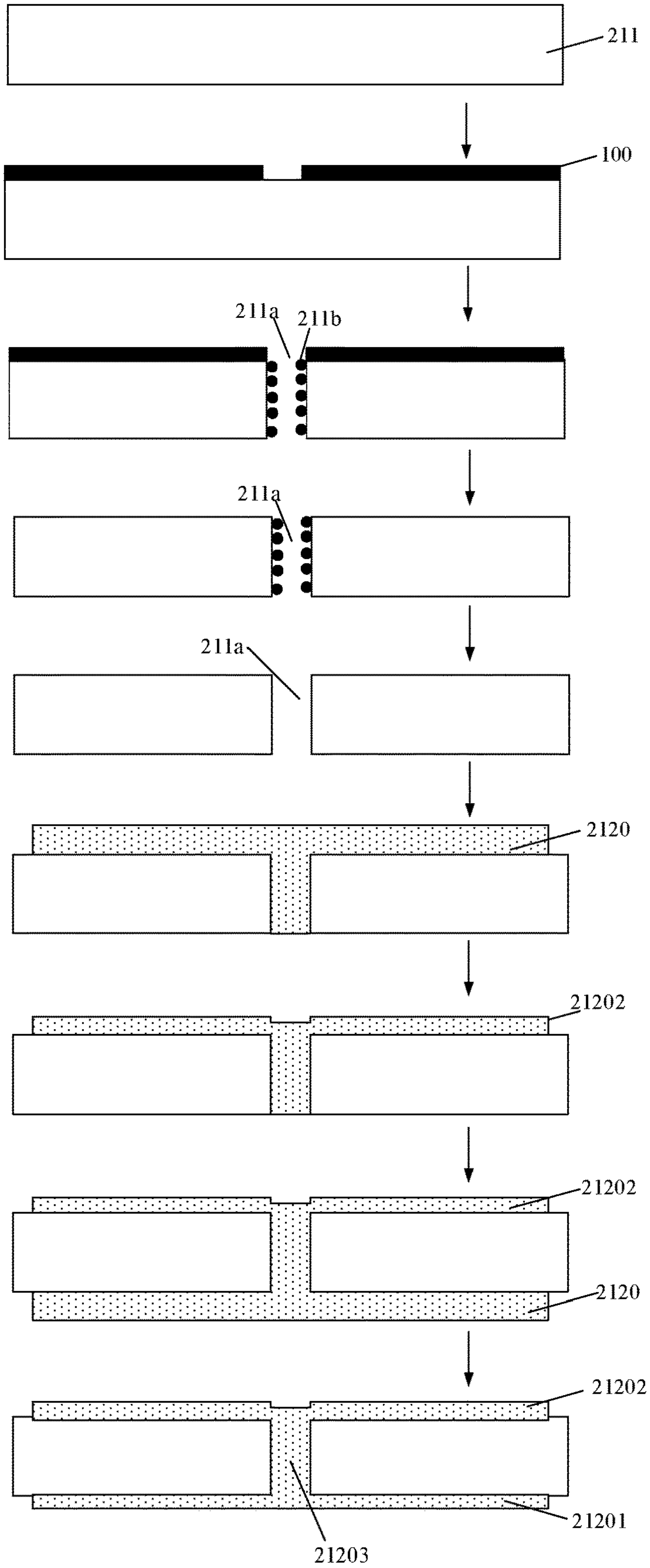
FIG. 21*b* is another flow chart of example 21 of a method for forming a conductive via according to an embodiment of the present disclosure.

FIG. 21a is a flow chart of example 21 of a method for forming a conductive via according to an embodiment of the present disclosure. FIG. 21b is another flow chart of example 21 of a method for forming a conductive via according to an embodiment of the present disclosure. As shown in FIGS. 21a and 21b, the formation method specifically includes steps of:

S211, preparing a dielectric layer 211; and forming a connection via 211a extending through the dielectric layer 211 through a patterning process.

In some examples, step S211 may specifically include: forming the connection via 211a in the dielectric layer 211 through an etching process. The etching process includes two types of etching processes, that is, a wet etching process and a dry etching process. The connection via 211a may be formed in the dielectric layer 211 by reasonably selecting the type of the etching process, a formula of etching liquid or a proportion of etching gas, an etching duration, a temperature and the like. It will be described below that the connection via 211a extending through the dielectric layer 211 is formed through the wet etching process and the dry etching process, respectively.

In one example, for a silicon substrate with a crystal orientation (100) as the dielectric layer 211, firstly, a mask layer 100 is formed on a first surface of the dielectric layer 211 through a photolithographic process. For example, the mask layer 100 is formed of a photoresist or a silicon dioxide film. The dielectric layer 211 is placed into a tetramethyl ammonium hydroxide aqueous solution at a temperature of 90° C. for the wet etching. A depth of the via increases with time, until the dielectric layer 211 is penetrated. The mask layer 100 is removed. That is, the connection via 211a is formed. An inclination angle of the connection via 211a is in a range of about 0° to about 45°. For example, the inclination angle of the connection via 211a is 15°. When the mask layer 100 is made of the photoresist, the photoresist is cleaned with acetone by means of ultrasonic waves such that the photoresist is removed. When the mask layer 100 is made of the silicon dioxide film, the silicon dioxide film is etched away with diluted hydrofluoric acid. In addition, if the dielectric layer 211 is made of the glass, the wet etching process is at a temperature of 25° C., wherein a ratio of 40% $NF_4F$ solution to 49% HF solution is in a range of 4.8:1 to 5.2:1.

In another example, for a silicon substrate with a crystal orientation (100) as the dielectric layer 211, firstly, a mask layer 100 is formed on a first surface of the dielectric layer 211 through a photolithographic process. For example, the mask layer 100 is formed of a photoresist or a silicon dioxide film. The dielectric layer 211 is placed into a vacuum chamber of a reactive ion etching device or an inductively coupled plasma etching device for the dry etching, wherein a gas pressure is in a range of 40 Pa to 60 Pa and a ratio of Cl2 gas to He gas is in a range of 3:10 to 6:10, and the dielectric layer 211 is heated to 40° C. A depth of the via increases with time, until the dielectric layer 211 is penetrated. The mask layer 100 is removed. That is, the connection via 211a is formed. An inclination angle of the connection via 211a is in a range of about 0° to about 5°. For example, the inclination angle of the connection via 211a is 5°. When the mask layer 100 is made of the photoresist, the photoresist is cleaned with acetone by means of ultrasonic waves such that the photoresist is removed. When the mask layer 100 is made of the silicon dioxide film, the silicon dioxide film is etched away with diluted hydrofluoric acid. In addition, if the dielectric layer 211 is made of the glass, the dry etching process is at a temperature of 25° C. and at a gas pressure in a range of 250 Pa to 450 Pa, wherein a proportion of CF4 is in a range of 80 to 100, a proportion of CHF3 is in a range of 25 to 35 and a proportion of He is in a range of 110 to 130.

S212, cleaning the dielectric layer 211, after step S211, so that residues, debris (211b shown in FIGS. 21a and 21b), and the like near the inner wall and an outer edge of the connection via 211a are washed away.

In some examples, step S212 may specifically include: placing the dielectric layer 211 into a water tank containing pure deionized water or a combination of the deionized water with a proper amount of cleaning agent (such as an oil-based cleaning agent or a water-based cleaning agent) at a temperature approximately in a range of 35° C. to 70° C., wherein the water is subjected to cavitation, acceleration and direct flow actions by means of ultrasonic waves (with a frequency approximately in a range of 10 kHz to 10 MHz), so that a pollutant layer is dispersed, emulsified and stripped to achieve the purpose of cleaning, wherein the cleaning time is approximately in a range of 2 to 20 minutes; and finally, washing the dielectric layer 211 by using the pure deionized water, and taking the dielectric layer 211 out of the water tank, and drying the dielectric layer 211 by using an air knife.

S213, after the step S212, applying a metal paste 2120 into the connection via 211a of the dielectric layer 211, and forming the metal paste 2120 on the first surface and the second surface of the dielectric layer 211; and then, curing the metal paste 2120 on the first surface and the second surface, respectively, to form a connection electrode 21203 filled in the connection via 211a, a first extraction electrode 21201 on the first surface and a second extraction electrode 21202 on the second surface.

In some examples, the metal paste 2120 may be a conductive paste. A material of the conductive paste includes, but is not limited to, a low-temperature curing type polymer conductive paste, and main components of the conductive paste include conductive particles, a resin, a curing agent, a dispersant, a diluent, an adhesion enhancer, and an anti-settling agent. The conductive particles may be selected from Cu, Ag and Au, and a size of each particle is approximately in a range of 1 nm to 100 um. The resin may be bisphenol epoxy resin. The curing agent may be acid anhydrides. The dispersant may be methylimidazole. The diluent may be butyl acetate. The adhesion enhancer may be tetraethyl titanate. The anti-settling agent may be polyamides.

Step S213 may specifically include: firstly, coating the conductive paste in the connection via 211a and around an edge of the connection via 211a on the second surface, and then, performing solvent drying and thermocuring processes on the second surface of the dielectric layer 211 to form the connection electrode 21203 filled in the connection via 211a and the second extraction electrode 21202 located on the second surface; then, coating the conductive paste around an edge of the connection via 211a on the first surface of the dielectric layer 211, and then, performing solvent drying and thermocuring processes on the first surface of the dielectric layer 211 to form the first extraction electrode 21201 located on the first surface. The preferred mode for coating the conductive paste includes, but is not limited to, screen printing, ink-jet printing, slit coating or the like. A vacuum adsorption machine is used in cooperation when the conductive paste is coated, so that the coating efficiency may be improved, and a distribution profile of the conductive paste on the wall and the edge of the connection via may be improved. The solvent drying process may be performed under an atmospheric pressure of air, an atmospheric pressure of N2 or the vacuum, at a temperature in a range of about 40° C. to about 95° C., for a duration in a range of about 1 min to about 30 min. The thermocuring process may be performed in an oven, under the atmosphere of N2, at a heating temperature in a range of about 140° C. to about 200° C. Alternatively, the curing process may be performed by means of illumination with laser beams, which have a wavelength in a range of about 500 nm to about 1510 nm, a laser power in a range of 50 mW to 50 W, and a beam diameter in a range of about 10 um to about 2000 um, and the laser beams may be a single beam or multiple beams.

Example 22

Figure 22A:
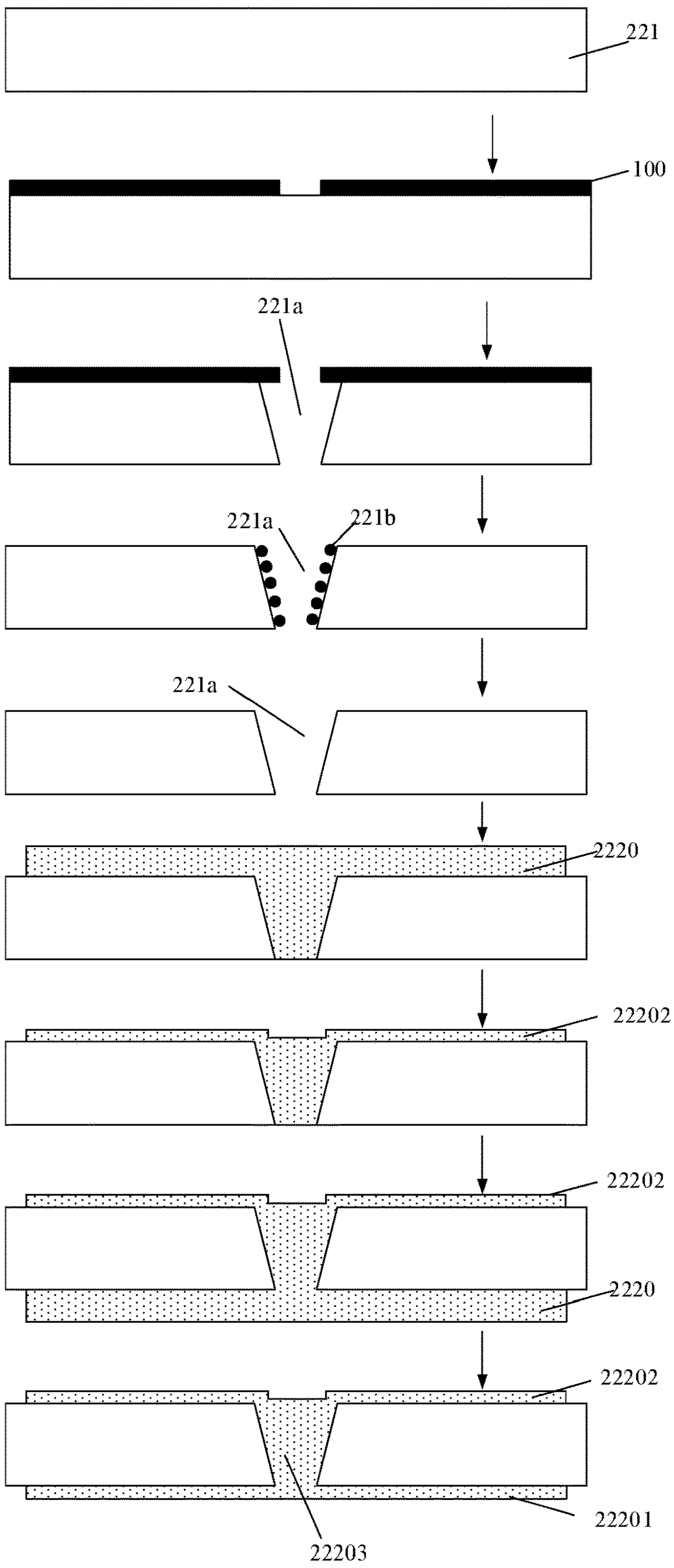
FIG. 22*a* is a flow chart of example 22 of a method for forming a conductive via according to an embodiment of the present disclosure.
Figure 22B:
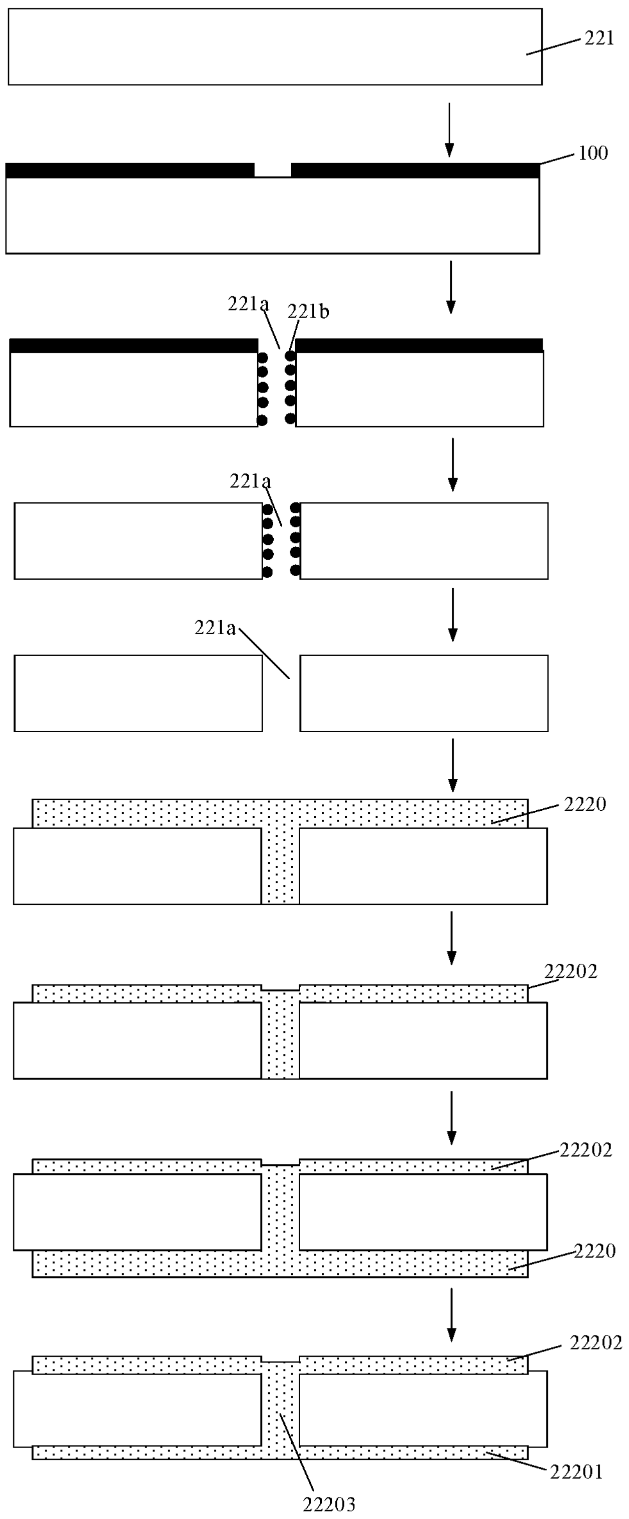
FIG. 22*b* is another flow chart of example 22 of a method for forming a conductive via according to an embodiment of the present disclosure.

FIG. 22a is a flow chart of example 22 of a method for forming a conductive via according to an embodiment of the present disclosure. FIG. 22b is another flow chart of example 22 of a method for forming a conductive via according to an embodiment of the present disclosure. As shown in FIGS. 22a and 22b, the formation method specifically includes steps of:

S221, preparing a dielectric layer 221; and forming a connection via 221a extending through the dielectric layer 221 through a patterning process.

In some examples, step S221 may specifically include: forming the connection via 221a in the dielectric layer 221 through an etching process. The etching process includes two types of etching processes, that is, a wet etching process and a dry etching process. The connection via 221a may be formed in the dielectric layer 221 by reasonably selecting the type of the etching process, a formula of etching liquid or a proportion of etching gas, an etching duration, a temperature and the like. It will be described below that the connection via 221a extending through the dielectric layer 221 is formed through the wet etching process and the dry etching process, respectively.

In one example, for a silicon substrate with a crystal orientation (100) as the dielectric layer 221, firstly, a mask layer 100 is formed on a first surface of the dielectric layer 221 through a photolithographic process. For example, the mask layer 100 is formed of a photoresist or a silicon dioxide film. The dielectric layer 221 is placed into a tetramethyl ammonium hydroxide aqueous solution at a temperature of 90° C. for the wet etching. A depth of the via increases with time, until the dielectric layer 221 is penetrated. The mask layer 100 is removed. That is, the connection via 221a is formed. An inclination angle of the connection via 221a is in a range of about 0° to about 45°. For example, the inclination angle of the connection via 221a is 15°. When the mask layer 100 is made of the photoresist, the photoresist is cleaned with acetone by means of ultrasonic waves such that the photoresist is removed. When the mask layer 100 is made of the silicon dioxide film, the silicon dioxide film is etched away with diluted hydrofluoric acid. In addition, if the dielectric layer 221 is made of the glass, the wet etching process is at a temperature of 25° C., wherein a ratio of 40% NF4F solution to 49% HF solution is in a range of 4.8:1 to 5.2:1.

In another example, for a silicon substrate with a crystal orientation (100) as the dielectric layer 221, firstly, a mask layer 100 is formed on a first surface of the dielectric layer 221 through a photolithographic process. For example, the mask layer 100 is formed of a photoresist or a silicon dioxide film. The dielectric layer 221 is placed into a vacuum chamber of a reactive ion etching device or an inductively coupled plasma etching device for the dry etching, wherein a gas pressure is in a range of 40 Pa to 60 Pa and a ratio of Cl2 gas to He gas is in a range of 3:10 to 6:10, and the dielectric layer 221 is heated to 40° C. A depth of the via increases with time, until the dielectric layer 221 is penetrated. The mask layer 100 is removed. That is, the connection via 221*a* is formed. An inclination angle of the connection via 221*a* is in a range of about 0° to about 5°. For example, the inclination angle of the connection via 221*a* is 5°. When the mask layer 100 is made of the photoresist, the photoresist is cleaned with acetone by means of ultrasonic waves such that the photoresist is removed. When the mask layer 100 is made of the silicon dioxide film, the silicon dioxide film is etched away with diluted hydrofluoric acid. In addition, if the dielectric layer 221 is made of the glass, the dry etching process is at a temperature of 25° C. and at a gas pressure in a range of 250 Pa to 450 Pa, wherein a proportion of CF4 is in a range of 80 to 100, a proportion of CHF3 is in a range of 25 to 35 and a proportion of He is in a range of 110 to 130.

S222, cleaning the dielectric layer 221, after step S221, so that residues, debris (221*b* shown in FIGS. 22*a* and 22*b*), and the like near the inner wall and an outer edge of the connection via 221*a* are washed away.

In some examples, step S222 may specifically include: the dielectric layer 221 is placed into a water tank, wherein the dielectric layer 221 is firstly subjected to ultrasonic cleaning to remove floating dust on a surface of the dielectric layer; the dielectric layer 221 is then immersed in a solution containing hydrofluoric acid for chemical corrosion, so that defects, such as microcrack areas Q1, stress concentration areas Q2 and the like, which are near the connection via 221*a* and in its inner wall on the dielectric layer 221 made of glass, Si or SOI, may be thoroughly removed through the chemical corrosion. A content of HF in the solution is approximately in a range of 1% to 20%, and $NH_4F$ may or may not be contained in the solution. When $NH_4F$ is contained, a content of $NH_4F$ is approximately in a range of 10 to 40%, a temperature of the solution is approximately in a range of 35° C. to 60° C., a duration for the chemical corrosion is approximately in a range of 30 seconds to 5 minutes. Then, the dielectric layer 221 is thoroughly washed by the pure deionized water, and finally, is dried by the air knife. The chemically corroded connection via 221*a* has smooth inner wall and surface and does not contain the defects, such as microcrack areas Q1, stress concentration areas Q2 and the like.

S223, after the step S222, applying a metal paste 2220 into the connection via 221*a* of the dielectric layer 221, and forming the metal paste 2220 on the first surface and the second surface of the dielectric layer 221; and then, curing the metal paste 2220 on the first surface and the second surface, respectively, to form a connection electrode 22203 filled in the connection via 221*a*, a first extraction electrode 22201 on the first surface and a second extraction electrode 22202 on the second surface.

In some examples, the metal paste 2220 may be a conductive paste. A material of the conductive paste includes, but is not limited to, a low-temperature curing type polymer conductive paste, and main components of the conductive paste include conductive particles, a resin, a curing agent, a dispersant, a diluent, an adhesion enhancer, and an anti-settling agent. The conductive particles may be selected from Cu, Ag and Au, and a size of each particle is approximately in a range of 1 nm to 100 um. The resin may be bisphenol epoxy resin. The curing agent may be acid anhydrides. The dispersant may be methylimidazole. The diluent may be butyl acetate. The adhesion enhancer may be tetraethyl titanate. The anti-settling agent may be polyamides.

Step S223 may specifically include: firstly, coating the conductive paste in the connection via 221*a* and around an edge of the connection via 221*a* on the second surface, and then, performing solvent drying and thermocuring processes on the second surface of the dielectric layer 221 to form the connection electrode 22203 filled in the connection via 221*a* and the second extraction electrode 22202 located on the second surface; then, coating the conductive paste around an edge of the connection via 221*a* on the first surface of the dielectric layer 221, and then, performing solvent drying and thermocuring processes on the first surface of the dielectric layer 221 to form the first extraction electrode 22201 located on the first surface. The preferred mode for coating the conductive paste includes, but is not limited to, screen printing, ink-jet printing, slit coating or the like. A vacuum adsorption machine is used in cooperation when the conductive paste is coated, so that the coating efficiency may be improved, and a distribution profile of the conductive paste on the wall and the edge of the connection via may be improved. The solvent drying process may be performed under an atmospheric pressure of air, an atmospheric pressure of N2 or the vacuum, at a temperature in a range of about 40° C. to about 95° C., for a duration in a range of about 1 min to about 30 min. The thermocuring process may be performed in an oven, under the atmosphere of N2, at a heating temperature in a range of about 140° C. to about 200° C. Alternatively, the curing process may be performed by means of illumination with laser beams, which have a wavelength in a range of about 500 nm to about 1510 nm, a laser power in a range of 50 mW to 50 W, and a beam diameter in a range of about 10 um to about 2000 um, and the laser beams may be a single beam or multiple beams.

Example 23

Figure 23A:
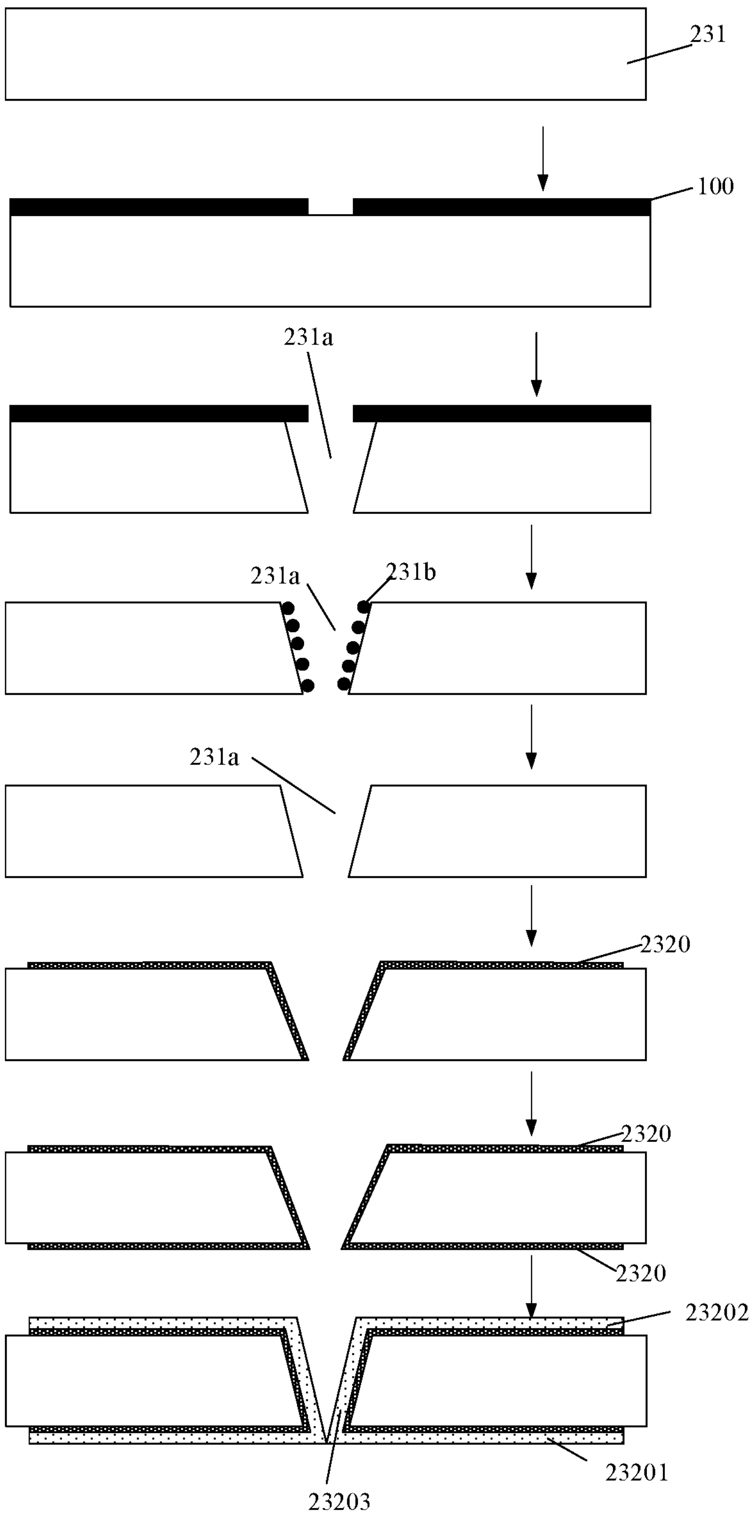
FIG. 23*a* is a flow chart of example 23 of a method for forming a conductive via according to an embodiment of the present disclosure.
Figure 23B:
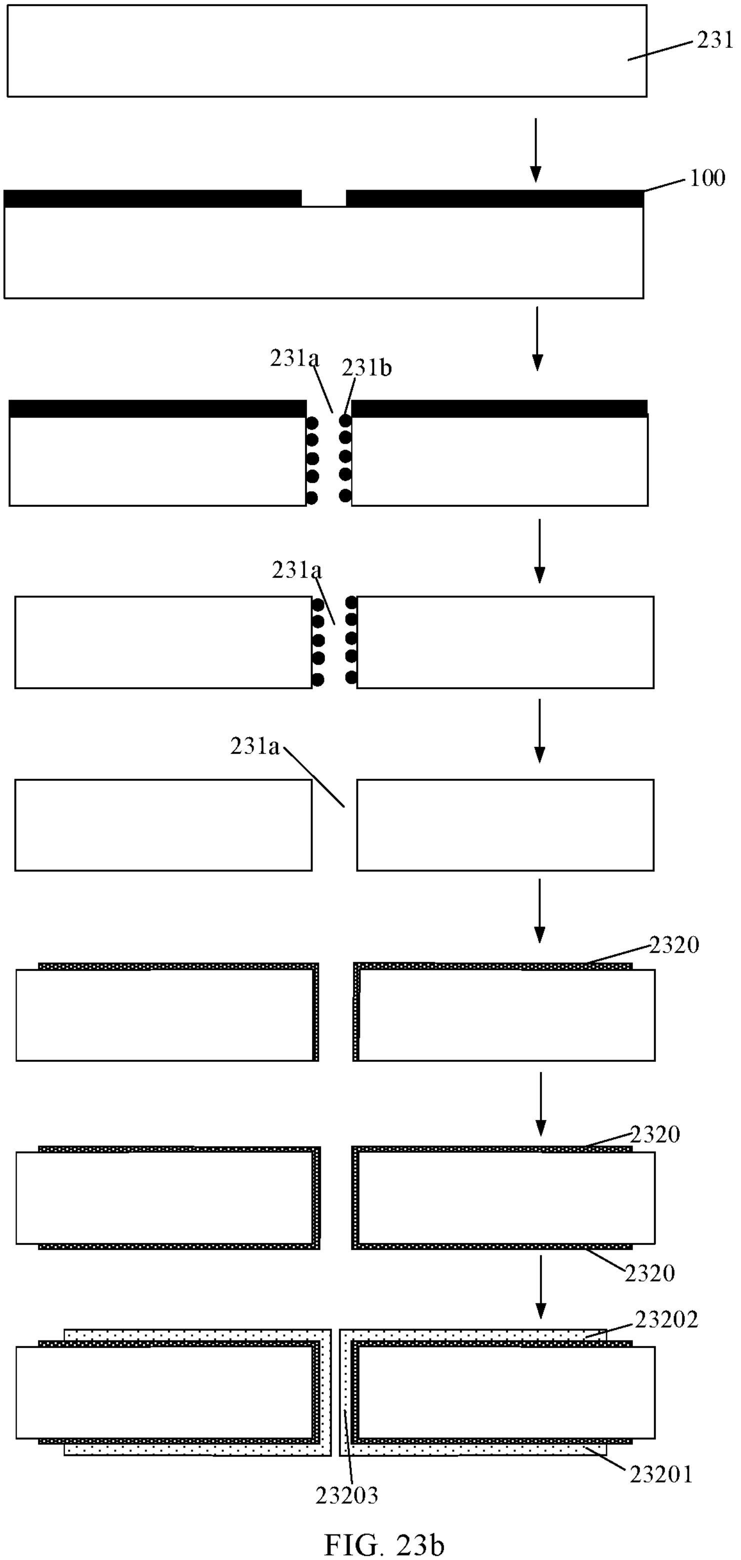
FIG. 23*b* is another flow chart of example 23 of a method for forming a conductive via according to an embodiment of the present disclosure.

FIG. 23*a* is a flow chart of example 23 of a method for forming a conductive via according to an embodiment of the present disclosure. FIG. 23*b* is another flow chart of example 23 of a method for forming a conductive via according to an embodiment of the present disclosure. As shown in FIGS. 23*a* and 23*b*, the formation method specifically includes steps of:

S231, preparing a dielectric layer 231; and forming a connection via 231*a* extending through the dielectric layer 231 through a patterning process.

In some examples, step S231 may specifically include: forming the connection via 231*a* in the dielectric layer 231 through an etching process. The etching process includes two types of etching processes, that is, a wet etching process and a dry etching process. The connection via 231*a* may be formed in the dielectric layer 231 by reasonably selecting the type of the etching process, a formula of etching liquid or a proportion of etching gas, an etching duration, a temperature and the like. It will be described below that the connection via 231*a* extending through the dielectric layer 231 is formed through the wet etching process and the dry etching process, respectively.

In one example, for a silicon substrate with a crystal orientation (100) as the dielectric layer 231, firstly, a mask layer 100 is formed on a first surface of the dielectric layer 231 through a photolithographic process. For example, the mask layer 100 is formed of a photoresist or a silicon dioxide film. The dielectric layer 231 is placed into a tetramethyl ammonium hydroxide aqueous solution at a temperature of 90° C. for the wet etching. A depth of the via increases with time, until the dielectric layer 231 is penetrated. The mask layer 100 is removed. That is, the connection via 231*a* is formed. An inclination angle of the connection via 231*a* is in a range of about 0° to about 45°. For example, the inclination angle of the connection via 231*a* is 15°. When the mask layer 100 is made of the photoresist, the photoresist is cleaned with acetone by means of ultrasonic waves such that the photoresist is removed. When the mask layer 100 is made of the silicon dioxide film, the silicon dioxide film is etched away with diluted hydrofluoric acid. In addition, if the dielectric layer 231 is made of the glass, the wet etching process is at a temperature of 25° C., wherein a ratio of 40% NF4F solution to 49% HF solution is in a range of 4.8:1 to 5.2:1.

In another example, for a silicon substrate with a crystal orientation (100) as the dielectric layer 231, firstly, a mask layer 100 is formed on a first surface of the dielectric layer 231 through a photolithographic process. For example, the mask layer 100 is formed of a photoresist or a silicon dioxide film. The dielectric layer 231 is placed into a vacuum chamber of a reactive ion etching device or an inductively coupled plasma etching device for the dry etching, wherein a gas pressure is in a range of 40 Pa to 60 Pa and a ratio of Cl2 gas to He gas is in a range of 3:10 to 6:10, and the dielectric layer 231 is heated to 40° C. A depth of the via increases with time, until the dielectric layer 191 is penetrated. The mask layer 100 is removed. That is, the connection via 231*a* is formed. An inclination angle of the connection via 231*a* is in a range of about 0° to about 5°. For example, the inclination angle of the connection via 231*a* is 5°. When the mask layer 100 is made of the photoresist, the photoresist is cleaned with acetone by means of ultrasonic waves such that the photoresist is removed. When the mask layer 100 is made of the silicon dioxide film, the silicon dioxide film is etched away with diluted hydrofluoric acid. In addition, if the dielectric layer 231 is made of the glass, the dry etching process is at a temperature of 25° C. and at a gas pressure in a range of 250 Pa to 450 Pa, wherein a proportion of CF4 is in a range of 80 to 100, a proportion of CHF3 is in a range of 25 to 35 and a proportion of He is in a range of 110 to 130.

S232, cleaning the dielectric layer 231, after step S231, so that residues, debris (231*b* shown in FIGS. 23*a* and 23*b*), and the like near the inner wall and an outer edge of the connection via 231*a* are washed away.

In some examples, step S232 may specifically include: placing the dielectric layer 231 into a water tank containing pure deionized water or a combination of the deionized water with a proper amount of cleaning agent (such as an oil-based cleaning agent or a water-based cleaning agent) at a temperature approximately in a range of 35° C. to 70° C., wherein the water is subjected to cavitation, acceleration and direct flow actions by means of ultrasonic waves (with a frequency approximately in a range of 10 kHz to 10 MHz), so that a pollutant layer is dispersed, emulsified and stripped to achieve the purpose of cleaning, wherein the cleaning time is approximately in a range of 2 to 20 minutes; and finally, washing the dielectric layer 231 by using the pure deionized water, and taking the dielectric layer 231 out of the water tank, and drying the dielectric layer 231 by using an air knife.

S233, forming a chemical plating medium 2320 on the first surface and the second surface of the dielectric layer 231 provided with the connection via 231*a* after the step S232.

In some examples, step S233 may specifically include: placing the dielectric layer 231, in a spraying mode or directly, into a water tank containing a solution of the chemical plating medium 2320, so that a layer of $Sn^{2+}$ is adsorbed on surfaces of the dielectric layer 231. The solution of the chemical plating medium 2320 mainly contains $SnCl_2$ of 10 g/L to 30 g/L, concentrated hydrochloric acid (having a concentration of 38%) of 20 ml/L to 60 ml/L and deionized water. A less number of Sn particles are added into the solution to prevent the $Sn^{2+}$ from being oxidated. Then, the dielectric layer 231 is placed, in a spraying mode or directly, into a water tank containing an activation solution, so that surfaces of the dielectric layer 231 reacts with the activation solution (mainly containing $SnCl_2$ of 80 g/L to 120 g/L, concentrated hydrochloric acid of 300 ml/L to 500 ml/L, $Na_2SnO_3$ of 10 g/L to 20 g/L, $PdCl_2$ of 1 g/L to 4 g/L and deionized water), to generate metal palladium particles which are tightly attached to the surfaces of the dielectric layer 231. That is, the chemical plating medium 2320 is formed on the first surface and the second surface of the dielectric layer 231 provided with the connection via 231*a*.

S234, after the step S233, performing a chemical plating process on the dielectric layer 231 with the chemical plating medium 2320 to form metal films on the first surface and the second surface of the dielectric layer 231, and in the connection via 231*a*, and patterning the metal films formed on the first surface and the second surface of the dielectric layer 231, for forming a first extraction electrode 23201 and a second extraction electrode 23202, and a connection electrode 23203 in the connection via 231*a*.

In some examples, the chemically plated metal films may be a single-layer metal film or may be metal films stacked together. For example: only a Cu metal film is plated to form a single-layer metal film (having a thickness in a range of about 1 um to about 100 um). Alternatively, it is also possible to firstly plate a Ni metal film (having a thickness in a range of about 10 um to about 100 um), and then a Cu metal film (having a thickness in a range of about 1 um to about 100 um), wherein the Ni metal film is used to increase the adhesion of the Cu metal film. In the embodiment of the present disclosure, as an example, a material of the single-layer metal film is Cu, and a material of metal films stacked together is Ni/Cu, which does not limit the scope of the embodiment of the present disclosure. It will be described below by taking an example in which Ni/Cu metal films are chemically plated.

In some examples, step S234 may specifically include: placing the dielectric layer 231 into the chemical plating solution, and sequentially performing the chemical plating process with metal Ni and Cu. Then, the metal films formed on the first surface and the second surface of the dielectric layer 231 are patterned, for forming the first extraction electrode 23201 and the second extraction electrode 23202, and the connection electrode 23203 in the connection via 231*a*. The Ni solution for the chemical plating generally contains NiSO4·6H2O of 10 g/L to 30 g/L, NaH2PO4·2H2O 20 g/L to 40 g/L, Na-Citrate of 5 g/L to 15 g/L and NH4Cl of 20 g/L to 40 g/L, the solution is alkaline, has a PH in a range of 8.0 to 10.0 and a temperature in a range of 75° C. to 90° C. The Cu solution for the chemical plating generally contains KNaC4H406 of 30 g/L to 50 g/L, NaOH of 8 g/L to 10 g/L, Na2CO3 of 38 g/L to 40 g/L, CuSO4 of 10 g/L to 20 g/L, NiCl2 of 2 g/L to 6 g/L and formaldehyde of 40 ml/L to 60 ml/L with a concentration of 35%, the solution is alkaline, has a PH in a range of 11.0 to 14.0 and a temperature in a range of 55° C. to 65° C.

Example 24

Figure 24A:
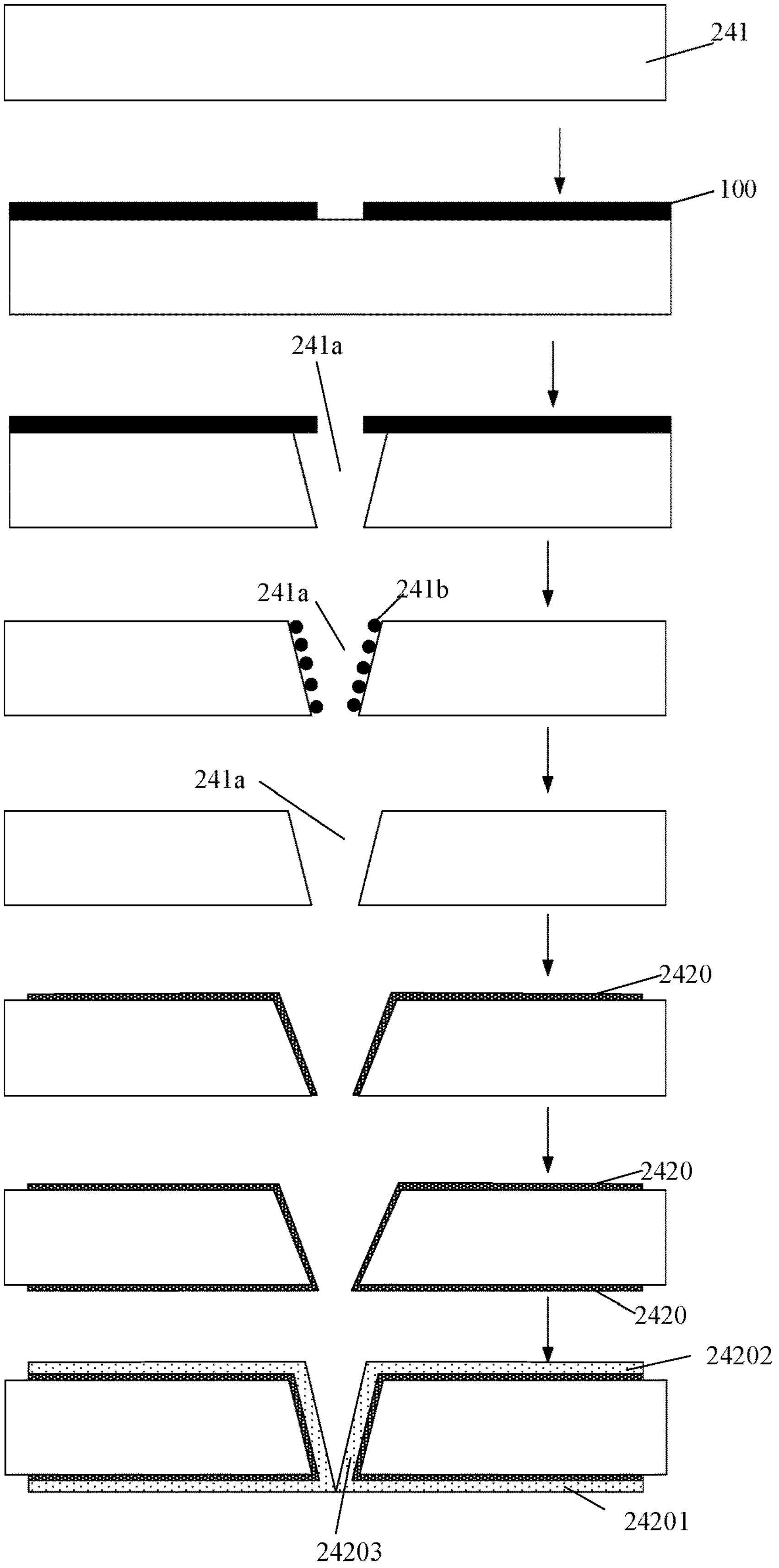
FIG. 24*a* is a flow chart of example 24 of a method for forming a conductive via according to an embodiment of the present disclosure.
Figure 24B:
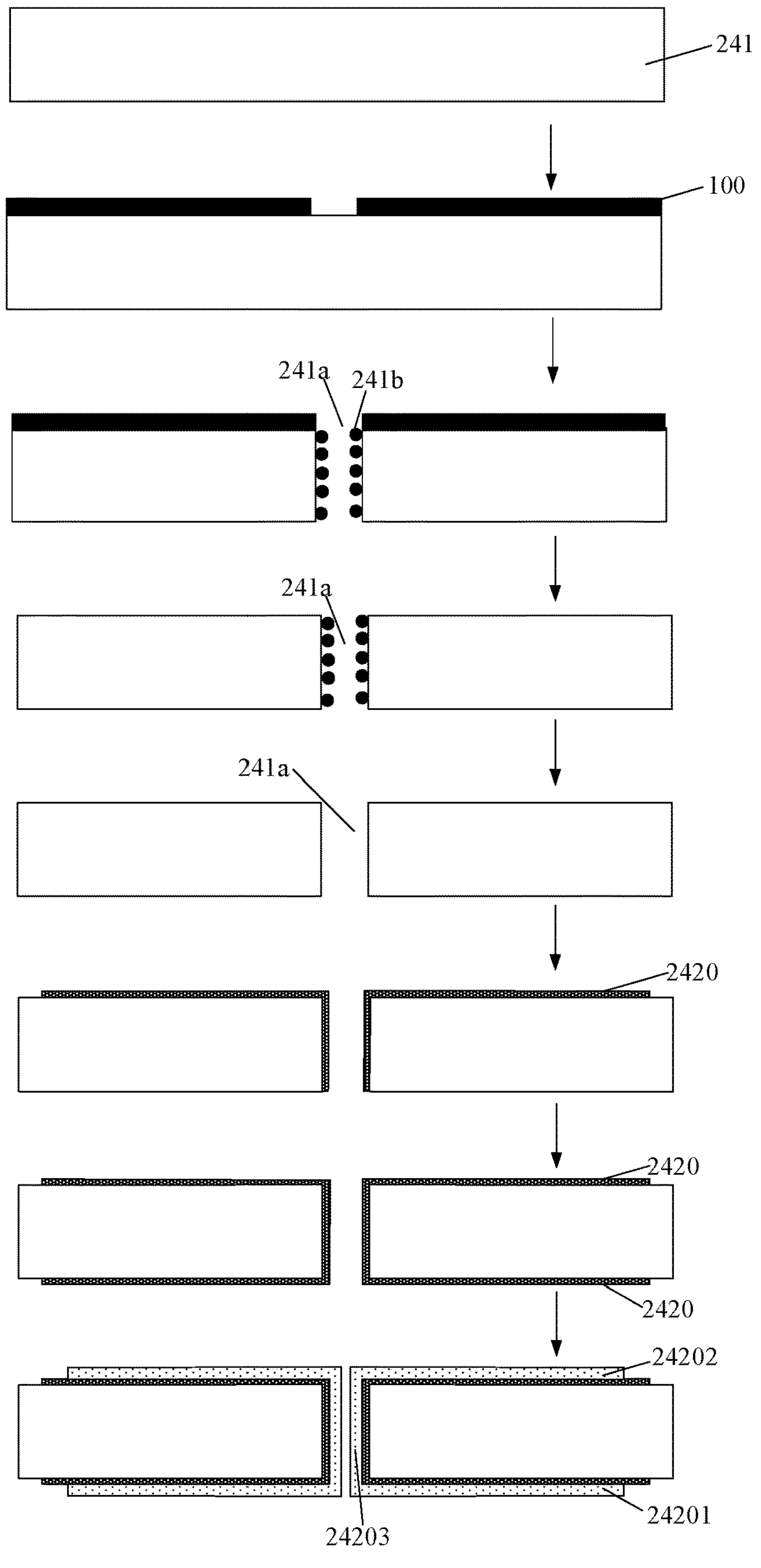
FIG. 24*b* is another flow chart of example 24 of a method for forming a conductive via according to an embodiment of the present disclosure.

FIG. 24*a* is a flow chart of example 24 of a method for forming a conductive via according to an embodiment of the present disclosure. FIG. 24*b* is another flow chart of example 24 of a method for forming a conductive via according to an embodiment of the present disclosure. As shown in FIGS. 24*a* and 24*b*, the formation method specifically includes steps of:

S241, preparing a dielectric layer 241; and forming a connection via 241*a* extending through the dielectric layer 241 through a patterning process.

In some examples, step S241 may specifically include: forming the connection via 241*a* in the dielectric layer 241 through an etching process. The etching process includes two types of etching processes, that is, a wet etching process and a dry etching process. The connection via 241*a* may be formed in the dielectric layer 241 by reasonably selecting the type of the etching process, a formula of etching liquid or a proportion of etching gas, an etching duration, a temperature and the like. It will be described below that the connection via 241*a* extending through the dielectric layer 241 is formed through the wet etching process and the dry etching process, respectively.

In one example, for a silicon substrate with a crystal orientation (100) as the dielectric layer 241, firstly, a mask layer 100 is formed on a first surface of the dielectric layer 241 through a photolithographic process. For example, the mask layer 100 is formed of a photoresist or a silicon dioxide film. The dielectric layer 241 is placed into a tetramethyl ammonium hydroxide aqueous solution at a temperature of 90° C. for the wet etching. A depth of the via increases with time, until the dielectric layer 241 is penetrated. The mask layer 100 is removed. That is, the connection via 241*a* is formed. An inclination angle of the connection via 241*a* is in a range of about 0° to about 45°. For example, the inclination angle of the connection via 241*a* is 15°. When the mask layer 100 is made of the photoresist, the photoresist is cleaned with acetone by means of ultrasonic waves such that the photoresist is removed. When the mask layer 100 is made of the silicon dioxide film, the silicon dioxide film is etched away with diluted hydrofluoric acid. In addition, if the dielectric layer 241 is made of the glass, the wet etching process is at a temperature of 25° C., wherein a ratio of 40% NF4F solution to 49% HF solution is in a range of 4.8:1 to 5.2:1.

In another example, for a silicon substrate with a crystal orientation (100) as the dielectric layer 241, firstly, a mask layer 100 is formed on a first surface of the dielectric layer 241 through a photolithographic process. For example, the mask layer 100 is formed of a photoresist or a silicon dioxide film. The dielectric layer 241 is placed into a vacuum chamber of a reactive ion etching device or an inductively coupled plasma etching device for the dry etching, wherein a gas pressure is in a range of 40 Pa to 60 Pa and a ratio of Cl2 gas to He gas is in a range of 3:10 to 6:10, and the dielectric layer 241 is heated to 40° C. A depth of the via increases with time, until the dielectric layer 241 is penetrated. The mask layer 100 is removed. That is, the connection via 241*a* is formed. An inclination angle of the connection via 241*a* is in a range of about 0° to about 5°. For example, the inclination angle of the connection via 241*a* is 5°. When the mask layer 100 is made of the photoresist, the photoresist is cleaned with acetone by means of ultrasonic waves such that the photoresist is removed. When the mask layer 100 is made of the silicon dioxide film, the silicon dioxide film is etched away with diluted hydrofluoric acid. In addition, if the dielectric layer 241 is made of the glass, the dry etching process is at a temperature of 25° C. and at a gas pressure in a range of 250 Pa to 450 Pa, wherein a proportion of CF4 is in a range of 80 to 100, a proportion of CHF3 is in a range of 25 to 35 and a proportion of He is in a range of 110 to 130.

S242, cleaning the dielectric layer 241, after step S241, so that residues, debris (241*b* shown in FIGS. 24*a* and 24*b*), and the like near the inner wall and an outer edge of the connection via 241*a* are washed away.

In some examples, step S242 may specifically include: the dielectric layer 241 is placed into a water tank, wherein the dielectric layer 241 is firstly subjected to ultrasonic cleaning to remove floating dust on a surface of the dielectric layer, the dielectric layer 241 is then immersed in a solution containing hydrofluoric acid for chemical corrosion, so that defects, such as microcrack areas Q1, stress concentration areas Q2 and the like, which are near the connection via 241*a* and in its inner wall on the dielectric layer 241 made of glass, Si or SOI, may be thoroughly removed through the chemical corrosion. A content of HF in the solution is approximately in a range of 1% to 20%, and $NH_4F$ may or may not be contained in the solution. When $NH_4F$ is contained, a content of $NH_4F$ is approximately in a range of 10 to 40%, a temperature of the solution is approximately in a range of 35° C. to 60° C., a duration for the chemical corrosion is approximately in a range of 30 seconds to 5 minutes. Then, the dielectric layer 241 is thoroughly washed by the pure deionized water, and finally, is dried by the air knife. The chemically corroded connection via 241*a* has smooth inner wall and surface and does not contain the defects, such as microcrack areas Q1, stress concentration areas Q2 and the like.

S243, forming a chemical plating medium 2420 on the first surface and the second surface of the dielectric layer 241 provided with the connection via 241*a* after the step S242.

In some examples, step S243 may specifically include: placing the dielectric layer 241, in a spraying mode or directly, into a water tank containing a solution of the chemical plating medium 2420, so that a layer of $Sn^{2+}$ is adsorbed on surfaces of the dielectric layer 241. The solution of the chemical plating medium 2420 mainly contains $SnCl_2$ of 10 g/L to 30 g/L, concentrated hydrochloric acid (having a concentration of 38%) of 20 ml/L to 60 ml/L and deionized water. A less number of Sn particles are added into the solution to prevent the $Sn^{2+}$ from being oxidated. Then, the dielectric layer 241 is placed, in a spraying mode or directly, into a water tank containing an activation solution, so that surfaces of the dielectric layer 241 reacts with the activation solution (mainly containing $SnCl_2$ of 80 g/L to 120 g/L, concentrated hydrochloric acid of 300 ml/L to 500 ml/L, $Na_2SnO_3$ of 10 g/L to 20 g/L, $PdCl_2$ of 1 g/L to 4 g/L and deionized water), to generate metal palladium particles which are tightly attached to the surfaces of the dielectric layer 241. That is, the chemical plating medium 2420 is formed on the first surface and the second surface of the dielectric layer 241 provided with the connection via 241*a*.

S244, after the step S243, performing a chemical plating process on the dielectric layer 241 with the chemical plating medium 2420 to form metal films on the first surface and the second surface of the dielectric layer 121, and in the connection via 241*a*, and patterning the metal films formed on the first surface and the second surface of the dielectric layer 241, for forming a first extraction electrode 24201 and a second extraction electrode 24202, and a connection electrode 24203 in the connection via 241*a*.

In some examples, the chemically plated metal films may be a single-layer metal film or may be metal films stacked together. For example: only a Cu metal film is plated to form a single-layer metal film (having a thickness in a range of about 1 um to about 100 um). Alternatively, it is also possible to firstly plate a Ni metal film (having a thickness in a range of about 10 um to about 100 um), and then a Cu metal film (having a thickness in a range of about 1 um to about 100 um), wherein the Ni metal film is used to increase the adhesion of the Cu metal film. In the embodiment of the present disclosure, as an example, a material of the single-layer metal film is Cu, and a material of metal films stacked together is Ni/Cu, which does not limit the scope of the embodiment of the present disclosure. It will be described below by taking an example in which Ni/Cu metal films are chemically plated.

In some examples, step S244 may specifically include: placing the dielectric layer 241 into the chemical plating solution, and sequentially performing the chemical plating process with metal Ni and Cu. Then, the metal films formed on the first surface and the second surface of the dielectric layer 241 are patterned, for forming the first extraction electrode 24201 and the second extraction electrode 24202, and the connection electrode 24203 in the connection via 241*a*. The Ni solution for the chemical plating generally contains NiSO4·6H2O of 10 g/L to 30 g/L, NaH2PO4·2H2O 20 g/L to 40 g/L, Na-Citrate of 5 g/L to 15 g/L and $NH_4Cl$ of 20 g/L to 40 g/L, the solution is 15 alkaline, has a PH in a range of 8.0 to 10.0 and a temperature in a range of 75° C. to 90° C. The Cu solution for the chemical plating generally contains KNaC4H406 of 30 g/L to 50 g/L, NaOH of 8 g/L to 10 g/L, Na2CO3 of 38 g/L to 40 g/L, CuSO4 of 10 g/L to 20 g/L, NiCl2 of 2 g/L to 6 g/L and formaldehyde of 40 ml/L to 60 ml/L with a concentration of 35%, the solution is alkaline, has a PH in a range of 11.0 to 14.0 and a temperature in a range of 55° C. to 65° C.

Twenty-four examples of a method for forming a conductive via are listed above, but it should be understood that the above description is only illustrative and should not be construed as limiting the scope of the embodiments of the present disclosure.

Figure 25:
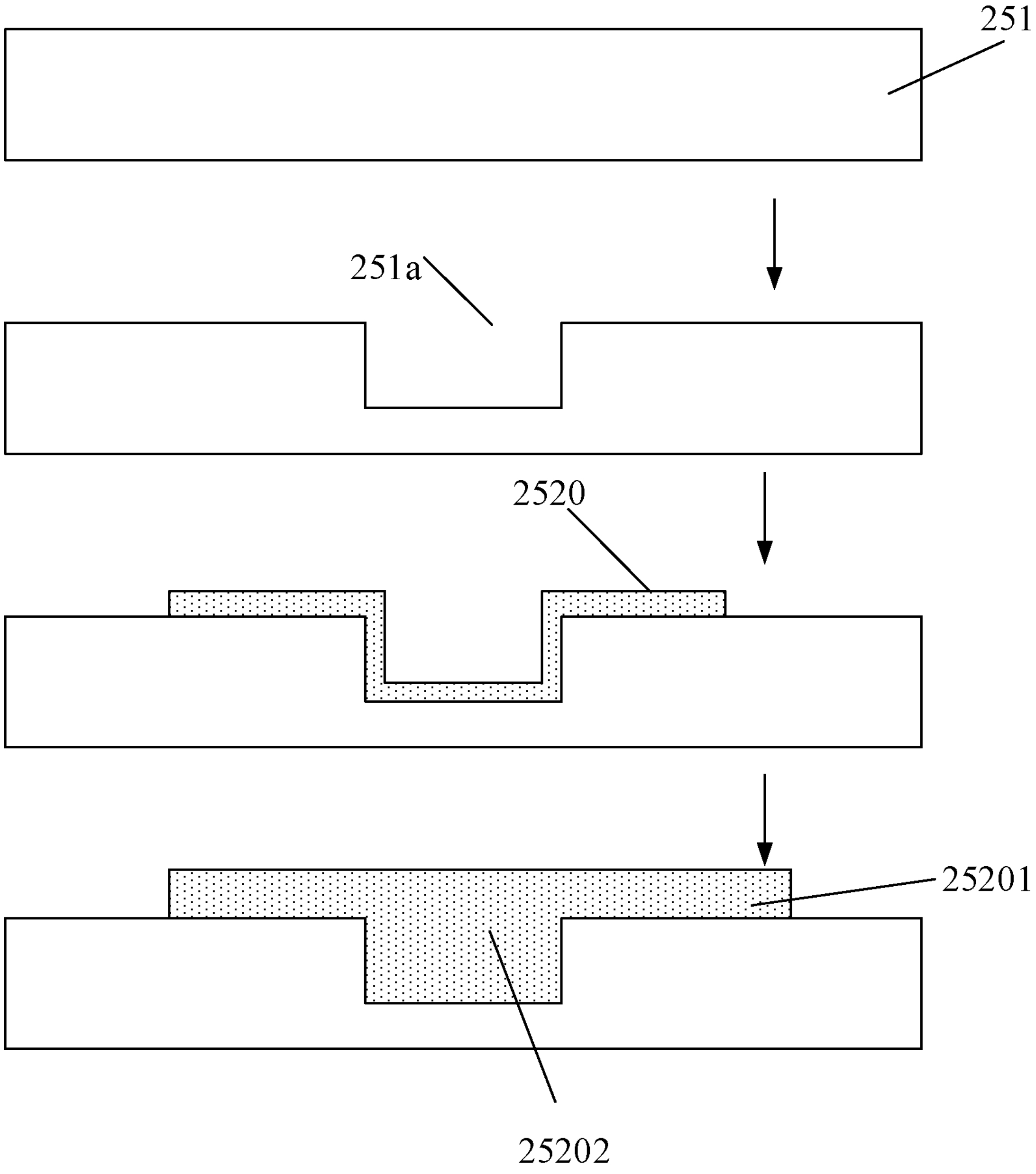
FIG. 25 is a flow chart of a method for forming a conductive blind via according to an embodiment of the present disclosure.

It should be noted that the method for forming a conductive via in a dielectric layer is provided as above, and accordingly, the method may be similarly used to form a blind via 251*a* in the dielectric layer, as shown in FIG. 25. The blind via 251*a* is different from the above via in that the blind via 251*a* does not extend through the dielectric layer 251. Therefore, a first extraction electrode 25201 needs to be formed on a first surface of the dielectric layer 251, and a connection electrode 25202 needs to be formed in the blind via of the dielectric layer. The blind via 251*a*, the connection electrode 25202 and the first extraction electrode 25201 on the dielectric layer may be formed by a method similar to any of the methods as described above. For example, the connection electrode 25202 and the first extraction electrode 25201 are formed through the electroplating process by forming a metal film 2520, and the description thereof is not repeated here.

Figure 26:
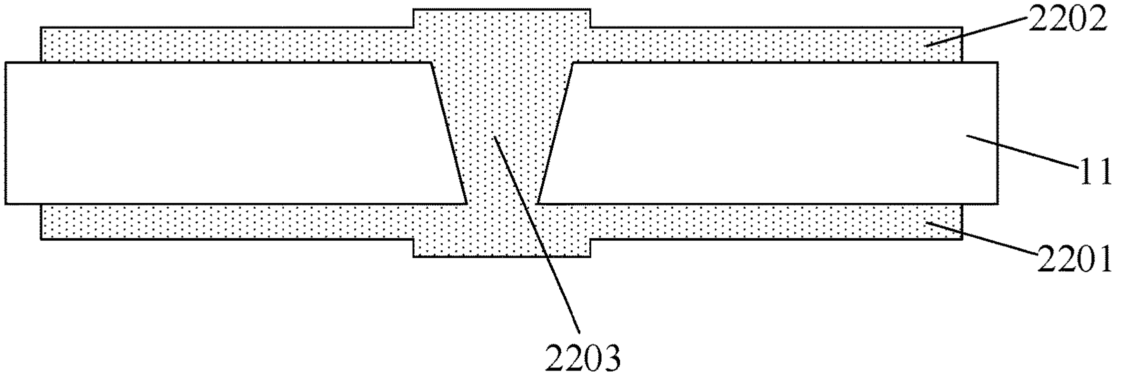
FIG. 26 is a schematic diagram of a conductive via according to an embodiment of the present disclosure.

In a second aspect, FIG. 26 is a schematic diagram of a conductive via according to an embodiment of the present disclosure. As shown in FIG. 26, an embodiment of the present disclosure provides a conductive via that may be formed by using any of the methods described above. The conductive via formed in example 1 is illustrated in FIG. 26 as an example. The conductive via includes a dielectric layer 11, a connection electrode 2203, a first extraction electrode 2201, and a second extraction electrode 2201. The dielectric layer 11 is provided with a connection via extending through the dielectric layer in a thickness direction of the dielectric layer, and the dielectric layer includes a first surface and a second surface, the first extraction electrode 2201 is located on the first surface, the second extraction electrode 2202 is located on the second surface, and the connection electrode 2203 is located in the connection via, at least covers an inner wall of the connection via, and is electrically connected to the first extraction electrode 2201 and the second extraction electrode 2202.

In the embodiment of the present disclosure, materials of the dielectric layer 11, the connection electrode 2203, the first extraction electrode 2201 and the second extraction electrode 2202 may be the same as those in the above embodiment, and thus are not described herein again. In the embodiment of the present disclosure, a structure provided with such a conductive via may be applied to memory chips, high-brightness LEDs, high-quality-factor (Q-factor) inductor devices in radio frequency circuits and integrated passive devices, etc., thereby improving the integration level, and reducing a resistance.

It should be noted that the conductive via in the embodiment of the present disclosure may be formed by any of the methods as described above, so that the materials and the sizes of the dielectric layer 11, the connection electrode 2203, the first extraction electrode 2201, and the second extraction electrode 2202 of the conductive via may all be the same as those described above. In addition, the shape and the size of the connection via may also be the same as those of the above structure, which is not described herein again.

In a third aspect, an embodiment of the present disclosure provides a passive device including the above conductive via. In some examples, the passive device includes at least an inductor, but may also include a capacitor and a resistor. In the following description, the passive device includes an inductor, a capacitor and a resistor, as an example.

Figure 27:
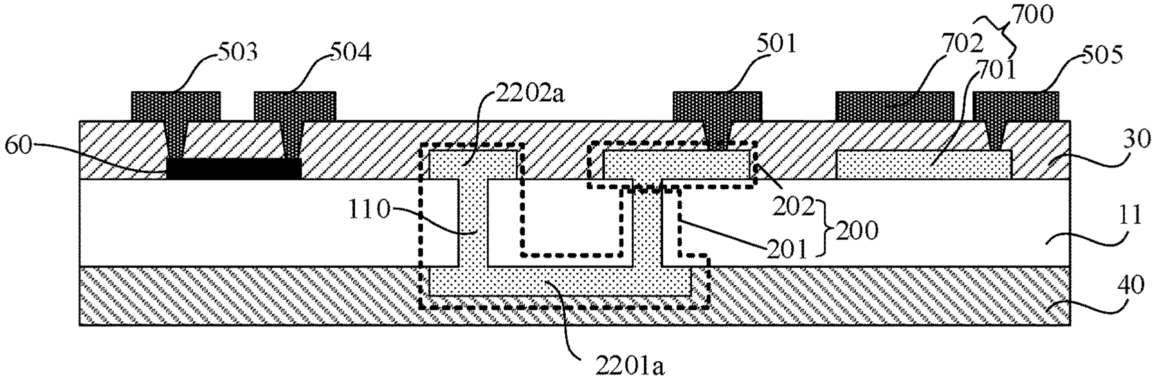
FIG. 27 is a cross-sectional view of a passive device according to an embodiment of the present disclosure.
Figure 28:
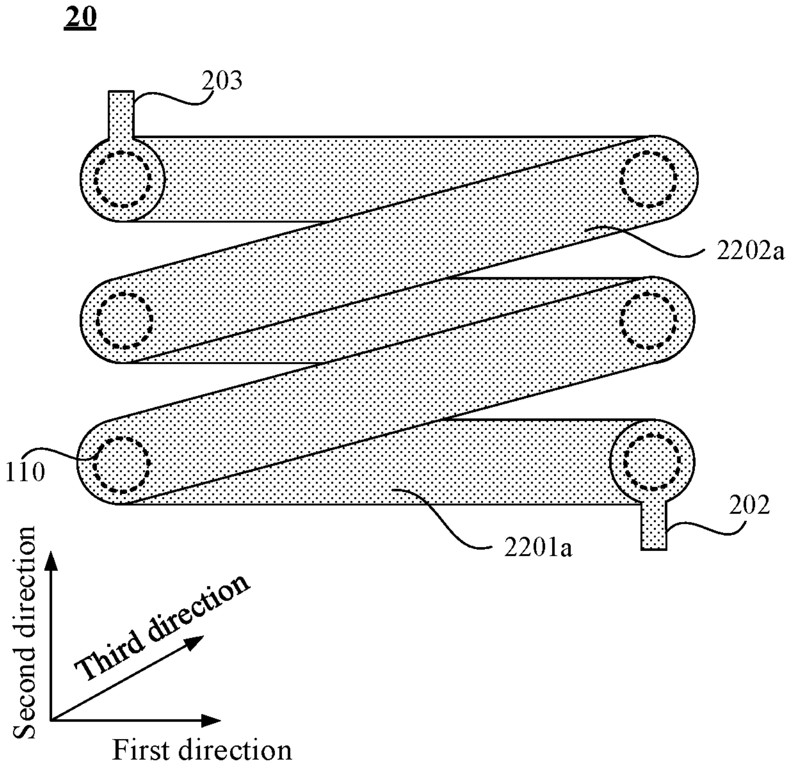
FIG. 28 is a top view of an inductor of FIG. 27.

FIG. 27 is a cross-sectional view of a passive device according to an embodiment of the present disclosure. FIG. 28 is a top view of an inductor of FIG. 27. As shown in FIGS. 27 and 28, an inductor includes a plurality of first sub-structures 2201*a* on the first surface of the dielectric layer 11, a plurality of second sub-structures 2202*a* on the second surface of the dielectric layer 11, and a plurality of conductive vias 110 through which the plurality of first sub-structures 2201*a* are successively connected to the plurality of second sub-structures 2202*a* in series. Referring to FIG. 28, the plurality of first sub-structures 2201*a* of the inductor extend along a first direction and are arranged side by side along a second direction; the plurality of second sub-structures 2202*a* of the inductor extend along a third direction and are arranged side by side along the second direction. The first direction, the second direction and the third direction are different from each other. In the embodiment of the present disclosure, as an example, the first direction and the second direction are perpendicular to each other, and the first direction and the third direction are intersected with each other and are not perpendicular to each other. Alternatively, the extending directions of the first sub-structures 2201*a* and the second sub-structures 2202*a* may be interchanged, which is within the scope of the embodiments of the present disclosure. In addition, in the present embodiment, as an example, the inductor includes N first sub-structures 2201*a* and N−1 second sub-structures 2202*a*, where N≥2, and N is an integer. Each of first and second ends of each first sub-structure 2201*a* is electrically connected to one conductive via 110, and the first and second ends of each first sub-structure 2201*a* are electrically connected to different conductive vias 110. That is, each first sub-structure 2201*a* is connected to portions of the first extraction electrode corresponding to (nearby) two conductive vias 110. Each of first and second ends of each second sub-structure 2202*a* is electrically connected to one conductive via 110, and the first and second ends of each second sub-structure 2202*a* are electrically connected to different conductive vias 110. That is, each second sub-structure 2202*a* is connected to portions of the second extraction electrode corresponding to (nearby) two conductive vias 110. In this case, a first end of the ith second sub-structure 212 of the inductor is connected to a first end of the ith first sub-structure 2201*a* and a second end of the (i+1) th first sub-structure 2201*a*, thereby forming an inductance coil 201, wherein 1≤i≤N−1, and i is an integer.

A first interlayer dielectric layer 30 is arranged on a side of the plurality of second sub-structures 2202*a* of the inductor 200 away from the dielectric layer 11, and a first pad 501 and a second pad are arranged on a side of the first interlayer dielectric layer 30 away from the dielectric layer 11. A second connection via and a third connection via are provided in the first interlayer dielectric layer 30, the first pad 501 is electrically connected to a first signal terminal of the inductance coil 201 through the second connection via, and the second pad is electrically connected to a second signal terminal 202 of the inductance coil 201 through the third connection via. The first pad 501 and the second pad are configured such that the inductor 200 is electrically connected to a radio frequency circuit. For example: the inductor 200 is bonded to a PCB (printed circuit board) through the first pad 501 and the second pad, or the inductor 200 is electrically connected to the PCB by soldering. A resistor 60 may be disposed on the second surface of the dielectric layer 11, and may be made of a high-resistance material, such as tin oxide (ITO) or nickel-chromium (NiCr) alloy. In some examples, a first plate 701 of a capacitor 700 may be disposed on a same layer as the plurality of second sub-structures 2202*a* of the inductor 20, and a second plate 702 of the capacitor 700 may be disposed on a same layer as the first pad 501 and a third pad 503. In this way, the passive device is easily manufactured without increasing the number of process steps.

In addition, in the embodiment of the present disclosure, the third pad 503, a fourth pad 504, a fifth pad 505, and a sixth pad may be further disposed on a same layer as the first pad 501 and the second pad. The third pad is connected to a first terminal of the resistor 60 through a fourth connection via extending through the first interlayer dielectric layer 30, the fourth pad 54 is connected to a second terminal of the resistor 60 through a fifth connection via extending through the first interlayer dielectric layer 30, the fifth pad 505 is connected to the first plate 701 of the capacitor 700 through a sixth connection via extending through the first interlayer dielectric layer 30, and the sixth pad and the second plate 702 of the capacitor 70 may have a one-piece structure. The third pad and the fourth pad 504 are configured to connect the resistor 60 to the radio frequency circuit, and the fifth pad 505 and the sixth pad 506 are configured to connect the capacitor 700 to the radio frequency circuit. It should be understood that the capacitor 700 and the resistor 60 are electrically connected to devices on the substrate, which is not necessarily realized by the pads.

In some examples, the dielectric layer includes, but is not limited to, at least one of glass, polyimide, polyethylene terephthalate, cyclic olefin polymer.

In some examples, a first protective layer 40 is disposed on a side of the plurality of first sub-structures 2201*a* of the inductor 200 away from the dielectric layer 11 to prevent the plurality of first sub-structures 2201*a* from being oxidized due to exposure. The first protective layer 40 is made of an inorganic insulating material. For example: the first protective layer 40 is an inorganic insulating layer formed of silicon nitride (SiNx), or silicon oxide ($SiO_2$), or a composite layer formed by the inorganic insulating layers of SiNx and $SiO_2$ stacked together.

In the embodiment of the present disclosure, the passive device includes the above structure provided with the conductive via, which may be applied to memory chips, high-brightness LEDs, high-quality-factor (Q-factor) inductor devices in radio frequency circuits and integrated passive devices, etc., thereby improving the integration level, and reducing a resistance.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A method for forming a conductive via, comprising:

preparing a dielectric layer, and forming a connection via, which extends through the dielectric layer in a thickness direction of the dielectric layer, in the dielectric layer; wherein the dielectric layer comprises a first surface and a second surface oppositely arranged in the thickness direction of the dielectric layer; and forming a connection electrode in the connection via, forming a first extraction electrode on the first surface, and forming a second extraction electrode on the second surface; wherein the connection electrode at least covers an inner wall of the connection via, and the first extraction electrode and the second extraction electrode are electrically connected to the connection electrode, wherein the forming a connection electrode in the connection via, forming a first extraction electrode on the first surface, and forming a second extraction electrode on the second surface comprises:

forming a metal film in the connection via to cover the inner wall of the connection via and on a part of the first surface and the second surface of the dielectric layer around an edge of the connection via, as a seed layer;

electroplating the seed layer to form the connection electrode in the connection via; and forming a first extraction electrode on the first surface and a second extraction electrode on the second surface through a patterning process.

2. The method for forming a conductive via according to claim 1, wherein the preparing a dielectric layer, and forming a connection via, which extends through the dielectric layer in a thickness direction of the dielectric layer, in the dielectric layer comprises:

preparing the dielectric layer, and forming the connection via, which extends through the dielectric layer in the thickness direction of the dielectric layer, through a mechanical drilling process on the dielectric layer;

wherein a material of a drill bit for the mechanical drilling process comprises any one of a tungsten carbide, a tungsten-cobalt alloy, a tungsten-titanium-cobalt alloy, a natural diamond, and an artificial diamond.

3. The method for forming a conductive via according to claim 1, wherein the preparing a dielectric layer, and forming a connection via, which extends through the dielectric layer in a thickness direction of the dielectric layer, in the dielectric layer comprises:

preparing the dielectric layer, and forming the connection via, which extends through the dielectric layer in the thickness direction of the dielectric layer, through a sand-blasting drilling process on the dielectric layer.

4. The method for forming a conductive via according to claim 3, wherein the forming the connection via, which extends through the dielectric layer in the thickness direction of the dielectric layer, through a sand-blasting drilling process on the dielectric layer comprises:

forming high-speed injection beams through a sand-blasting process by using compressed air as power in combination with solid abrasive particles or liquid mixed with the solid abrasive particles, injecting the injection beams onto the first surface or the second surface of the dielectric layer at a high speed, thereby forming the connection via, which extends through the dielectric layer in the thickness direction of the dielectric layer; and the solid abrasive particles comprise at least one of carborundum, corundum, calcium carbonate, and quartz sand.

5. The method for forming a conductive via according to claim 1, wherein the preparing a dielectric layer, and forming a connection via, which extends through the dielectric layer in a thickness direction of the dielectric layer, in the dielectric layer comprises:

preparing the dielectric layer, and forming the connection via, which extends through the dielectric layer in the thickness direction of the dielectric layer, through a laser drilling process on the dielectric layer.

6. The method for forming a conductive via according to claim 5, wherein the forming the connection via, which extends through the dielectric layer in the thickness direction of the dielectric layer, through a laser drilling process on the dielectric layer comprises:

vertically irradiating a laser onto a first surface or a second surface of the dielectric layer by means of a laser device, thereby forming the connection via, which extends through the dielectric layer in the thickness direction of the dielectric layer; and the laser device is a continuous laser device or a pulse laser device.

7. The method for forming a conductive via according to claim 1, wherein the preparing a dielectric layer, and forming a connection via, which extends through the dielectric layer in a thickness direction of the dielectric layer, in the dielectric layer comprises:

preparing the dielectric layer, and forming the connection via, which extends through the dielectric layer in the thickness direction of the dielectric layer, through a patterning process, wherein the forming the connection via, which extends through the dielectric layer in the thickness direction of the dielectric layer, through a patterning process comprises:

forming a mask pattern on the dielectric layer, and forming the connection via, which extends through the dielectric layer in the thickness direction of the dielectric layer through a dry etching process or a wet etching process.

8. The method for forming a conductive via according to claim 1, wherein the forming metal films on the first surface and the second surface of the dielectric layer as seed layers comprises:

forming metal films on the first surface and the second surface of the dielectric layer through a magnetron sputtering process.

9. The method for forming a conductive via according to claim 1, before the forming a connection electrode in the connection via, forming a first extraction electrode on the first surface, and forming a second extraction electrode on the second surface, the method further comprises:

cleaning the dielectric layer with the connection via.

10. The method for forming a conductive via according to claim 9, wherein the cleaning the dielectric layer with the connection via comprises:

placing the dielectric layer with the connection via into a water tank, for cleaning the dielectric layer by means of ultrasonic waves; or placing the dielectric layer with the connection via into a water tank, for cleaning the dielectric layer by means of ultrasonic waves, and then, placing the dielectric layer into a solution containing hydrofluoric acid for chemical corrosion.

11. The method for forming a conductive via according to claim 1, wherein the connection via has a shape comprising a cylinder or an inverted truncated cone.

12. A method for forming a conductive via, comprising:

preparing a dielectric layer, and forming a connection via, which extends through the dielectric layer in a thickness direction of the dielectric layer, in the dielectric layer; wherein the dielectric layer comprises a first surface and a second surface oppositely arranged in the thickness direction of the dielectric layer; and forming a connection electrode in the connection via, forming a first extraction electrode on the first surface, and forming a second extraction electrode on the second surface; wherein the connection electrode at least covers an inner wall of the connection via, and the first extraction electrode and the second extraction electrode are electrically connected to the connection electrode, wherein the forming a connection electrode in the connection via, forming a first extraction electrode on the first surface, and forming a second extraction electrode on the second surface comprises:

forming a chemical plating medium on a part of the first surface and the second surface of the dielectric layer around an edge of the connection via and in the connection via of the dielectric layer to cover the inner wall of the connection via; performing a chemical plating process on the dielectric layer with the chemical plating medium to form the connection electrode in the connection via, the first extraction electrode on the first surface and the second extraction electrode on the second surface.

13. A method for forming a conductive via, comprising:

preparing a dielectric layer, and forming a connection via, which extends through the dielectric layer in a thickness direction of the dielectric layer, in the dielectric layer; wherein the dielectric layer comprises a first surface and a second surface oppositely arranged in the thickness direction of the dielectric layer; and forming a connection electrode in the connection via, forming a first extraction electrode on the first surface, and forming a second extraction electrode on the second surface; wherein the connection electrode at least covers an inner wall of the connection via, and the first extraction electrode and the second extraction electrode are electrically connected to the connection electrode, wherein the forming a connection electrode in the connection via, forming a first extraction electrode on the first surface, and forming a second extraction electrode on the second surface comprises:

coating a conductive paste in the connection via to cover the inner wall of the connection via, and on a part of the first surface and the second surface of the dielectric layer around an edge of the connection via, and performing solvent drying and thermocuring processes on the conductive paste to form the connection electrode in the connection via, the first extraction electrode on the first surface and the second extraction electrode on the second surface.

14. The method for forming a conductive via according to claim 13, wherein the conductive paste comprises a low-temperature curing type polymer conductive paste; or the coating the conductive paste comprises coating the conductive paste by means of any one of screen printing, ink-jet printing, and slit coating.

* * * * *